(12) United States Patent
Hsieh et al.

(10) Patent No.: US 11,630,062 B2
(45) Date of Patent: Apr. 18, 2023

(54) BIOSENSOR AND METHOD OF FORMING THE SAME

(71) Applicant: VisEra Technologies Company Limited, Hsin-Chu (TW)

(72) Inventors: Hsin-Yi Hsieh, Taoyuan (TW); Chin-Chuan Hsieh, Hsin-Chu (TW); Wei-Ko Wang, Taoyuan (TW); Yu-Jen Chen, Taoyuan (TW); Yi-Hua Chiu, Hsinchu (TW); Chung-Jung Hsu, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 471 days.

(21) Appl. No.: 16/598,627

(22) Filed: Oct. 10, 2019

(65) Prior Publication Data

US 2021/0109022 A1   Apr. 15, 2021

(51) Int. Cl.

| G01N 21/64 | (2006.01) |
|---|---|
| H01L 27/144 | (2006.01) |
| H01L 27/146 | (2006.01) |
| G02B 5/28 | (2006.01) |
| G01N 21/63 | (2006.01) |

(Continued)

(52) U.S. Cl.
CPC ......... *G01N 21/6428* (2013.01); *G01N 21/63* (2013.01); *G01N 21/6454* (2013.01); *G02B 5/288* (2013.01); *H01L 27/1446* (2013.01); *H01L 27/14621* (2013.01); *H01L 27/14623* (2013.01); *H01L 27/14645* (2013.01); *H01L 27/14683* (2013.01); *G01N 21/6486* (2013.01); *G01N 2021/6441* (2013.01);

(Continued)

(58) Field of Classification Search
CPC ...... G02B 5/28; G02B 5/285; G01N 21/6454; G01N 21/6428
See application file for complete search history.

(56) References Cited

U.S. PATENT DOCUMENTS

| 5,157,262 A | 10/1992 | Marsoner et al. |
|---|---|---|
| 5,606,633 A | 2/1997 | Groger et al. |

(Continued)

FOREIGN PATENT DOCUMENTS

| CN | 107533005 | 1/2018 |
|---|---|---|
| EP | 3460456 A1 | 3/2019 |

(Continued)

OTHER PUBLICATIONS

Office Action dated Dec. 15, 2020 in JP Application No. 2020-040760 (7 pages).

(Continued)

*Primary Examiner* — Alia Sabur
(74) *Attorney, Agent, or Firm* — Muncy, Geissler, Olds & Lowe, P.C.

(57) ABSTRACT

A biosensor is provided. The biosensor includes a substrate, photodiodes, pixelated filters, an excitation light rejection layer and an immobilization layer. The substrate has pixels. The photodiodes are disposed in the substrate and correspond to one of the pixels, respectively. The pixelated filters are disposed on the substrate. The excitation light rejection layer is disposed on the pixelated filter. The immobilization layer is disposed on the excitation light rejection layer.

19 Claims, 50 Drawing Sheets

(51) Int. Cl.
*H01L 31/0216* (2014.01)
*H01L 31/0232* (2014.01)

(52) U.S. Cl.
CPC .. *G01N 2201/068* (2013.01); *H01L 31/02165* (2013.01); *H01L 31/02327* (2013.01)

(56) References Cited

U.S. PATENT DOCUMENTS

| | | | |
|---|---|---|---|
| 8,026,559 | B2 | 9/2011 | Chen et al. |
| 8,637,436 | B2 | 1/2014 | Hassibi |
| 2004/0234417 | A1* | 11/2004 | Schienle .......... G01N 33/54373 422/82.08 |
| 2005/0141058 | A1* | 6/2005 | Raynor .............. G01N 21/6428 358/504 |
| 2009/0111207 | A1 | 4/2009 | Choumane et al. |
| 2010/0055666 | A1 | 3/2010 | Wimberger-Friedl et al. |
| 2010/0108865 | A1 | 5/2010 | Cho et al. |
| 2010/0122904 | A1 | 5/2010 | Hassibi et al. |
| 2011/0032398 | A1 | 2/2011 | Lenchenkov |
| 2011/0118128 | A1 | 5/2011 | Garcia Tello et al. |
| 2014/0295577 | A1* | 10/2014 | Matsuzawa .......... C12Q 1/6834 436/501 |
| 2015/0141268 | A1 | 5/2015 | Rothberg et al. |
| 2016/0299073 | A1 | 10/2016 | Tu et al. |
| 2016/0341656 | A1* | 11/2016 | Liu ....................... G01N 21/648 |
| 2016/0356715 | A1 | 12/2016 | Zhong et al. |
| 2017/0023476 | A1 | 1/2017 | Altug et al. |
| 2018/0155782 | A1 | 6/2018 | Zhong |
| 2018/0335554 | A1* | 11/2018 | Ockenfuss ............. G02B 5/201 |
| 2019/0003971 | A1 | 1/2019 | Cao et al. |
| 2019/0025511 | A1 | 1/2019 | Rothberg et al. |
| 2019/0377109 | A1 | 12/2019 | Frey et al. |
| 2020/0096450 | A1* | 3/2020 | Zhong ................ H01L 27/1464 |
| 2021/0066375 | A1 | 3/2021 | Kim et al. |

FOREIGN PATENT DOCUMENTS

| | | |
|---|---|---|
| JP | 2002202303 A | 7/2002 |
| JP | 2002350347 A | 12/2002 |
| JP | 2004-361256 | 12/2004 |
| JP | 2005-504293 | 2/2005 |
| JP | 2006030162 A | 2/2006 |
| JP | 2008003061 A | 1/2008 |
| JP | 2009-204486 | 9/2009 |
| JP | 2009222583 A | 10/2009 |
| JP | 2010186818 A | 8/2010 |
| JP | 2010284152 A | 12/2010 |
| JP | 2013088378 A | 5/2013 |
| JP | 2013092393 A | 5/2013 |
| JP | 2013175494 A | 9/2013 |
| JP | 2015162679 A | 9/2015 |
| JP | 2016537998 A | 12/2016 |
| JP | 2017-502310 | 1/2017 |
| JP | 2017183388 A | 10/2017 |
| JP | 2018517127 A | 6/2018 |
| WO | WO-2013080473 A1 | 6/2013 |
| WO | WO-2016168996 A1 | 10/2016 |
| WO | WO-2018/175341 A1 | 9/2018 |

OTHER PUBLICATIONS

Search Report issued in related EP application No. 19210713.4 dated Jun. 19, 2020.
Nelson et al., "Handheld Fluorometers for Lab-on-a-Chip Applications," IEEE Transactions on Biomedical Circuits and Systems, vol. 3, No. 2, Apr. 2009.
European Search Report dated May 6, 2020 in EP Application No. 19210706.8.
Office Action issued in corresponding JP application No. 2020-032993 dated Dec. 15, 2020.
Office Action issued in corresponding TW application No. 109113770 dated Jan. 6, 2021.
Office Action dated Jul. 11, 2022 in copending U.S. Appl. No. 16/598,576 (27 pages).
Final Office Action of related U.S. Appl. No. 16/598,576 dated Dec. 5, 2022, 21 pages.

* cited by examiner

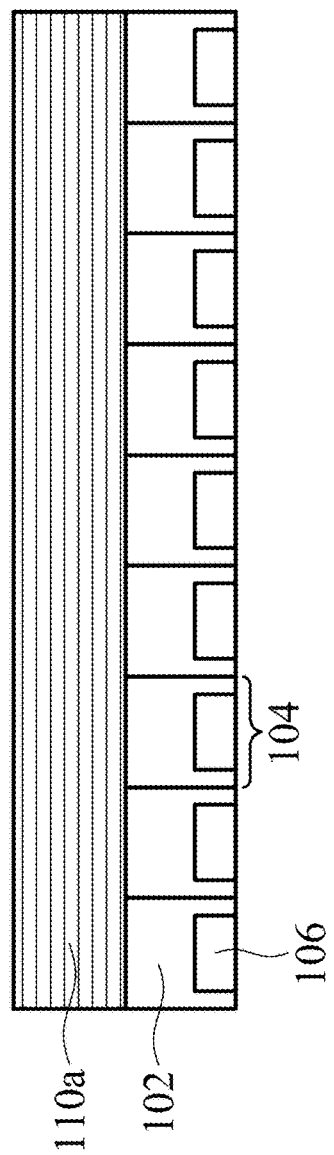
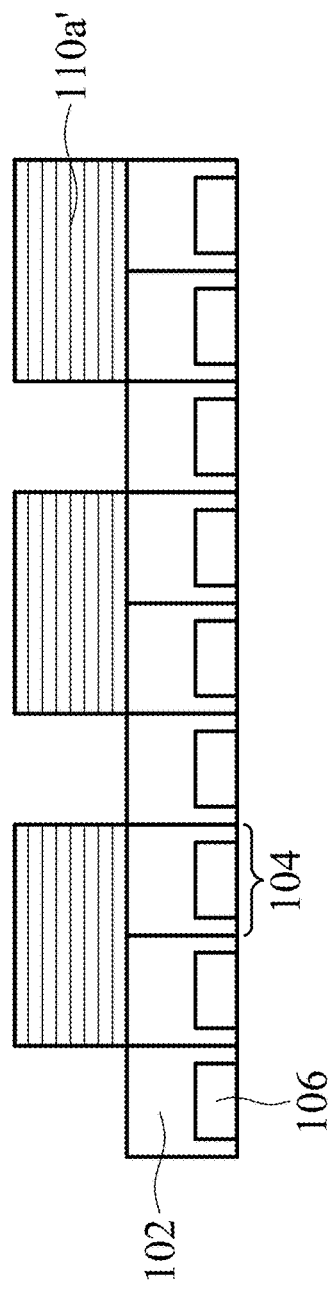

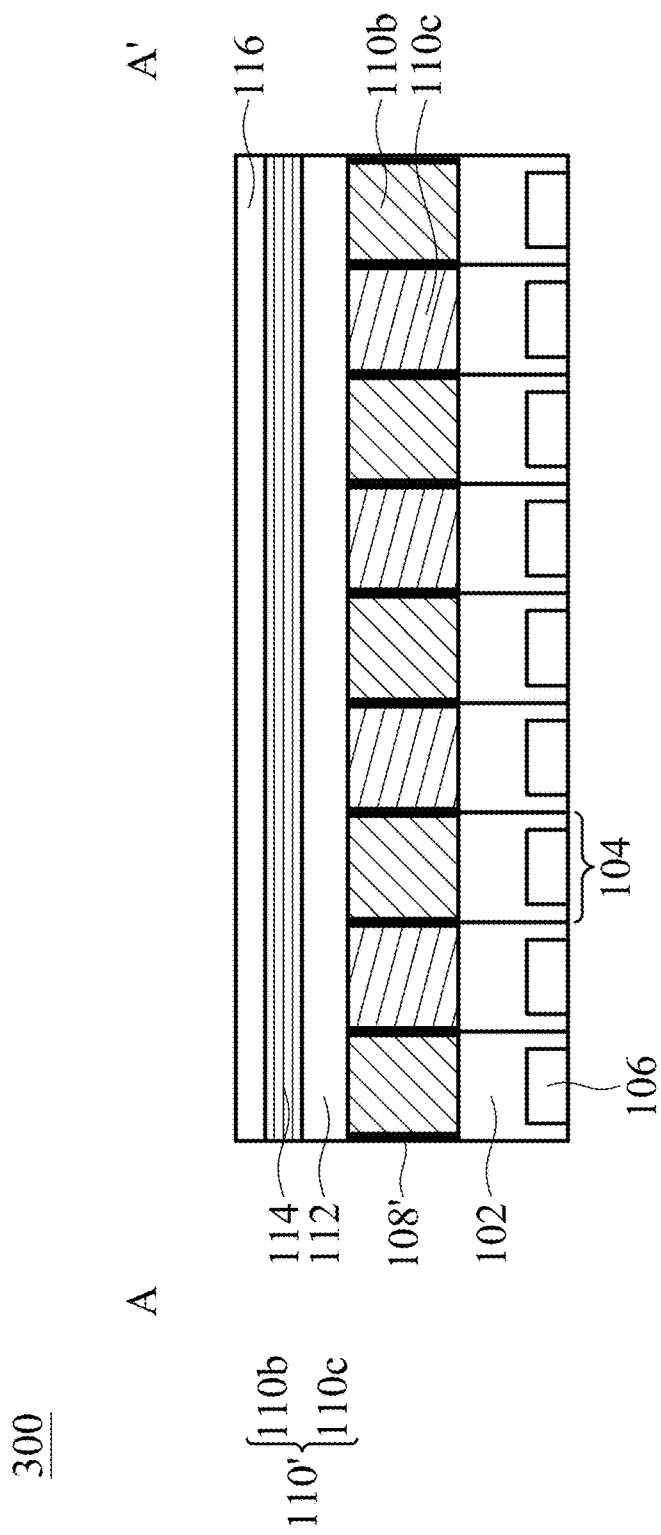

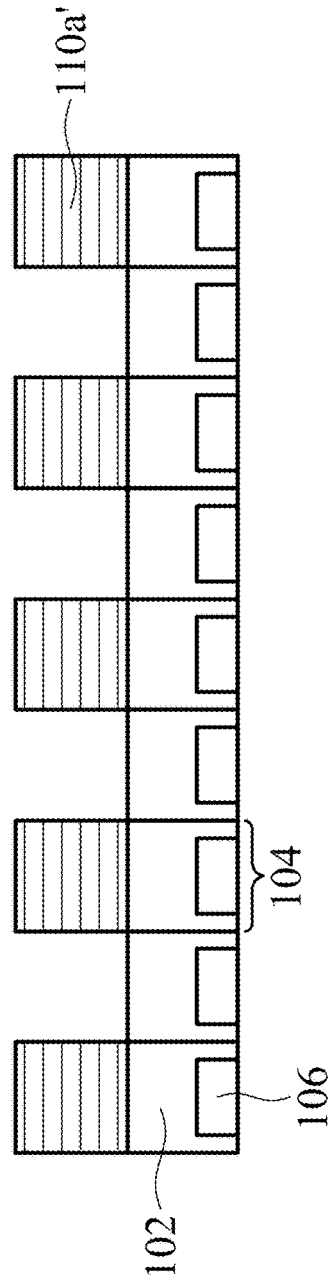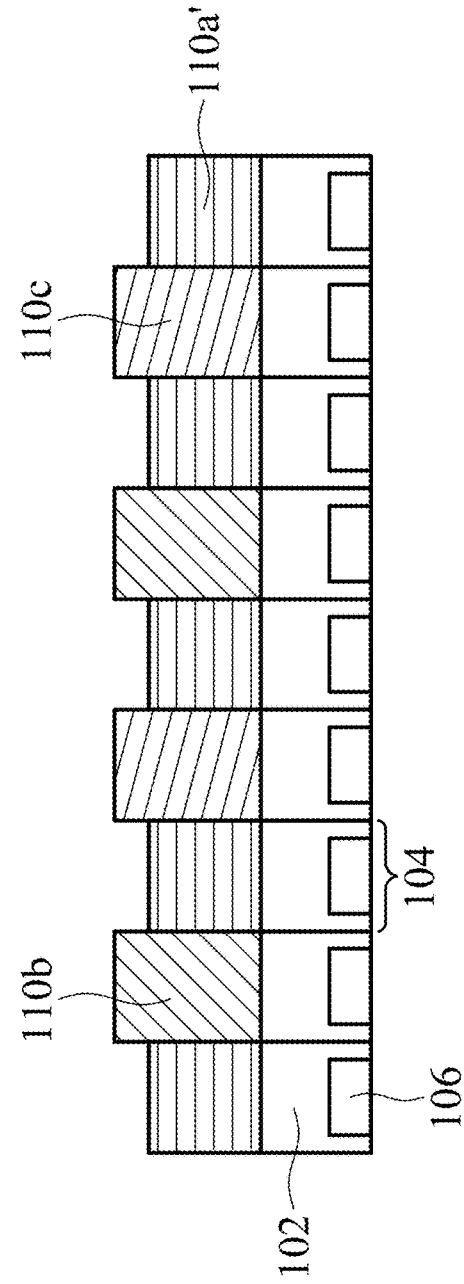

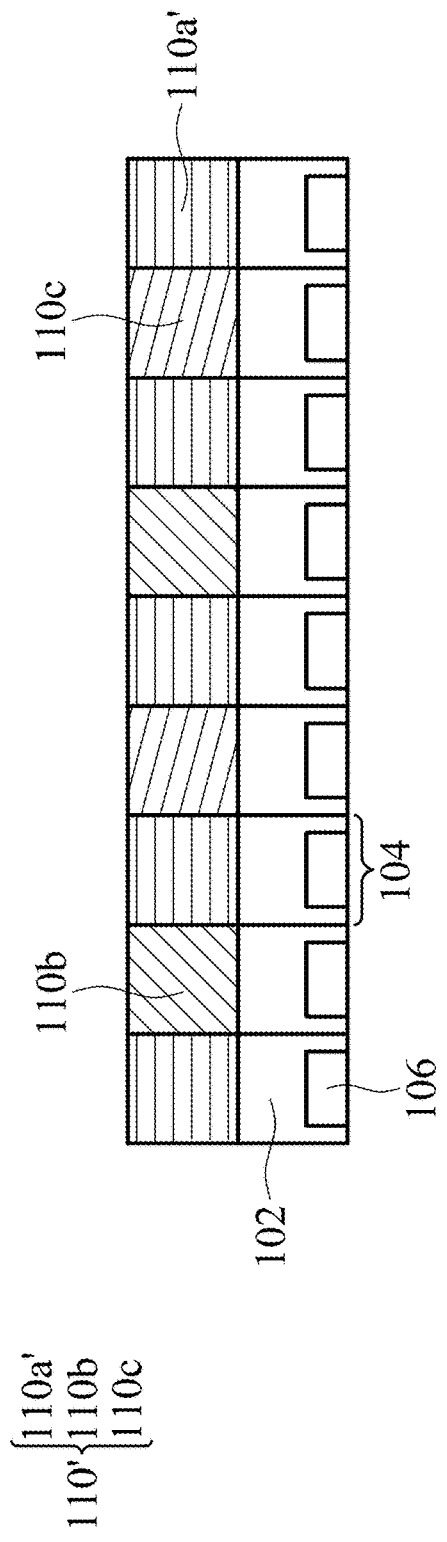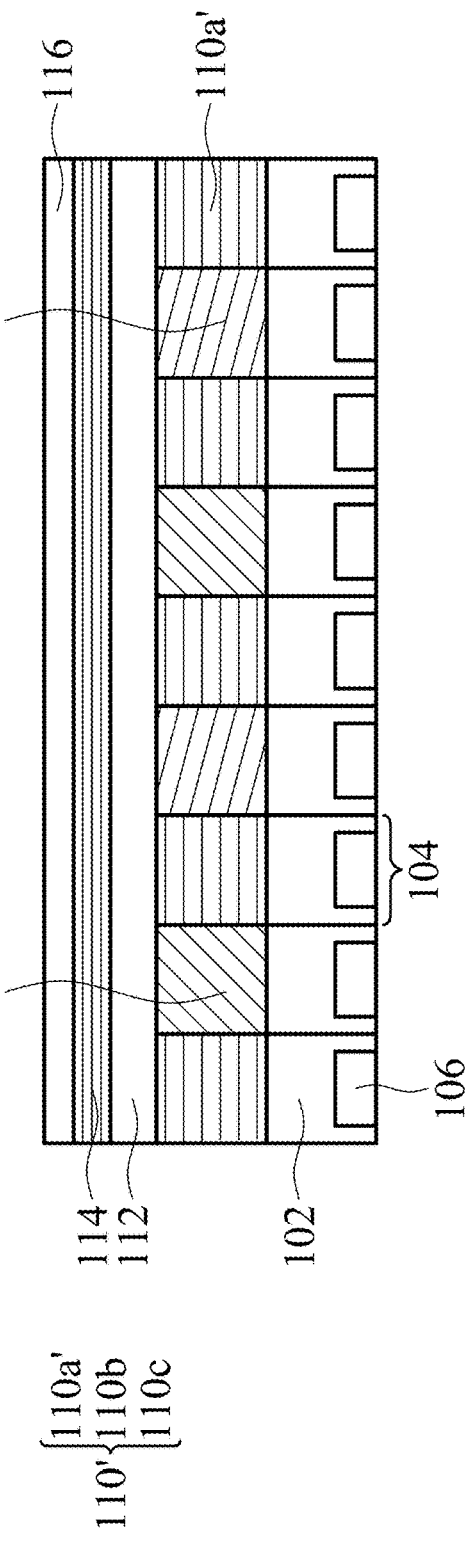

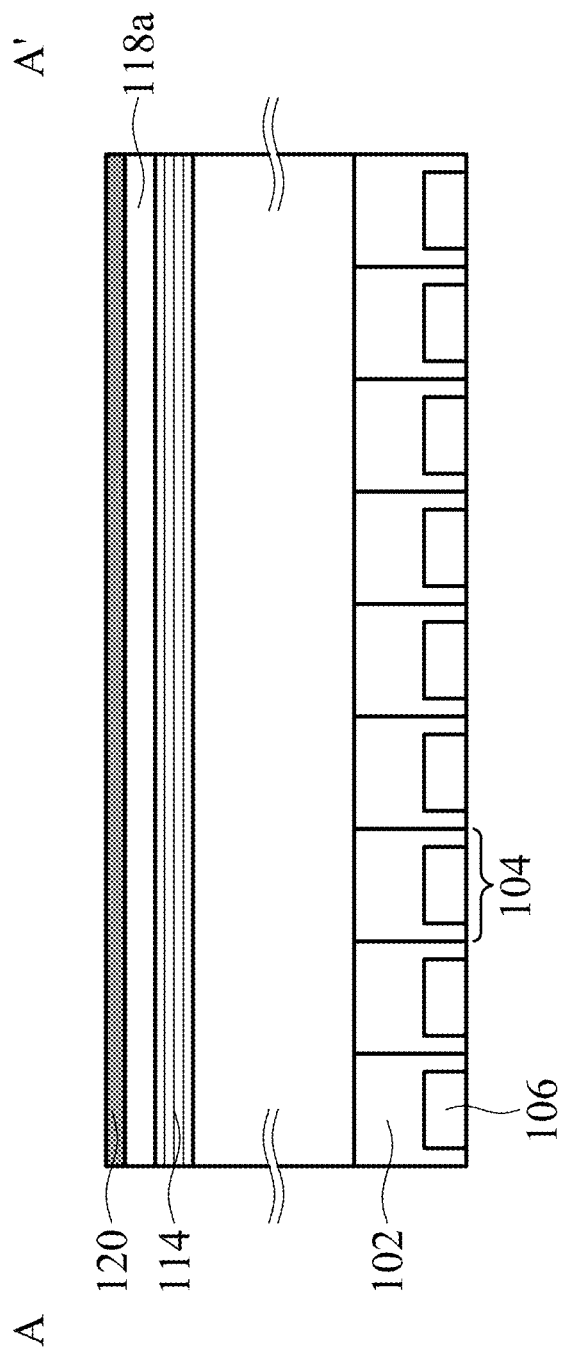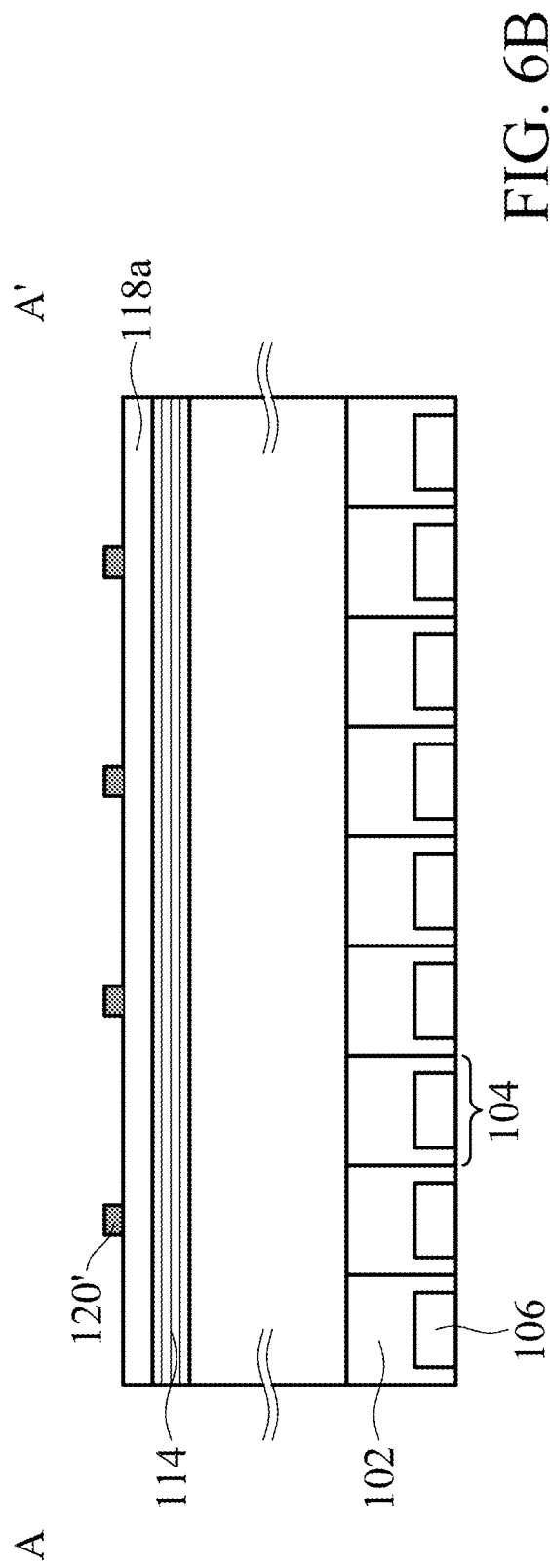

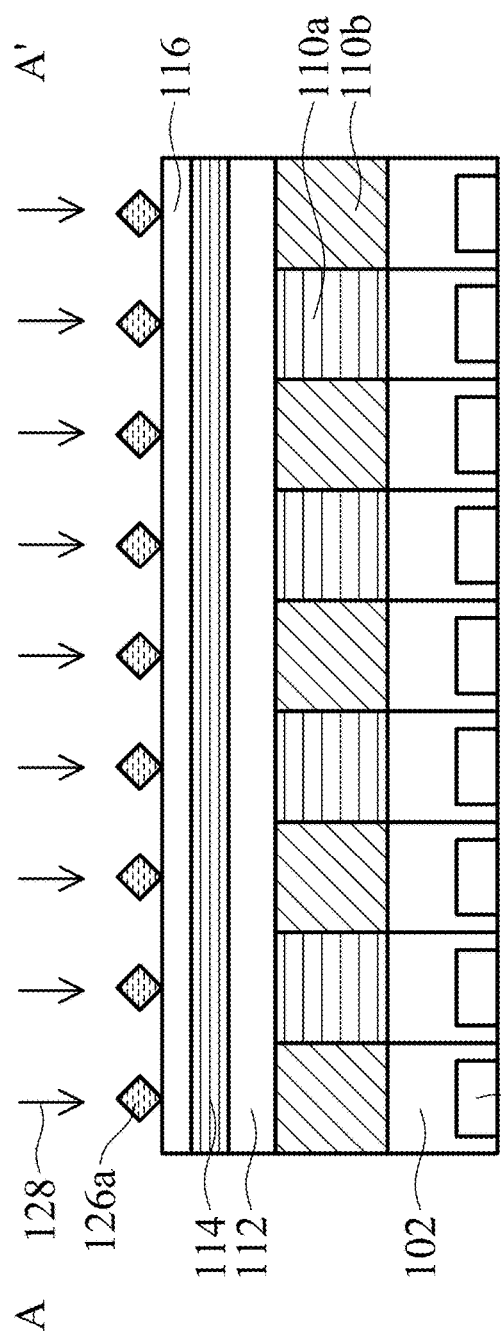
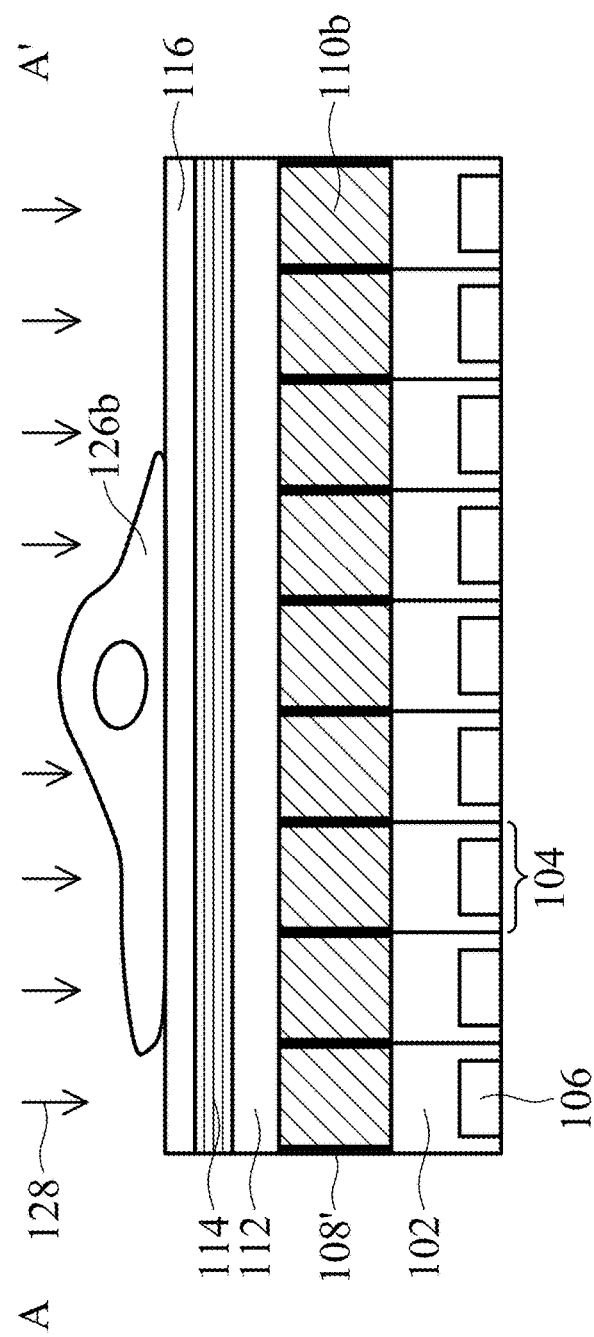

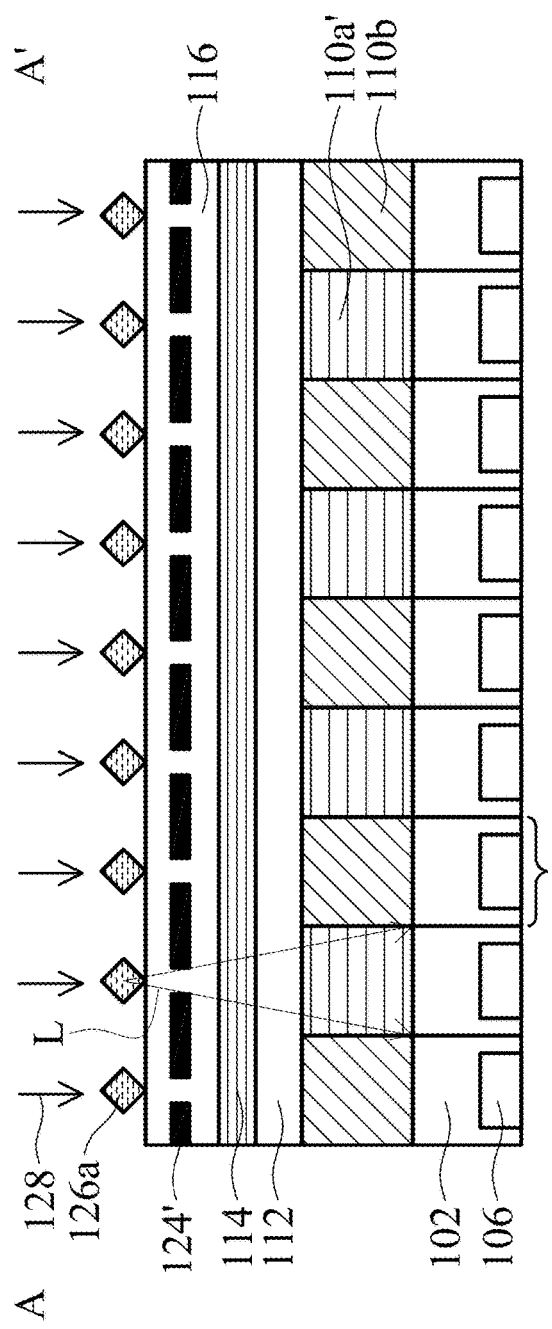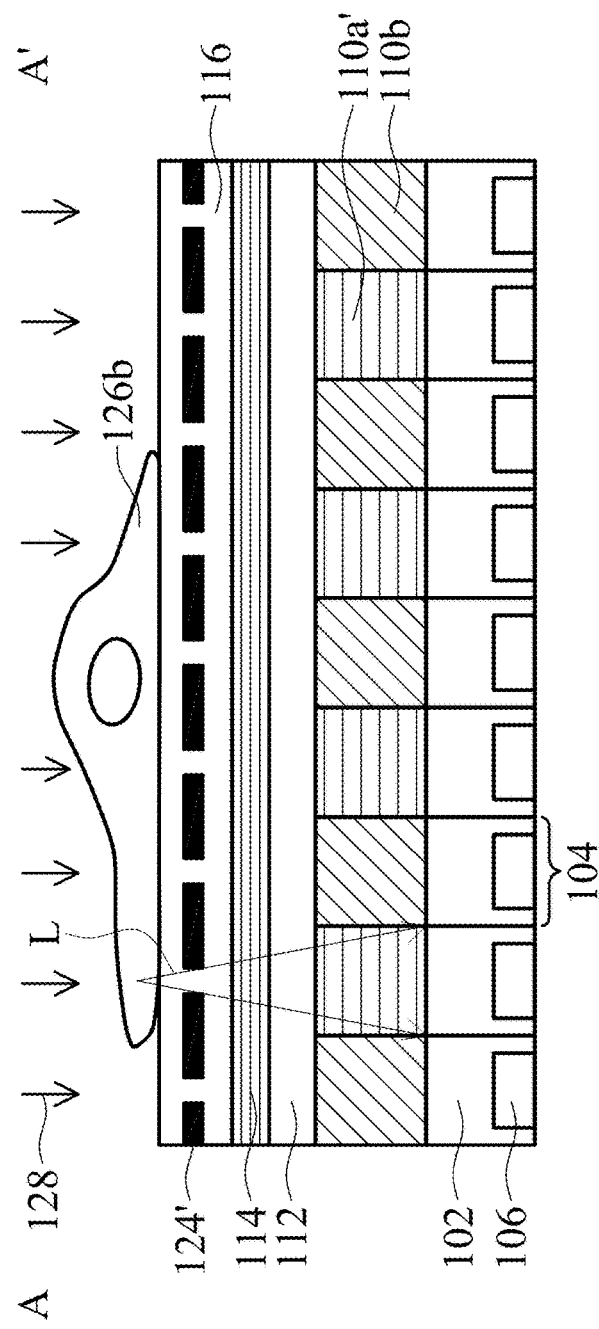

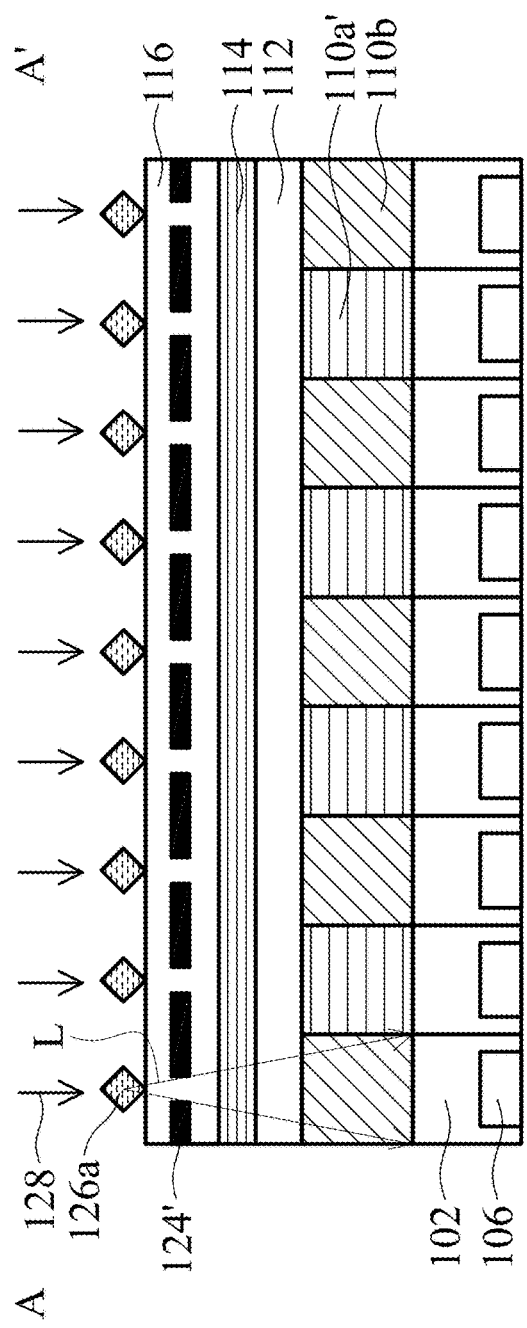
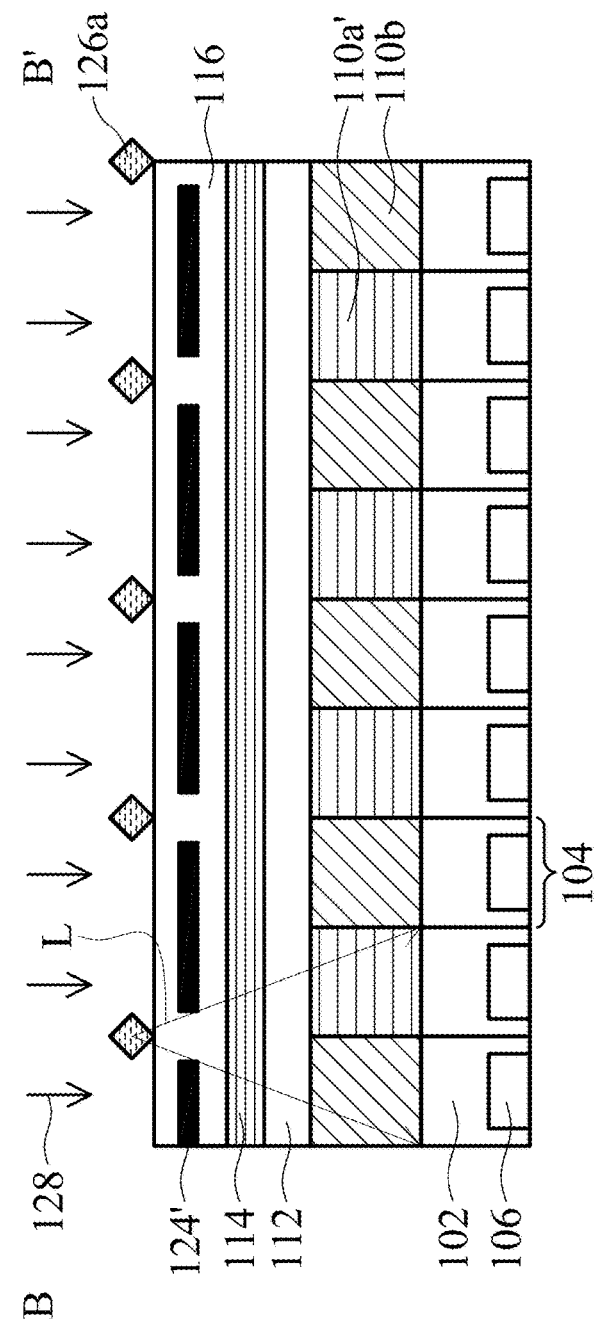
FIG. 10H
FIG. 10I

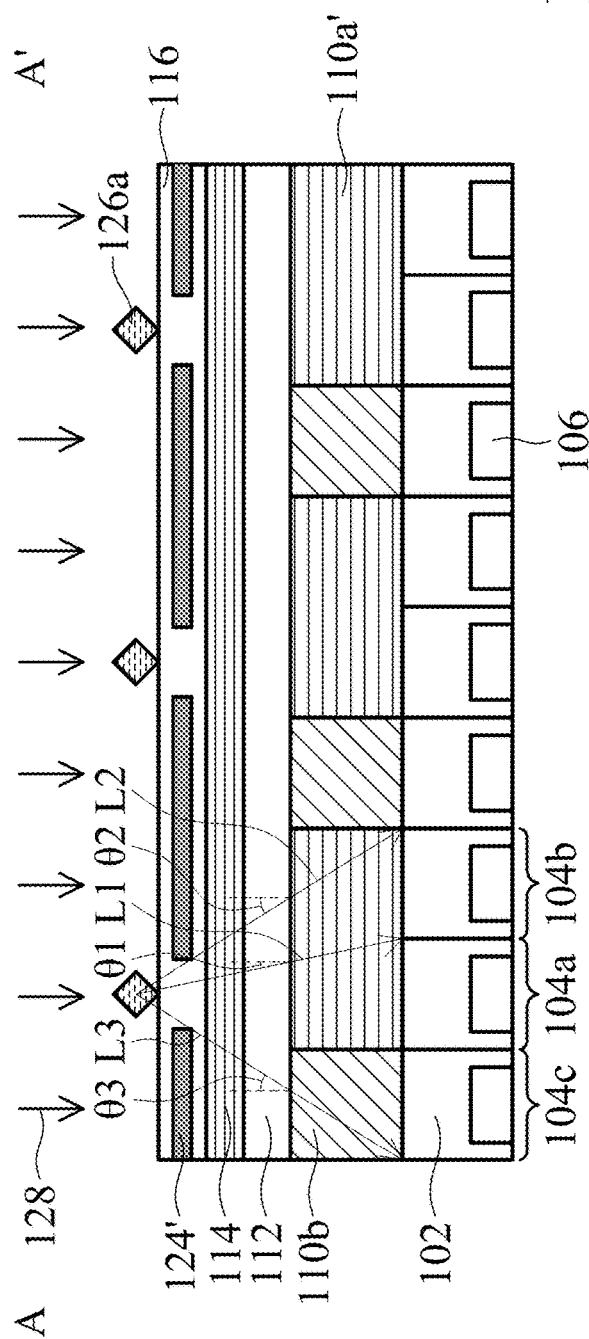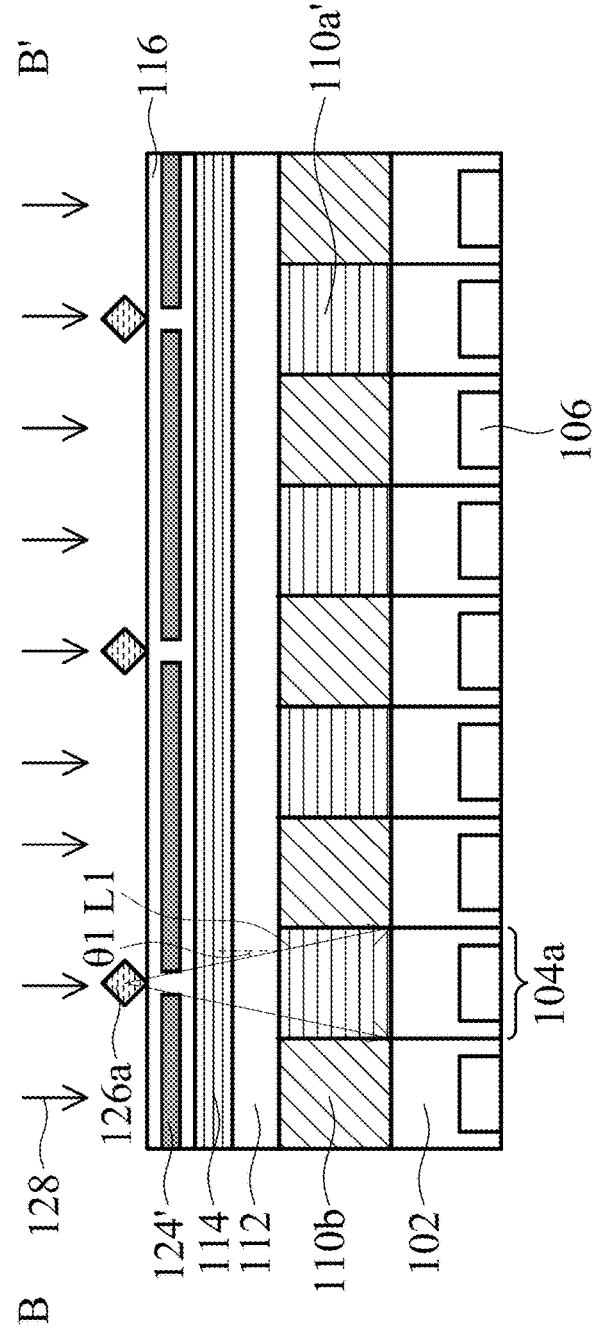
FIG. 12E
FIG. 12F

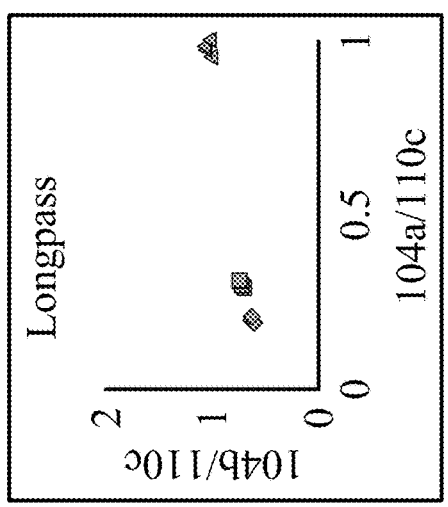
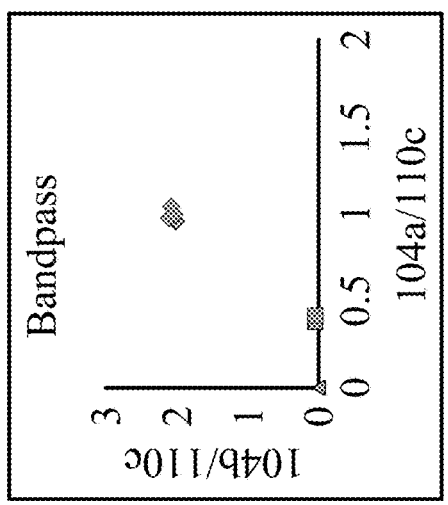
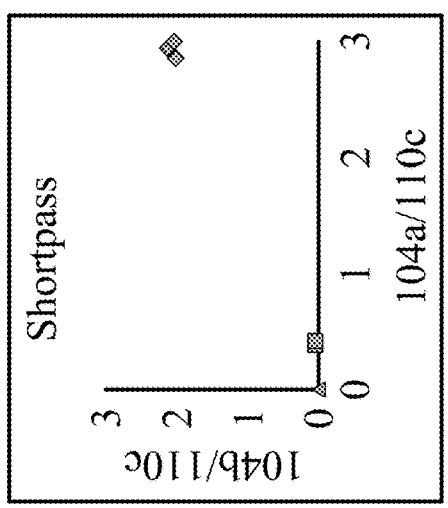
FIG. 13B

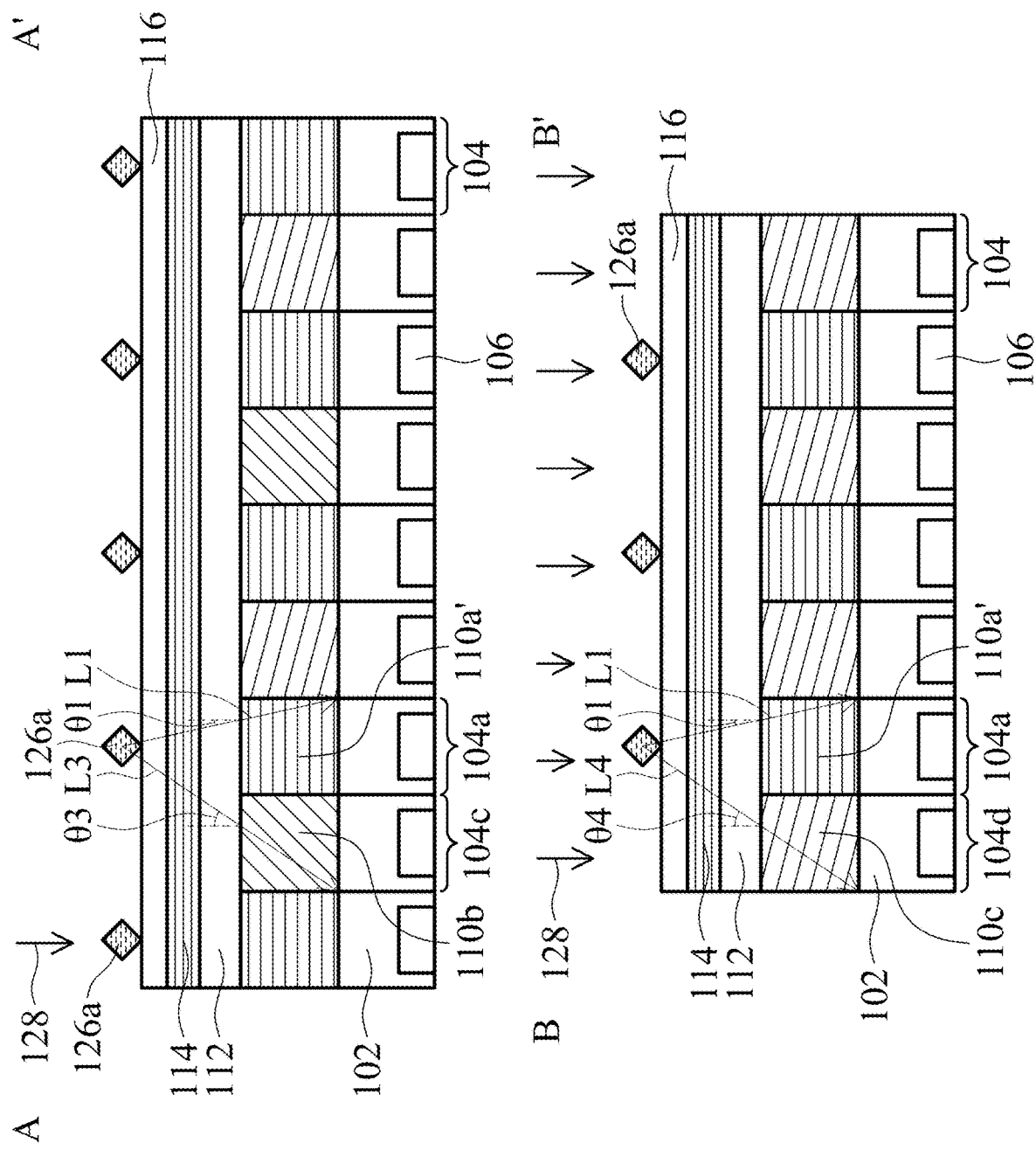

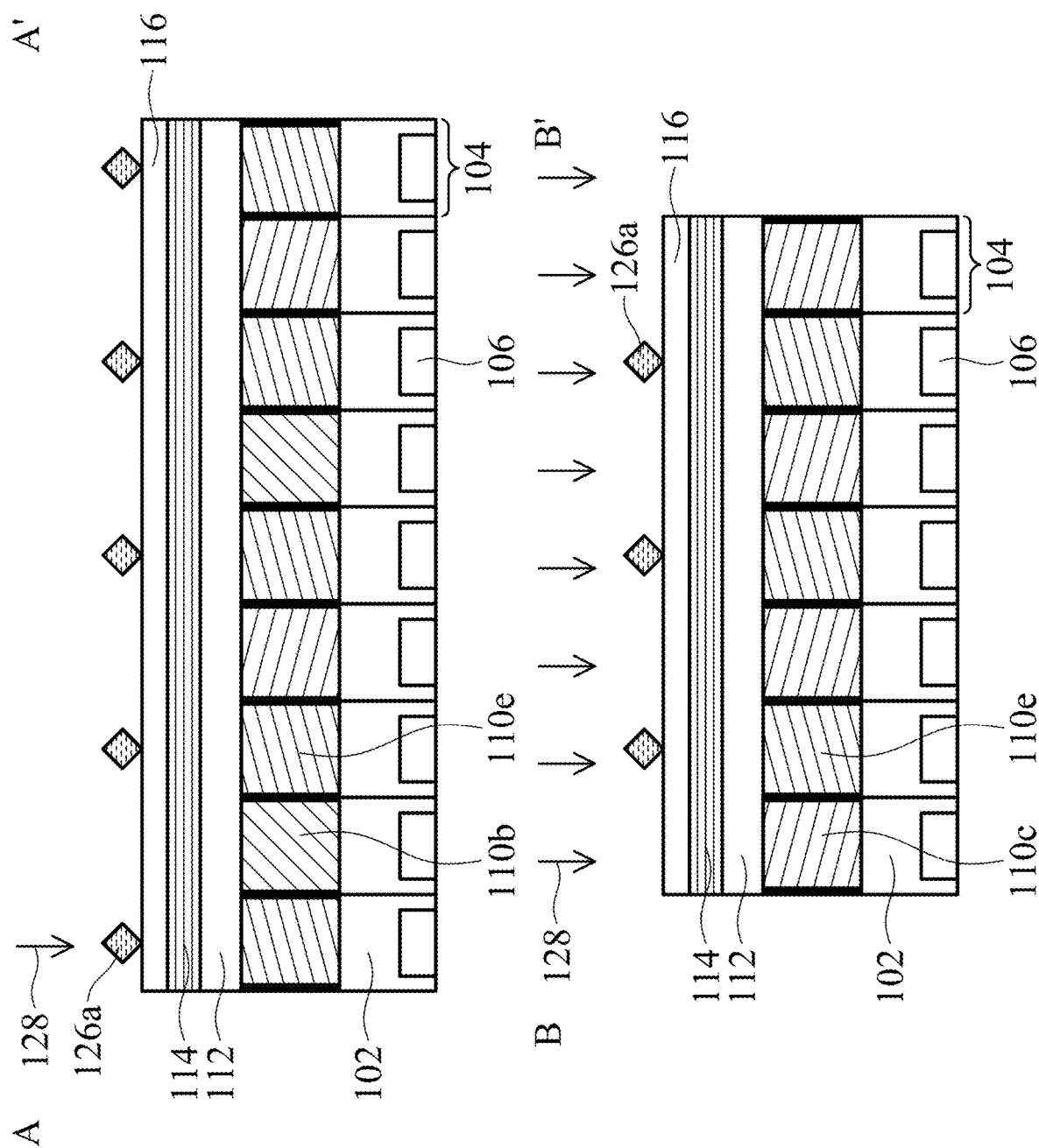

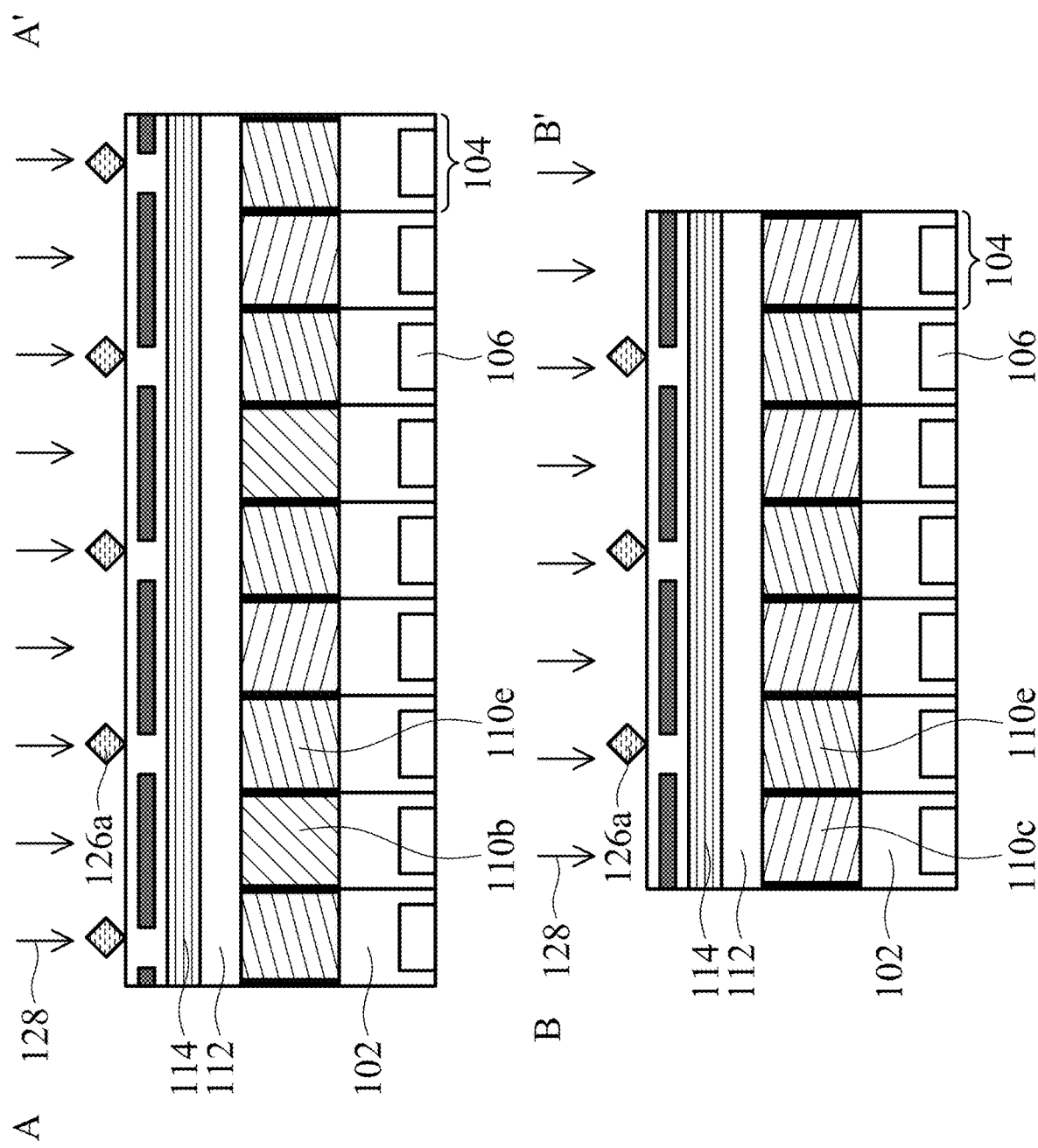

BIOSENSOR AND METHOD OF FORMING THE SAME

CROSS REFERENCE TO RELATED APPLICATIONS

This application is related to the following co-pending commonly assigned patent application: U.S. Ser. No. 16/598,576, filed on Oct. 10, 2019 and entitled "BIOSENSOR AND METHOD OF DISTINGUISHING A LIGHT", the entirety of which is incorporated by reference herein.

BACKGROUND OF THE INVENTION

Field of the Invention

The present invention relates to a biosensor, and in particular it relates to a biosensor with pixelated filters.

Description of the Related Art

In the prior art, biosensors usually use one kind of optical filter to block excitation light and to allow emission light to enter sensing pixels. The optical filter may be an organic filter, which is non-angle-sensitive to the incident light and easy to be patterned. However, the organic filter usually generates strong fluorescence by UV or visible light. The spectrum of the organic filter is broad and less selective. In addition, the adhesion and chemical or mechanical resistance are not as good as other kinds of filters.

The optical filter may also be a dielectric interference filter, which generates weak or no fluorescence by UV or visible light. The dielectric interference filter can be easily adjusted the thickness of each stacked film according to the need of passband and stopband. However, the transmittance of dielectric interference filter is angle-sensitive to the incident light and is difficult to be pixelated (to provide different passband and stopband on neighboring pixels). Therefore, a novel biosensor is needed.

BRIEF SUMMARY OF THE INVENTION

According to some embodiments of the present disclosure, a biosensor is provided. The biosensor includes a substrate, photodiodes, pixelated filters, an excitation light rejection layer and an immobilization layer. The substrate has pixels. The photodiodes are disposed in the substrate and correspond to one of the pixels, respectively. The pixelated filters are disposed on the substrate. The excitation light rejection layer is disposed on the pixelated filter. The immobilization layer is disposed on the excitation light rejection layer.

According to some embodiments of the present disclosure, a method of forming a biosensor is provided. The method includes providing a substrate having pixels; forming photodiodes in the substrate, wherein each of the photodiodes corresponds to one of the pixels, respectively; forming pixelated filters on the substrate; forming an excitation light rejection layer on the pixelated filters; and forming an immobilization layer on the excitation light rejection layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 3A-3E illustrate cross-sectional views of forming a biosensor 200 at various stages in accordance with some embodiments of the present disclosure.

FIGS. 4A-4C illustrate cross-sectional views of forming a biosensor 300 at various stages in accordance with some embodiments of the present disclosure.

FIGS. 5A-5D illustrate cross-sectional views of forming a biosensor 400 at various stages in accordance with some embodiments of the present disclosure.

FIGS. 6A-6C illustrate cross-sectional views of forming a biosensor at various stages in accordance with some embodiments of the present disclosure.

FIGS. 9F-9I illustrates cross-sectional views of FIG. 9E along line A-A' in accordance with some embodiments of the present disclosure.

FIGS. 9K-9L illustrates cross-sectional views of FIG. 9J along line A-A' in accordance with some embodiments of the present disclosure.

FIGS. 10H-10I illustrate cross-sectional views of FIG. 10G along line A-A' and B-B' in accordance with some embodiments of the present disclosure, respectively.

FIG. 12E illustrates a cross-sectional view of FIG. 12G along line A-A' in accordance with some embodiments of the present disclosure.

FIG. 12F illustrates a cross-sectional view of FIG. 12G along line B-B' in accordance with other embodiments of the present disclosure.

FIG. 13B shows analytical graphs of the first signal intensity ratio vs. the second signal intensity ratio plotted in accordance with some embodiments of the present disclosure.

FIGS. 14B-14D illustrate cross-sectional views of FIG. 14A along lines A-A', B-B' and C-C', respectively, in accordance with some embodiments of the present disclosure.

FIGS. 14E-14G illustrate cross-sectional views of FIG. 14A along lines A-A', B-B' and C-C', respectively, in accordance with other embodiments of the present disclosure.

FIGS. 14L-14N illustrate cross-sectional views of FIG. 14H along lines A-A', B-B' and C-C', respectively, in accordance with other embodiments of the present disclosure.

DETAILED DESCRIPTION OF THE INVENTION

Figure 1:
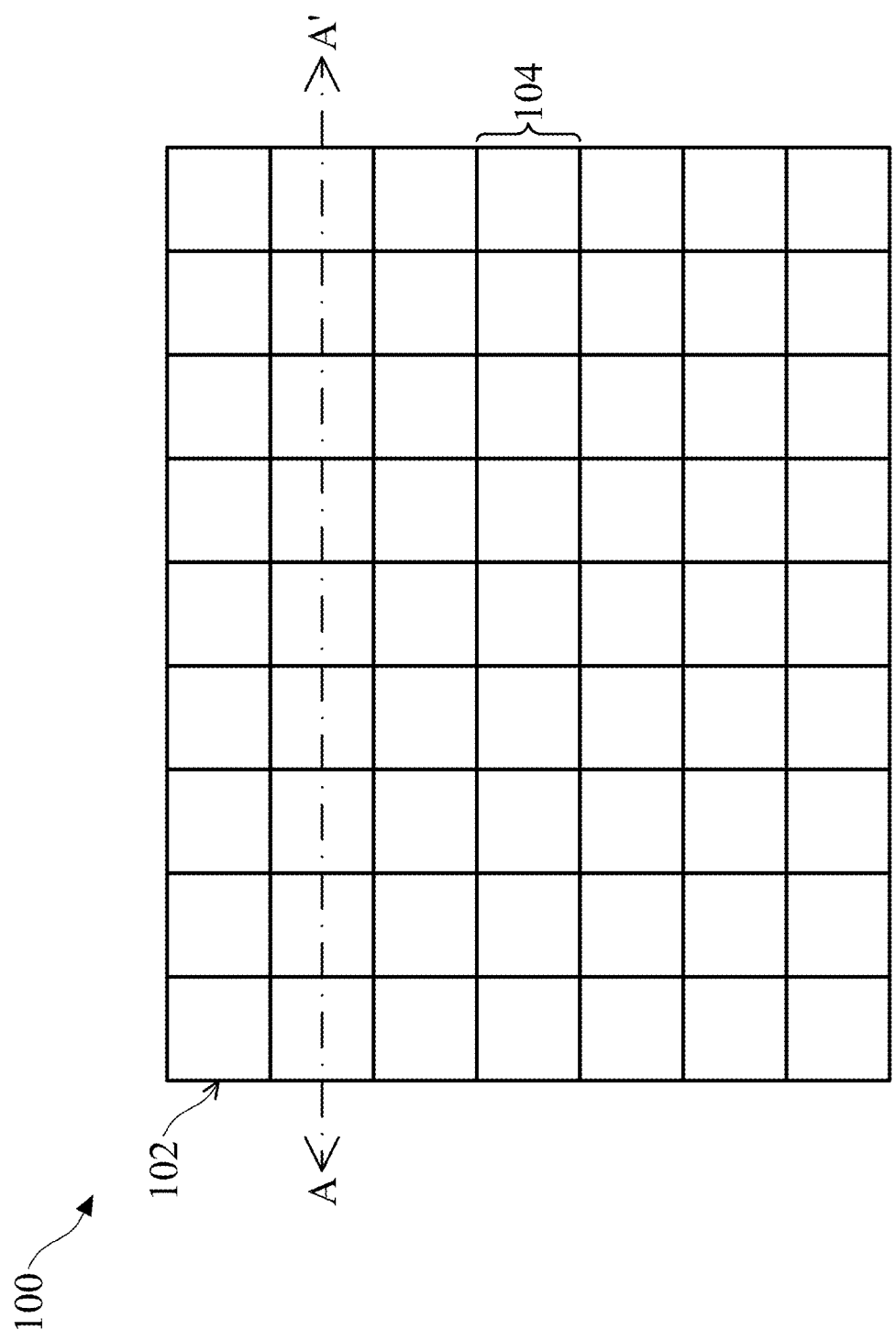
FIG. 1 illustrates a top view of a biosensor 100 in accordance with some embodiments of the present disclosure.

The biosensor of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

Note that the same or similar elements or layers are denoted by like reference numerals. In some embodiments, the same or similar elements or layers denoted by like reference numerals have the same meaning and will not be repeated, for the sake of brevity.

The biosensors provided by the embodiments of the present disclosure include pixelated filters. The filters can be provided with a stronger adhesion and chemical or mechanical resistance, thus preventing the peeling issue that may be caused by direct contact between organic color filters. The present disclosure can be used for cell behavior observation, DNA sequencing, qPCR, DNA/protein microarray, liquid biopsy, etc.

FIG. 1 illustrates a top view of a biosensor 100 in accordance with some embodiments of the present disclosure. Referring to FIG. 1, the biosensor 100 includes a substrate 102 having pixels 104.

FIGS. 2A-2G illustrate cross-sectional views of forming the biosensor 100 of FIG. 1 at various stages along line A-A' in accordance with some embodiments of the present disclosure.

Figure 2A:
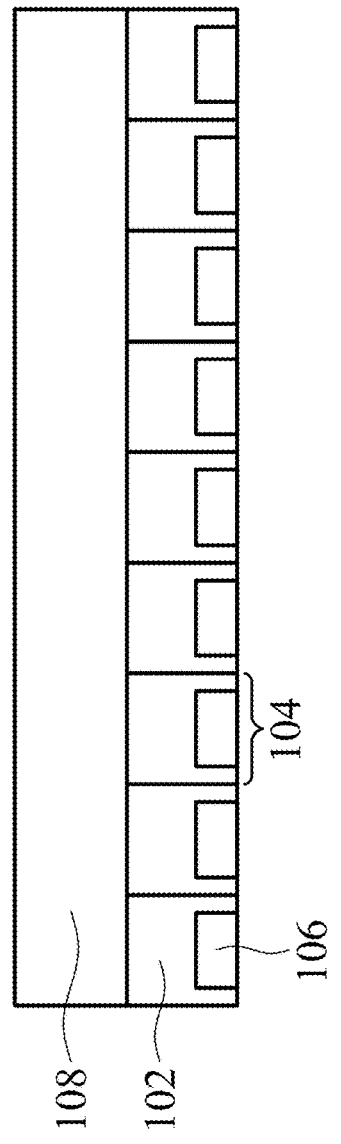
FIGS. 2A-2G illustrate cross-sectional views of forming the biosensor 100 of FIG. 1 at various stages along line A-A' in accordance with some embodiments of the present disclosure.

Referring to FIG. 2A, the substrate 102 is provided. Photodiodes 106 are formed in the substrate 102. One photodiode 106 corresponds to and defines one pixel 104. In some embodiments of the present disclosure, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable material, or a combination thereof.

In some embodiments, the substrate 102 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the substrate 102 is an un-doped substrate.

Next, the material layer 108 is formed on the substrate 102. In some embodiments, the material layer 108 may be formed by using sputtering, spin-coating, chemical vapor deposition (CVD), low-pressure chemical vapor deposition (LPCVD), low-temperature chemical vapor deposition (LTCVD), rapid thermal chemical vapor deposition (RT-CVD), plasma enhanced chemical vapor deposition (PECVD), atomic layer deposition (ALD), physical vapor deposition process, molecular beam deposition process, any other suitable process or a combination thereof. The material of the material layer 108 may include metal or dielectric. The metal may include tungsten (W), copper (Cu), aluminum (Al), silver (Ag), gold (Au), titanium (Ti), nickel (Ni), zinc (Zn), an alloy thereof, a combination thereof or the like. The dielectric may include silicon carbide (SiC), nitrogen-doped silicon carbide, oxygen-doped silicon carbide, silicon nitride (SiN), silicon oxynitride (SiON), silicon oxide, one or more other suitable materials, a combination thereof or the like.

Figure 2B:
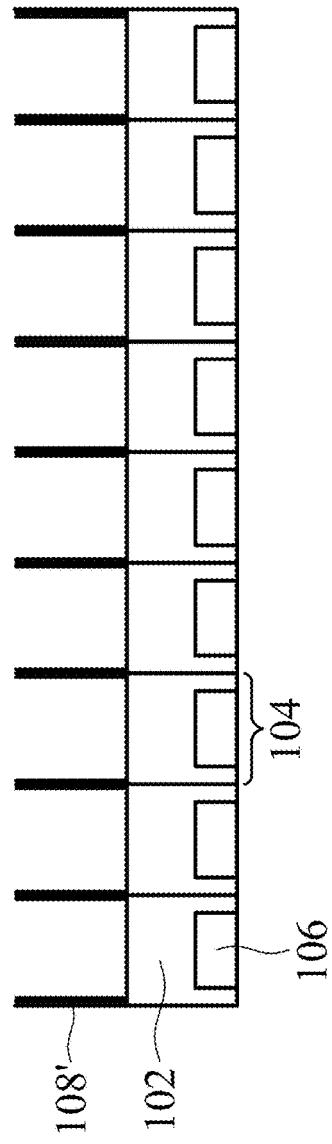

Then referring to FIG. 2B, the material layer 108 is patterned. A photoresist material is formed on the material layer 108 by a suitable process, such as a sputtering, spin-coating or CVD, LPCVD, LTCVD, RTCVD, PECVD, ALD, a physical vapor deposition process, a molecular beam deposition process or a combination thereof. Next, optical exposure, post-exposure baking and development are performed to remove some photoresist material to form a patterned photoresist layer. The patterned photoresist layer serves as an etching mask for etching. A bi- or tri-layered photoresist may be performed. Then, a grid wall 108' is formed by using any suitable etching process, such as reactive ion etch (RIE), neutral beam etch (NBE), the like or a combination thereof to etch the material layer 108. The grid wall 108' is disposed between two adjacent pixels 104. To be specific, the grid wall 108' is disposed around one of the pixels 104. Subsequently, the photoresist layer may be removed by etching or any other suitable method.

Figure 2C:
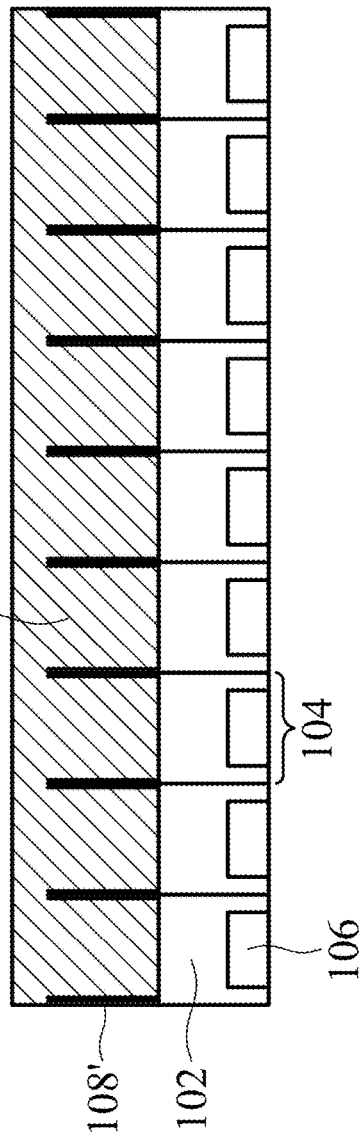

Next, referring to FIG. 2C, a filter material layer 110 is formed on the substrate 102. To be specific, a portion of the filter material layer 110 is formed between the grid walls 108'. In some embodiments, the filter material layer 110 may be formed by using sputtering, spin-coating, CVD, LPCVD, LTCVD, RTCVD, PECVD, ALD, physical vapor deposition process, molecular beam deposition process, any other suitable process or a combination thereof.

Figure 2D:
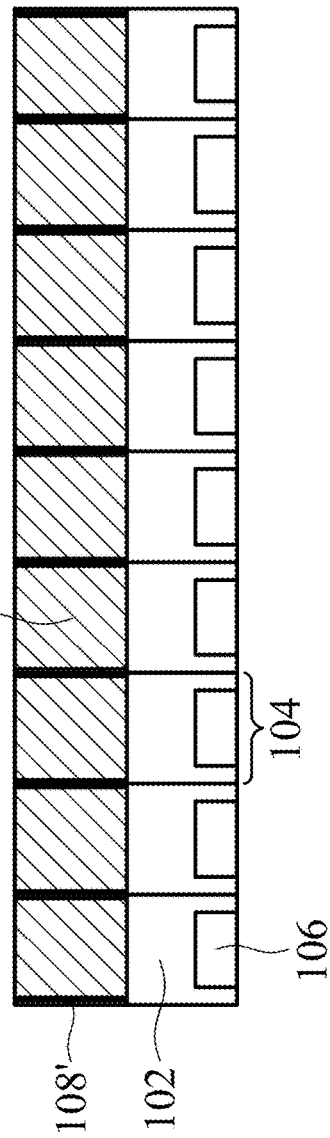

Next, referring to FIG. 2D, a portion of the filter material layer 110 is removed by an etching process. To be specific, the portion of the filter material layer 110 above the grid wall 108' is removed, and then pixelated filters 110' are formed on the substrate 102. In some embodiments, the top surface of the grid wall 108' and the top surface of the pixelated filters 110' are coplanar. In some embodiments, the pixelated filters 110' may be organic color filters.

Figure 2E:
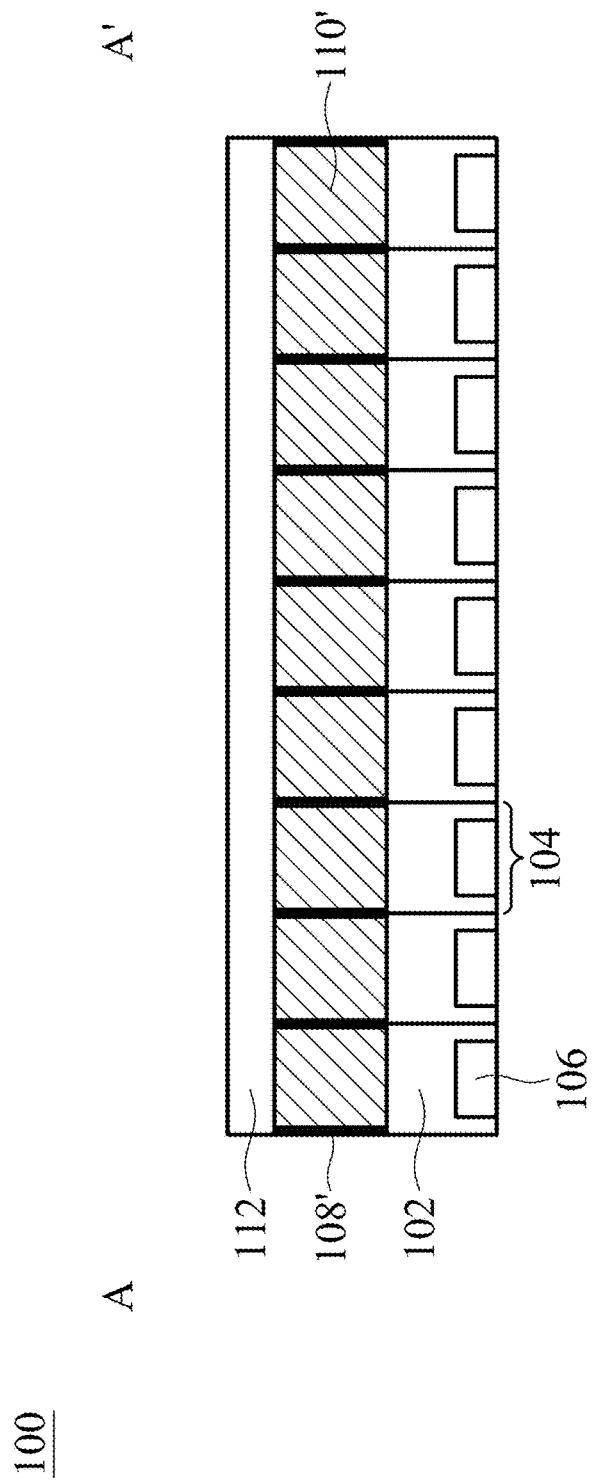

Next, referring to FIG. 2E, an interlayer 112 is formed on the pixelated filters 110' to planarize the profile. In some embodiments, the interlayer 112 may be formed by using sputtering, spin-coating, CVD, LPCVD, LTCVD, RTCVD, PECVD, ALD, physical vapor deposition process, molecular beam deposition process, any other suitable process or a combination thereof. The material of the interlayer 112 includes organic polymer, $SiO_2$, $Al_2O_3$, $Si_3N_4$, $Ta_2O_5$, other suitable dielectric materials or a combination thereof.

Figure 2F:
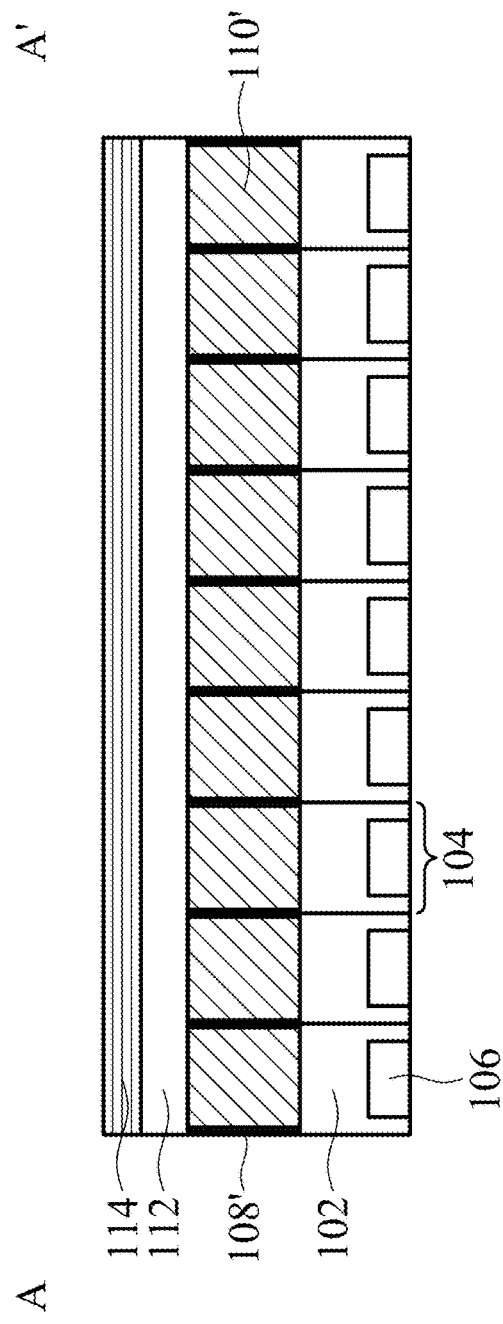

Next, referring to FIG. 2F, an excitation light rejection layer 114 is formed on the pixelated filters 110'. In some embodiments, the excitation light rejection layer 114 may be formed by using sputtering, spin-coating, CVD, LPCVD, LTCVD, RTCVD, PECVD, ALD, physical vapor deposition process, molecular beam deposition process, any other suitable process or a combination thereof The excitation light rejection layer 114 may be a Fabry-Perot interference filter which includes at least one dielectric optical cavity made from two parallel reflecting surfaces. In some embodiments, the Fabry-Perot interference filter is a dielectric multifilm with alternative deposition of a high refractive index dielectric layer and a low refractive index dielectric layer. In other embodiments, the Fabry-Perot interference filter is a multifilm with alternative deposition of a metal layer with a high reflective index and an oxide layer with a low reflective index. For example, the excitation light rejection layer 114 may be $TiO_2/SiO_2$, $Ta_2O_5/SiO_2$, $Nb_2O_5/SiO_2$, SiH/SiN, $Ag/SiO_2$, $Cu/SiO_2$, $Au/SiO_2$, $Al/SiO_2$ or a combination thereof. The excitation light rejection layer 114 may be a dielectric interference filter with a metal layer. Since a metal layer is included in the excitation light rejection layer, the thickness of the excitation light rejection layer 114 may be from 0.1 μm to 2 μm that is thinner than dielectric only filter with the same optical density (OD) for laser excitation light rejection. The metal layer may include Ag, Au, Al, Cu or a combination thereof.

Figure 2G:
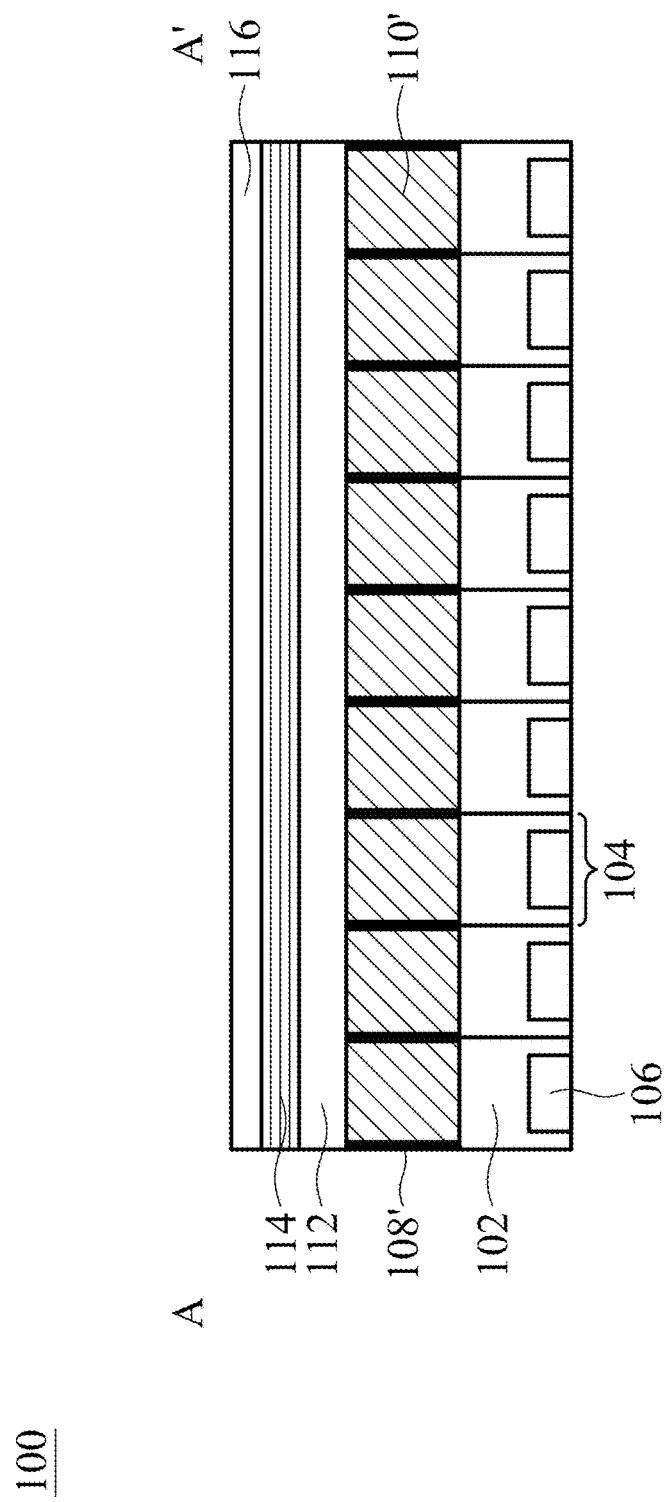

Next, referring to FIG. 2G, an immobilization layer 116 is formed on the excitation light rejection layer 114. The immobilization layer 116 immobilizes an analyte. In some embodiments, the immobilization layer 116 may be formed by using sputtering, spin-coating, CVD, LPCVD, LTCVD, RTCVD, PECVD, ALD, physical vapor deposition process, molecular beam deposition process, any other suitable process or a combination thereof The material of the immobilization layer 116 includes $SiO_2$, $Ta_2O_5$, $Al_2O_3$, Au, metal oxide or a combination thereof. Then, the biosensor 100 is formed. In accordance with some embodiments, the immobilization material may be transparent or semi-transparent.

Since the excitation light rejection layer is disposed between the pixelated filter 110 and the immobilization layer, the excitation light rejection layer can prevent the excitation light from irradiating the pixelated filter, thus avoid the pixelated filter from generating undesired fluorescence.

Since the filters 110 are pixelated by the grid wall, the filters can be provided with a stronger adhesion and chemical or mechanical resistance, thus preventing the peeling issue that may be caused by direct contact between organic color filters.

FIGS. 3A-3E illustrate cross-sectional views of forming a biosensor 200 at various stages in accordance with some embodiments of the present disclosure.

Referring to FIG. 3A, the substrate 102 is provided. Then, a material layer 110a is formed on the substrate. In some embodiments, the material layer 110a may be formed by using sputtering, spin-coating, CVD, LPCVD, LTCVD, RTCVD, PECVD, ALD, physical vapor deposition process, molecular beam deposition process, any other suitable process or a combination thereof. The material layer 110a may be a dielectric interference filter which includes a dielectric film with high refractive index and a dielectric film with low refractive index arranged horizontally, such as $TiO_2/SiO_2$, $Ta_2O_5/SiO_2$, $Nb_2O_5/SiO_2$, SiH/SiN, or a combination thereof Then referring to FIG. 3B, the material layer 110a is patterned. To be specific, a photoresist material is formed on the material layer 110a by a suitable process, such as a sputtering, spin-coating, or CVD, LPCVD, LTCVD, RTCVD, PECVD, ALD, a physical vapor deposition process, a molecular beam deposition process or a combination thereof. Next, optical exposure, post-exposure baking and development are performed to remove some photoresist material to form a patterned photoresist layer. The patterned photoresist layer serves as an etching mask for etching. A bi- or tri-layered photoresist may be performed. Then, the material layer 110a is etched by using any suitable etching process, such as RIE, NBE, the like or a combination thereof. Then, pixelated dielectric interference filters 110a' are formed. Subsequently, the photoresist layer may be removed by etching or any other suitable method. One pixelated dielectric interference filter 110a' corresponds to two pixels 104, and two pixelated dielectric interference filters 110a' has an opening corresponding to one pixel 104. The pixelated dielectric interference filters 110a' may be a bandpass filter, a shortpass filter, a longpass filter or a multiple bandpass filter.

Figure 3C:
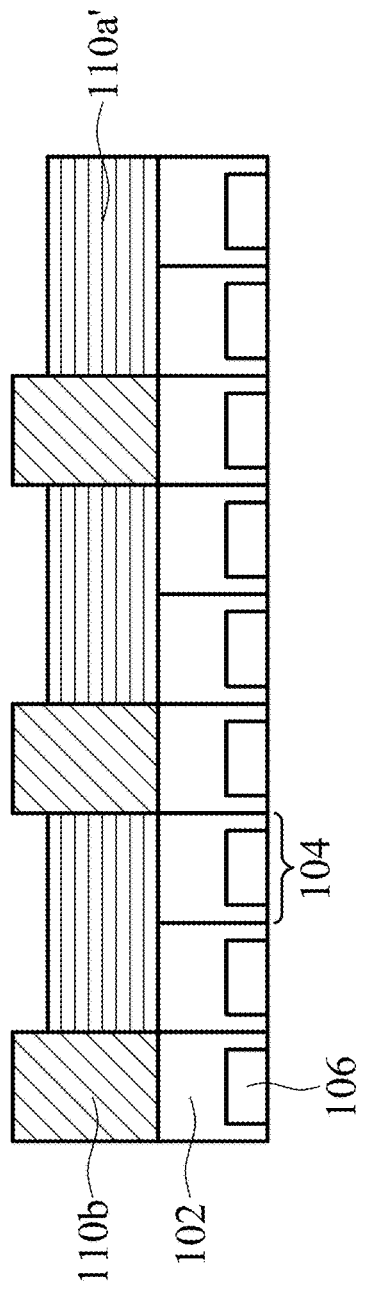

Next, referring to FIG. 3C, an organic color filter 110b is formed on the substrate 102. To be specific, a portion of the organic color filter 110b is in the openings between the pixelated dielectric interference filters 110a'.

Figure 3D:
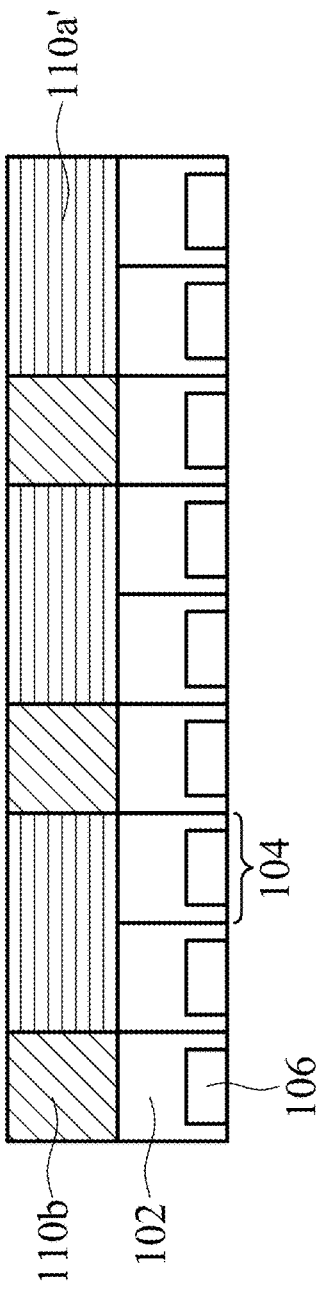

Next, referring to FIG. 3D, a portion of the organic color filter 110b is removed by an etching process. To be specific, the portion of the organic color filter 110b above the pixelated dielectric interference filters 110a' is removed, and then the pixelated filters 110' are formed on the substrate 102. In some embodiments, the top surface of the pixelated dielectric interference filters 110a' and the top surface of the organic color filter 110b are coplanar. The organic color filter 110b may have a thickness that is equal to or thinner than that of the pixelated dielectric interference filters 110a'.

Figure 3E:
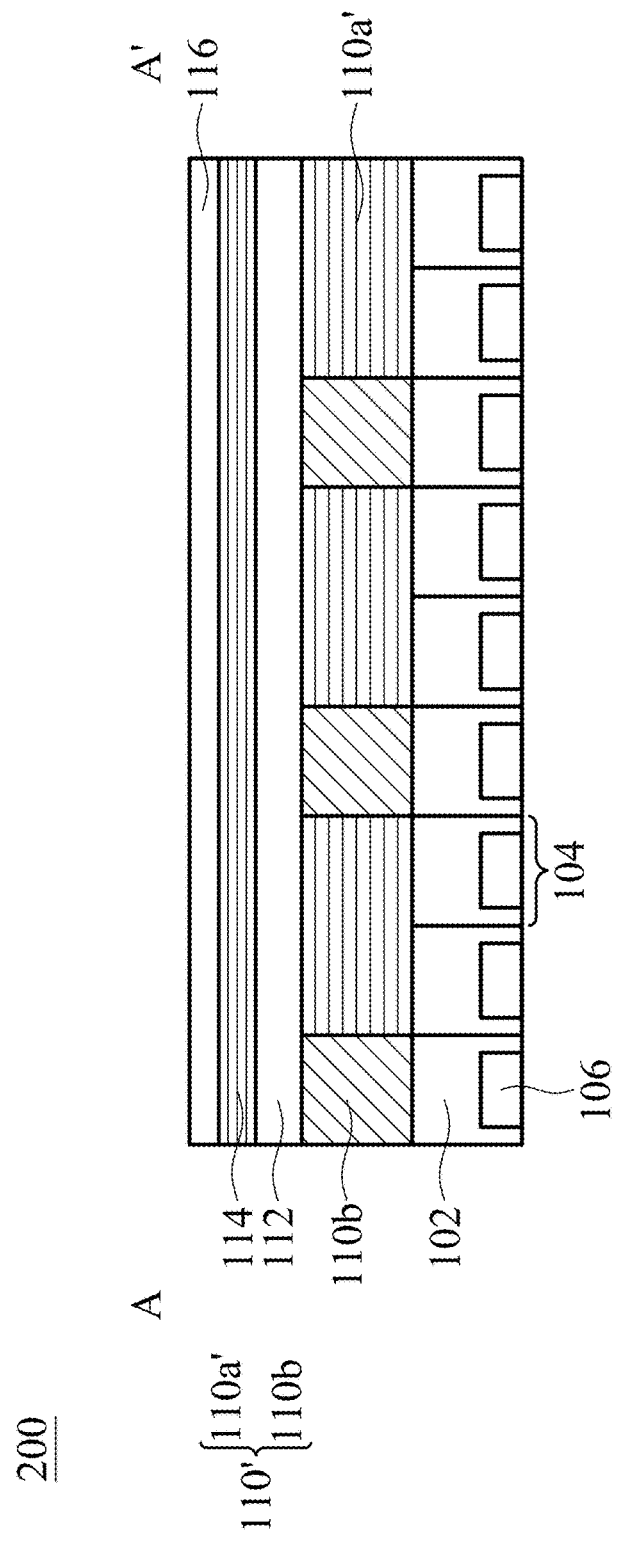

Next, referring to FIG. 3E, an interlayer 112, an excitation light rejection layer 114 and an immobilization layer 116 are subsequently formed on the pixelated filters 110' as described in FIGS. 2E-2G. The biosensor 200 is formed.

Since the excitation light rejection layer is disposed between the filter and the immobilization layer, the excitation light rejection layer can prevent the excitation light from irradiating the filter 110b, thus avoid the filter from generating undesired fluorescence.

Since each of the organic color filters are isolated by the pixelated dielectric interference filter, the filters can be provided with a stronger adhesion and chemical or mechanical resistance, thus preventing the peeling issue that may be caused by direct contact between organic color filters.

Figures 4A, 4B:
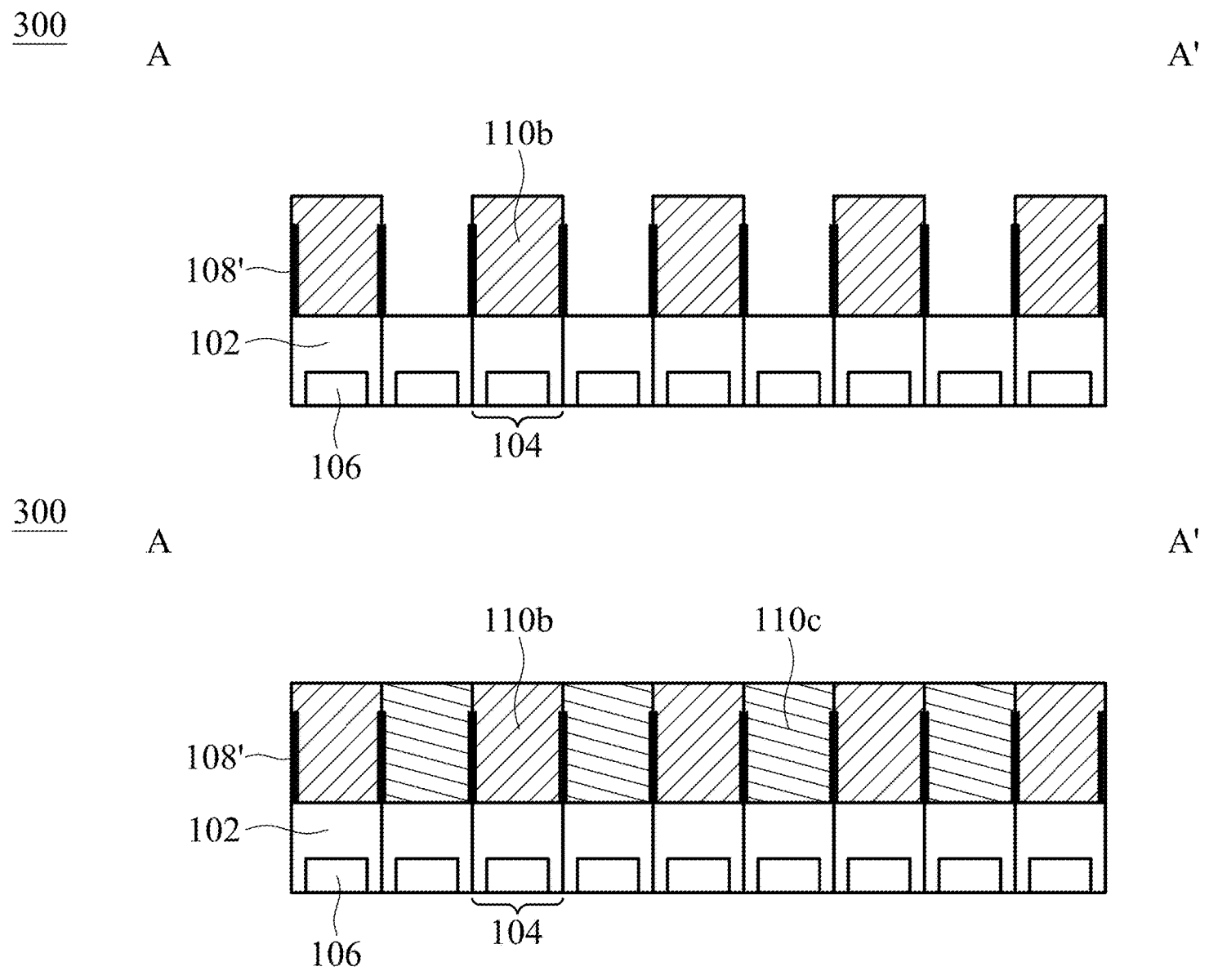

FIGS. 4A-4C illustrate cross-sectional views of forming a biosensor 300 at various stages in accordance with some embodiments of the present disclosure.

FIG. 4A follows the structure illustrated in FIG. 2B. Referring to FIG. 4A, the organic color filter 110b is formed on the substrate 102 by the patterning process described above. To be specific, the organic color filter 110b is formed between the grid walls 108'.

Next, referring to FIG. 4B, an organic color filter 110c is formed on the substrate 102 by the patterning process described above. To be specific, the organic color filter 110c is formed between the grid walls 108' and between the organic color filter 110b.

Next, referring to FIG. 4C, a portion of the organic color filter 110b and a portion of the organic color filter 110c that are above the grid wall 108' are etched as described in FIG. 2D. Then, an interlayer 112, an excitation light rejection layer 114 and an immobilization layer 116 are subsequently formed on the pixelated filters 110' as described in FIGS. 2E-2G. The biosensor 300 is formed.

In some embodiments, the organic color filters 110b and 110c may have areas equal to or smaller than that of one pixel 104.

Since the excitation light rejection layer is disposed between the filter and the immobilization layer, the excitation light rejection layer can prevent the excitation light from irradiating the filter 110b and 110c, thus avoid the filter from generating undesired fluorescence.

Since the filters are pixelated by the grid wall, the filters can be provided with a stronger adhesion and chemical or mechanical resistance, thus preventing the peeling issue that may be caused by direct contact between organic color filters.

FIGS. 5A-5D illustrate cross-sectional views of forming a biosensor at various stages in accordance with some embodiments of the present disclosure.

FIG. 5A follows the structure illustrated in FIG. 3B. The difference between FIG. 5A and FIG. 3B is that one pixelated dielectric interference filters 110a' corresponds to one pixel 104.

Next, referring to FIG. 5B, the organic color filter 110b and the organic color filter 110c are formed as described above. The pixelated dielectric interference filter 110a' is interposed between the organic color filter 110b and the organic color filter 110c.

Next, referring to FIG. 5C, a portion of the organic color filter 110b and a portion of the organic color filter 110c that are above the pixelated dielectric interference filters 110a' are etched as described in FIG. 2D, and then the pixelated filter 110' is formed. The organic color filter 110b and the organic color filter 110c may have a thickness that is equal to or thinner than that of the pixelated dielectric interference filters 110a'.

Next, referring to FIG. 5D, an interlayer 112, an excitation light rejection layer 114 and an immobilization layer 116 are subsequently formed on the pixelated filters 110' as described in FIGS. 2E-2G. The biosensor 400 is formed.

Since the excitation light rejection layer is disposed between the filter and the immobilization layer, the excitation light rejection layer can prevent the excitation light from irradiating the filter 110b and 110c, thus avoid the filter from generating undesired fluorescence.

Since each of the organic color filters are isolated by the pixelated dielectric interference filter, the filters can be provided with a stronger adhesion and chemical or mechanical resistance, thus preventing the peeling issue that may be caused by direct contact between organic color filters.

Figure 6C:
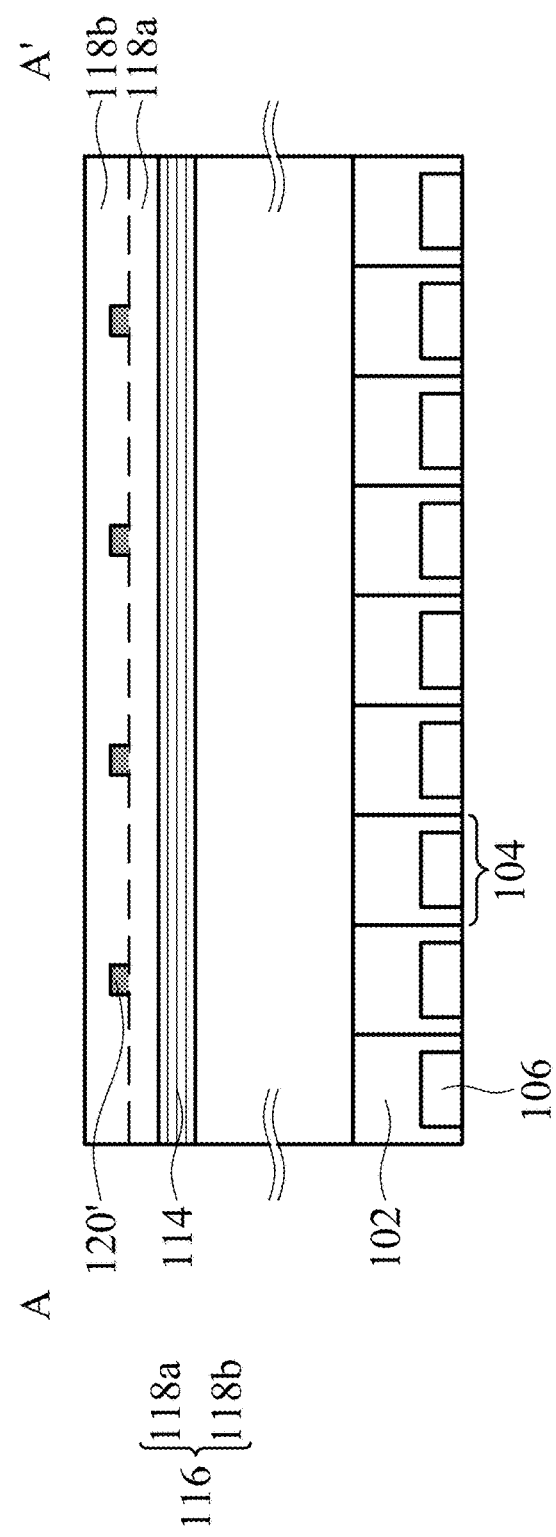

FIGS. 6A-6C illustrate cross-sectional views of forming a biosensor at various stages in accordance with some embodiments of the present disclosure.

FIG. 6A follows the structures after the excitation light rejection layer 114 is formed. Referring to FIG. 6A, a lower cladding layer 118a is formed on the excitation light rejection layer 114 using sputtering, spin-coating, CVD, LPCVD, LTCVD, RTCVD, PECVD, ALD, physical vapor deposition process, molecular beam deposition process, any other suitable process or a combination thereof. The material of the lower cladding layer 118a includes polymer, $SiO_2$, $Al_2O_3$, a material with low refractive index or a combination thereof. Then, a waveguide 120 is formed on the lower cladding layer 118a. The material of the waveguide layer 120 includes $TiO_2$, $Ta_2O_5$, $Nb_2O_5$, $AlO_3$, $Si_3N_4$, a material with high refractive index. The refractive index of waveguide layer 120 is higher than that the cladding layer 118a.

Referring to FIG. 6B, the waveguide 120 is patterned. A photoresist material is formed on the waveguide 120 by a suitable process, such as a sputtering, spin-coating, or CVD, LPCVD, LTCVD, RTCVD, PECVD, ALD, a physical vapor deposition process, a molecular beam deposition process or a combination thereof. Next, optical exposure, post-exposure baking and development are performed to remove some photoresist material to form a patterned photoresist layer. The patterned photoresist layer serves as an etching mask for etching. A bi- or tri-layered photoresist may be performed. Then, a patterned waveguide 120' is formed by using any suitable etching process, such as RIE, NBE, the like or a combination thereof to etch the waveguide 120. The patterned waveguide 120' is linear. Subsequently, the photoresist layer may be removed by etching or any other suitable method.

Referring to FIG. 6C, a upper cladding layer 118b is formed on the lower cladding layer 118a using sputtering, spin-coating, CVD, LPCVD, LTCVD, RTCVD, PECVD, ALD, physical vapor deposition process, molecular beam deposition process, any other suitable process or a combination thereof. To be specific, the patterned waveguide 120' is covered by the upper cladding layer 118b. The material of the upper cladding layer 118b includes polymer, $SiO_2$, $Al_2O_3$, a material with low refractive index or a combination thereof.

In some embodiments, the material of the upper cladding layer 118b is the same as that of the lower cladding layer 118a, so that the interface between the upper cladding layer 118b and the lower cladding layer 118a are not obvious. In other embodiments, the material of the upper cladding layer 118a is different from that of the lower cladding layer 118a. The upper cladding layer 118b and the lower cladding layer 118a may serve as an immobilization layer 116.

By configuring the biosensor with the waveguide, it is easier to control when and how analyte is excited, so that cross-talk can be avoided.

It should be understood that the waveguide structure can be included in any one of the biosensors described above.

Figure 7A:
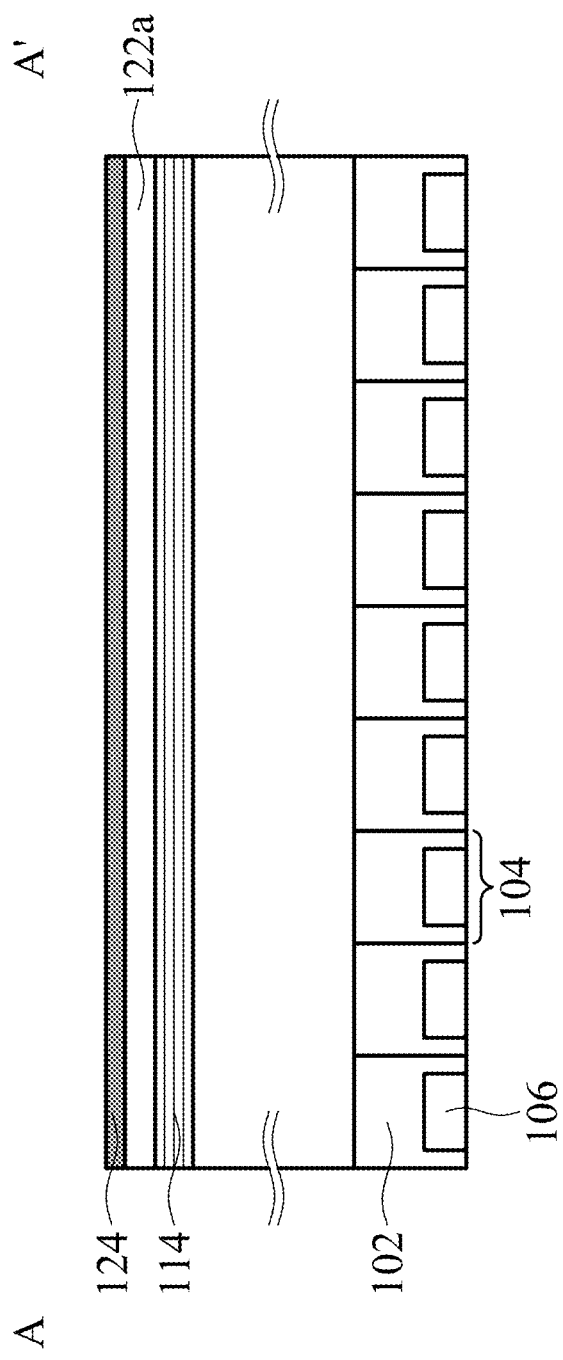
FIGS. 7A-7C illustrate cross-sectional views of forming a biosensor at various stages in accordance with some embodiments of the present disclosure.
Figure 7B:
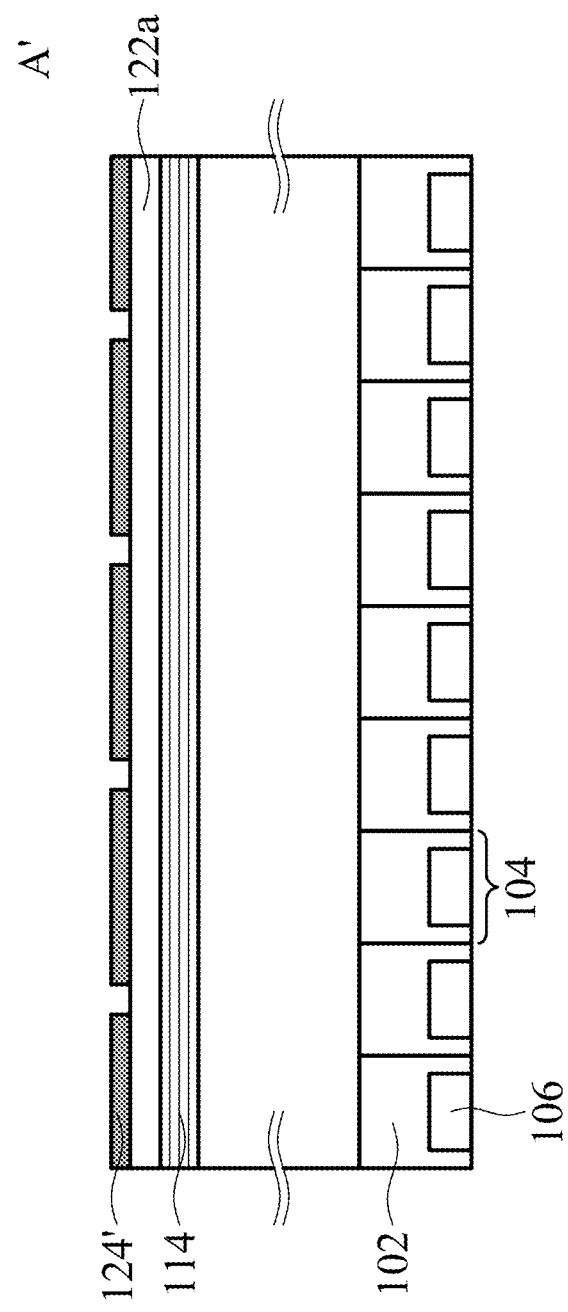
Figure 7C:
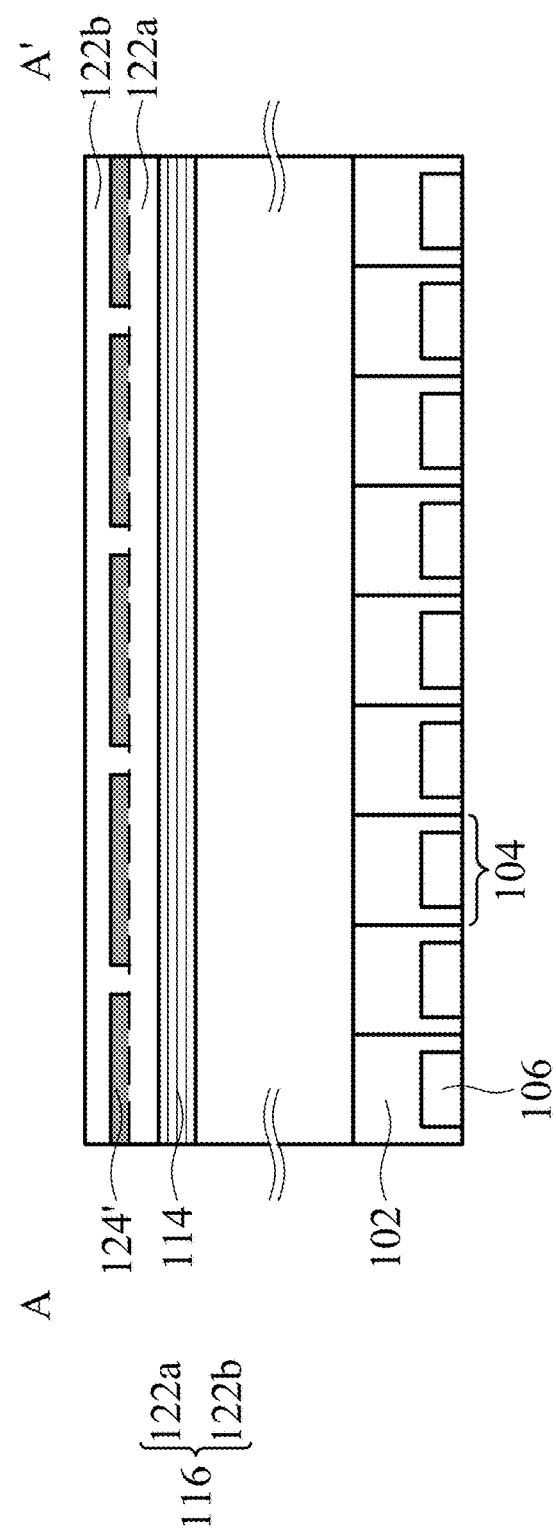

FIGS. 7A-7C illustrate cross-sectional views of forming a biosensor at various stages in accordance with some embodiments of the present disclosure.

FIG. 7A follows the structures after the excitation light rejection layer 114 is formed. Referring to FIG. 7A, a lower oxidation layer 122a is formed on the excitation light rejection layer 114 using sputtering, spin-coating, CVD, LPCVD, LTCVD, RTCVD, PECVD, ALD, physical vapor deposition process, molecular beam deposition process, any other suitable process or a combination thereof. The material of the lower oxidation layer 122a includes polymer, $SiO_2$, $Al_2O_3$, a material with low refractive index or a combination thereof.

Then, an opaque material 124 is formed on the lower oxidation layer 122a. The material of the opaque material 124 includes W, Ti, Al, Nb, Ni, Au, Cu, SiH, Ag, an alloy thereof or a combination thereof.

Referring to FIG. 7B, the opaque material 124 is patterned. A photoresist material is formed on the opaque material 124 by a suitable process, such as a sputtering, spin-coating, or CVD, LPCVD, LTCVD, RTCVD, PECVD, ALD, a physical vapor deposition process, a molecular beam deposition process or a combination thereof. Next, optical exposure, post-exposure baking and development are performed to remove some photoresist material to form a patterned photoresist layer. The patterned photoresist layer serves as an etching mask for etching. A bi- or tri-layered photoresist may be performed. Then, aperture structure 124' is formed by using any suitable etching process, such as RIE, NBE, the like or a combination thereof to etch the opaque material 124. The aperture structure 124' has an opening that corresponds to one of the pixels 104. Subsequently, the photoresist layer may be removed by etching or any other suitable method.

Referring to FIG. 7C, a upper oxidation layer 122b is formed on the lower oxidation layer 122a using sputtering, spin-coating, CVD, LPCVD, LTCVD, RTCVD, PECVD, ALD, physical vapor deposition process, molecular beam deposition process, any other suitable process or a combination thereof. To be specific, the aperture structure 124' is covered by the upper oxidation layer 122b. The material of the upper oxidation layer 122b includes polymer, $SiO_2$, $Al_2O_3$, a material with low refractive index or a combination thereof.

In some embodiments, the material of the upper oxidation layer 122b is the same as that of the lower oxidation layer 122a, so that the interface between the upper oxidation layer 122b and the lower oxidation layer 122a are not obvious. In other embodiments, the material of the upper oxidation layer 122b is different from that of the lower oxidation layer 122a. The upper oxidation layer 122b and the lower oxidation layer 122a may serve as the immobilization layer 116.

Since the aperture structure includes the opening so that the light emitted by the analyte can be further controlled to be detected by certain areas of the substrate, thus avoiding cross-talk.

It should be understood that the aperture structure can be included in any one of the biosensors described above.

Figure 8A:
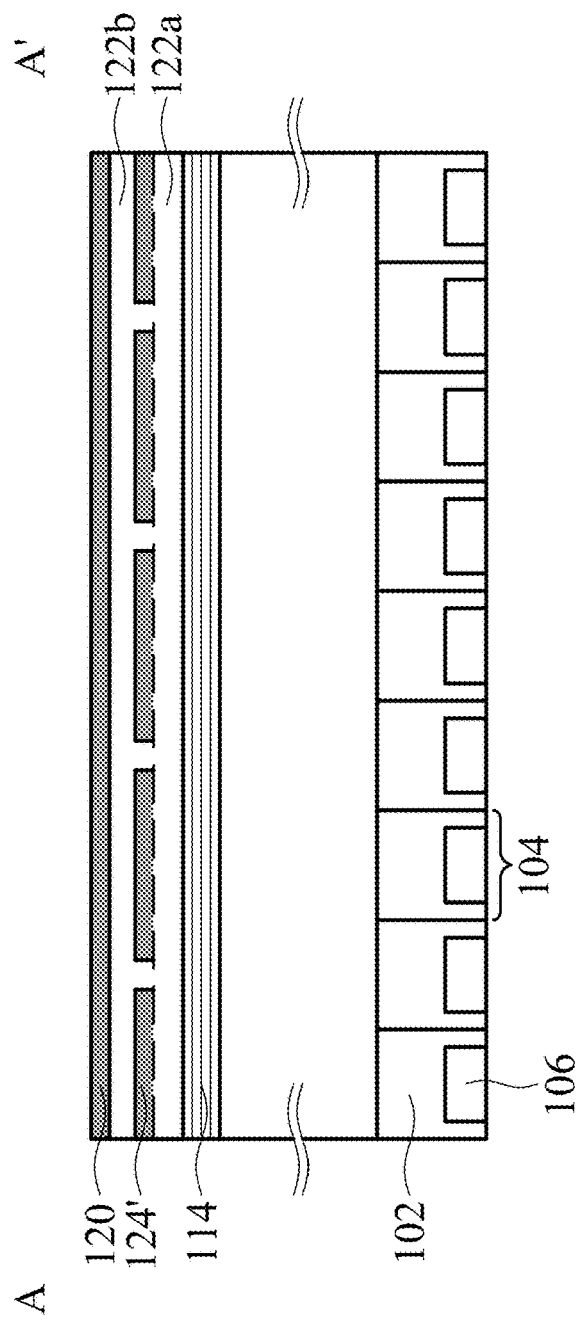
FIGS. 8A-8B illustrate cross-sectional views of forming a biosensor at various stages in accordance with some embodiments of the present disclosure.
Figure 8B:
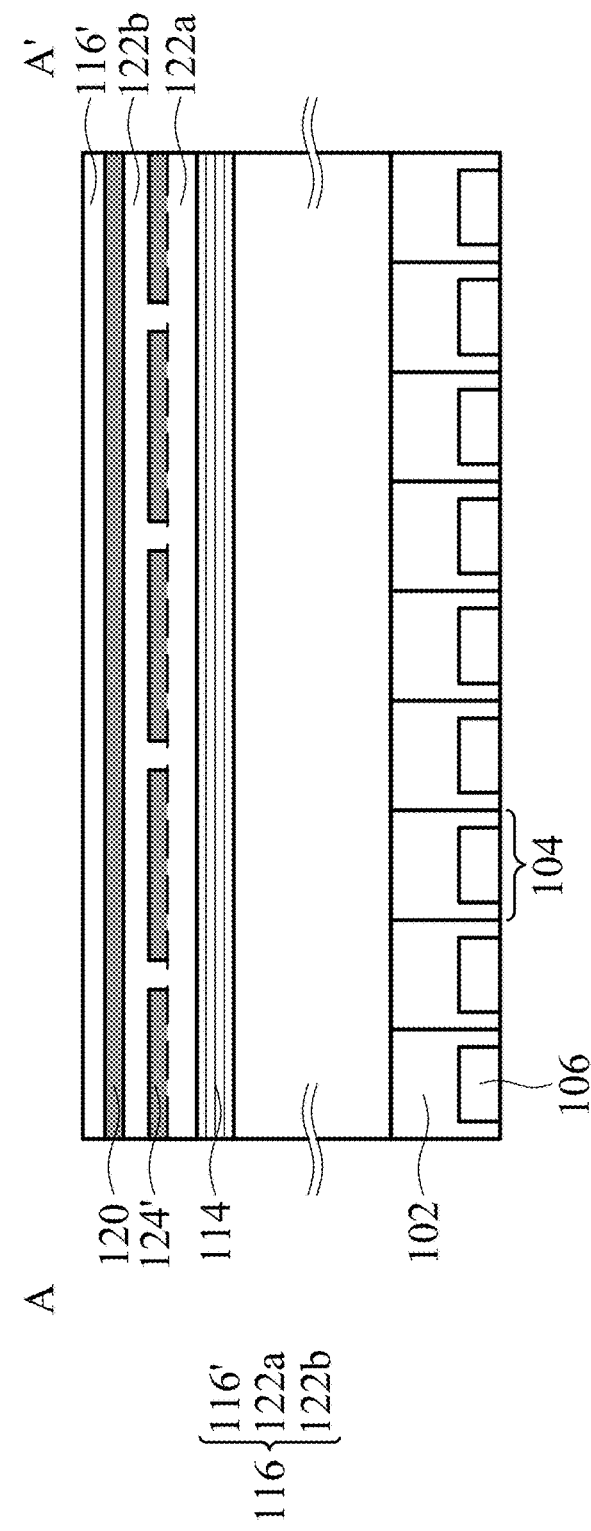

FIGS. 8A-8B illustrate cross-sectional views of forming a biosensor at various stages in accordance with some embodiments of the present disclosure.

FIG. 8A follows the structure of FIG. 7C. Referring to FIG. 8A, the waveguide 120 is formed on the aperture structure 124' as described above. In the embodiment, the waveguide 120 is planar.

Next, referring to FIG. 8B, a sub-immobilization layer 116' is formed on the waveguide 120 as described above. The lower oxidation layer 122a, the upper oxidation layer 122b and the sub-immobilization layer 116' can be considered the immobilization layer 116. As a result, the aperture structure 124' is formed in the immobilization layer 116, and the waveguide 120 is formed on the aperture structure 124'.

It should be understood that the aperture structure and the waveguide can be included in any one of the biosensors described above.

According to the different combinations of filters, the inventive concept is described in detail below.

Aspect 1

Figure 9A:
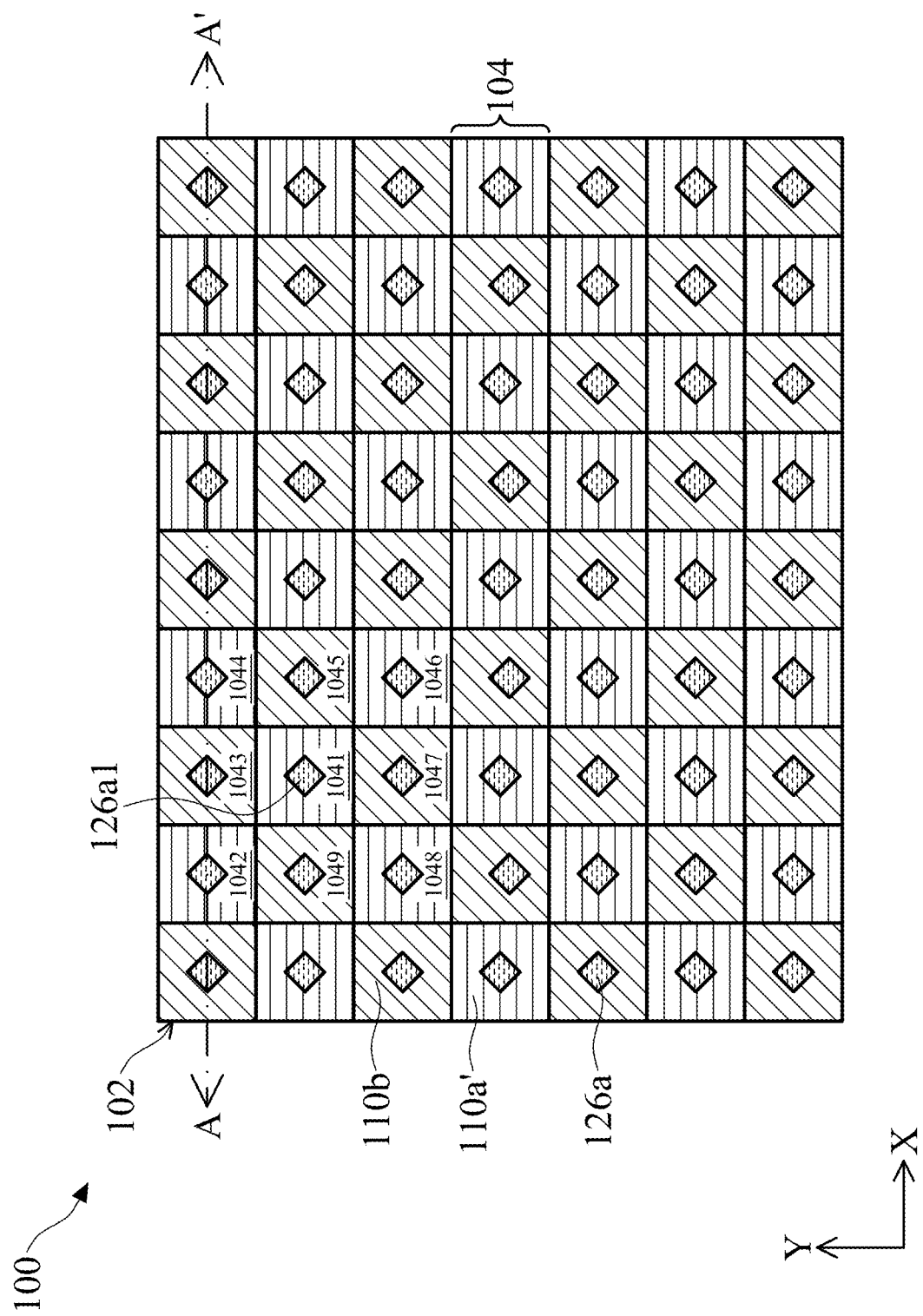
FIG. 9A illustrates an arrangement of analytes on the biosensor.
Figure 9B:
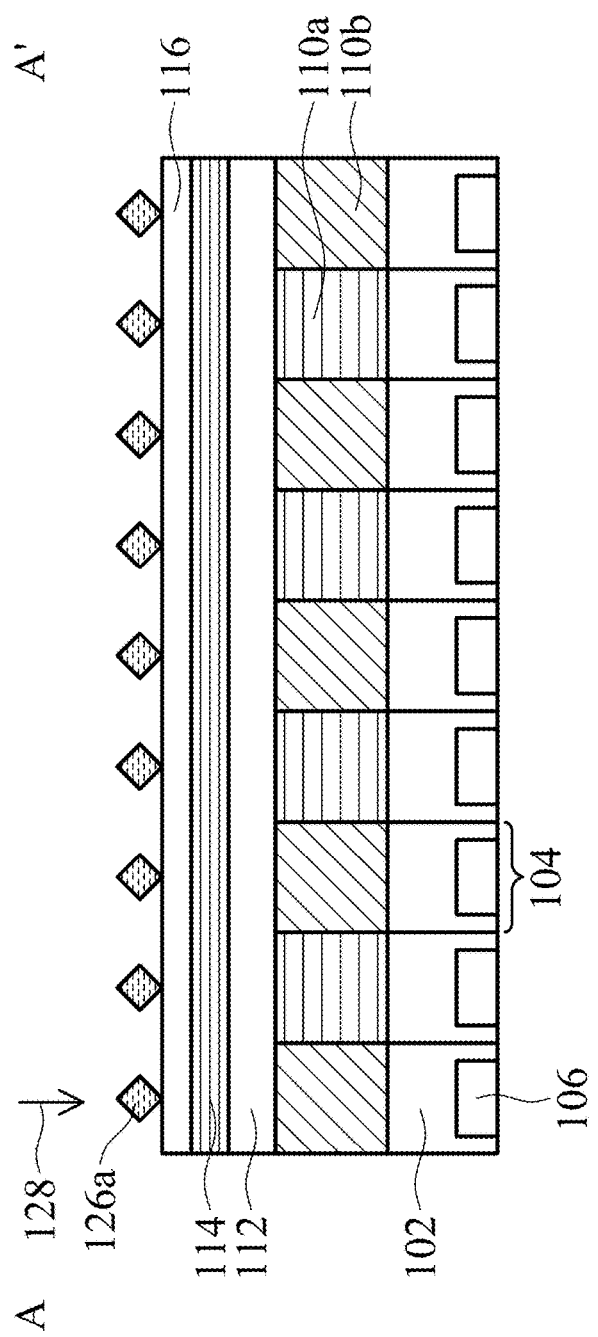
FIG. 9B illustrates a cross-sectional view of FIG. 9A along line A-A'.

In this aspect, the biosensor includes filters that filter light with the same wavelength. FIG. 9A illustrates an arrangement of analytes 126a on the biosensor. FIG. 9B illustrates a cross-sectional view of FIG. 9A along line A-A'. In some embodiments, the biosensor includes the pixelated dielectric interference filters 110a' and the organic color filter 110b, which filter light with the same wavelength. In the embodiment, it is assumed that the light emitted by one analyte can reach the pixels that are one pixel away from the pixel under the light. In other words, the closest eight pixels that surround the pixel under the light. For example, as illustrated in FIG. 9A, the pixel 1041 is under the light emitted by the analyte 126a1, and the pixels 1042-1049 are the pixels that are only one pixel away from the pixel 1041. The light emitted by the analyte 126a1 can reach the pixels 1041-1049.

The analytes 126a are placed on the biosensor. The area of one analyte 126a is equal to or smaller than that of one pixel 104.

An excitation light 128 irradiates the analytes 126a. The excitation light 128 moves from one side of the biosensor 100 to the opposite side so that the analytes 126a will be excited and emit a light in order, but not simultaneously. For example, the excitation light 128 may move along a direction X. In the embodiment, the direction X is the direction from the left side to the right side of the biosensor from the top view, as shown in FIGS. 9A.

Therefore, the analytes 126a may be placed on all the pixels 104, and cross-talk can still be avoided by sequential excitation.

Figure 9C:
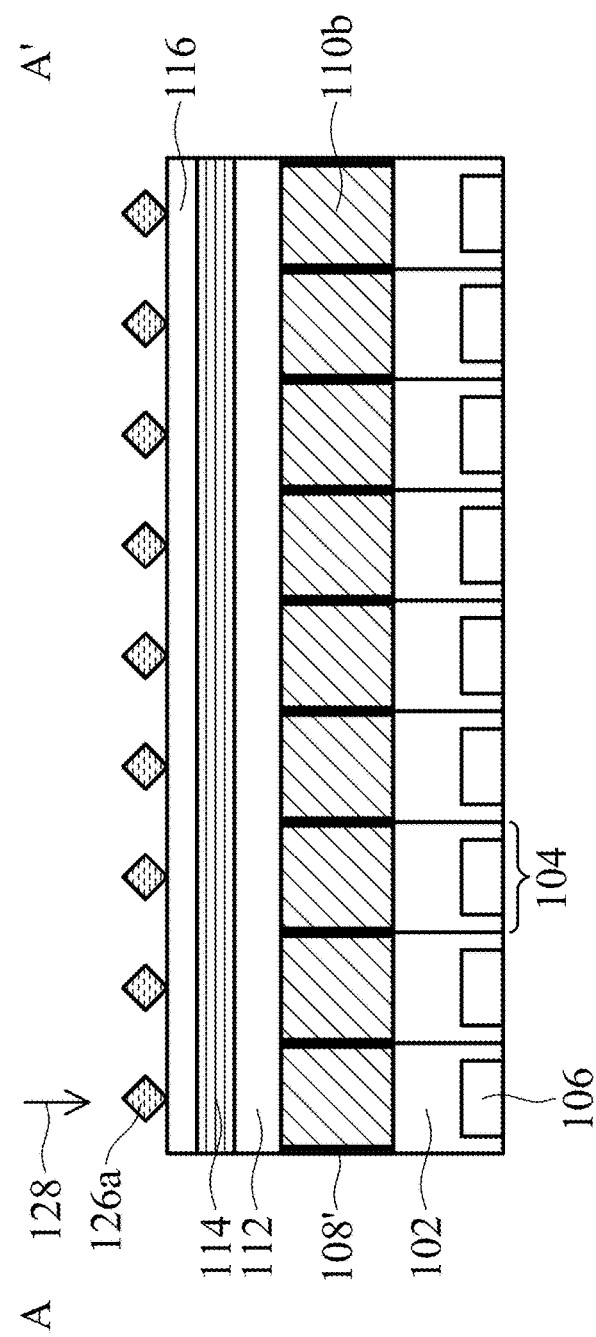
FIG. 9C illustrates a cross-sectional view of FIG. 9A along line A-A' in accordance with other embodiments of the present disclosure.

FIG. 9C illustrates a cross-sectional view of FIG. 9A along line A-A' in accordance with other embodiments of the present disclosure. One of the differences between the embodiments of FIG. 9C and FIG. 9B is that the biosensor of FIG. 9C includes the organic color filters 110b and each of the organic color filters 110b is isolated by the grid wall 108'.

Figure 9D:
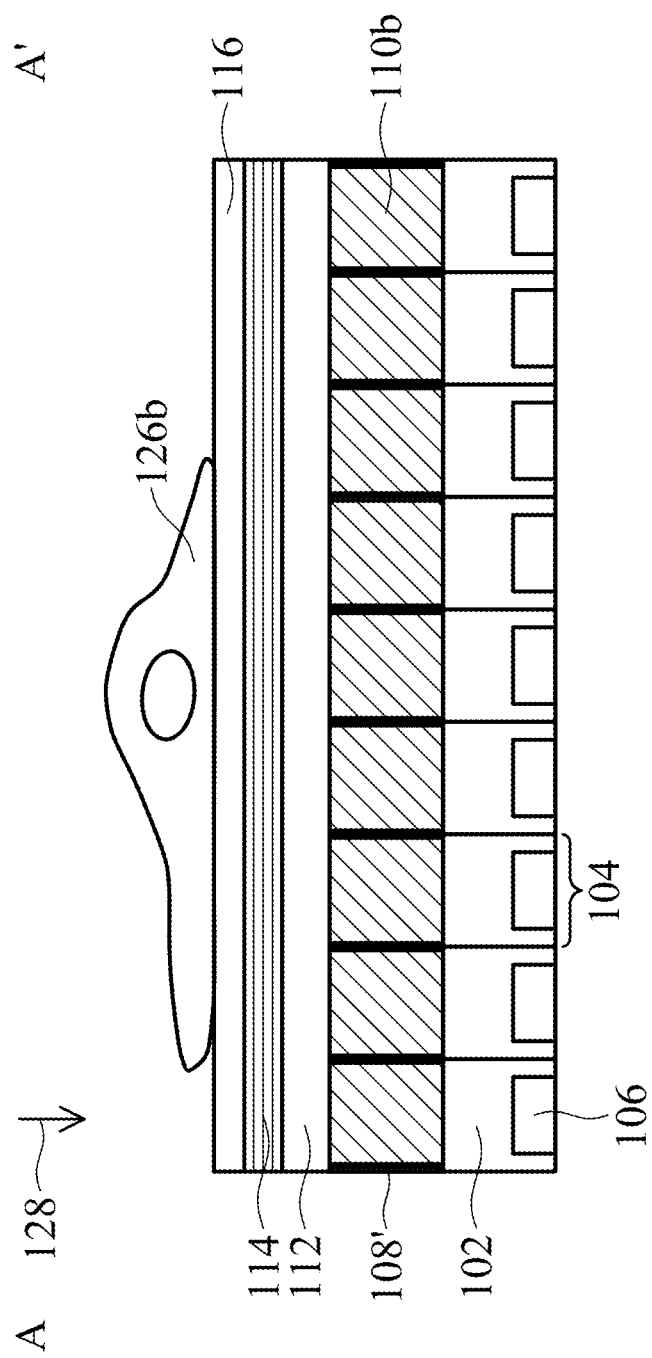
FIG. 9D illustrates a cross-sectional view of a biosensor in accordance with other embodiments of the present disclosure.

FIG. 9D illustrates a cross-sectional view of a biosensor in accordance with other embodiments of the present disclosure. One of the differences between the embodiments of FIG. 9D and FIG. 9C is that the analyte 126b has a greater area than that of one pixel 104. The analyte 126b may be a cell, a tissue, an organ and so on.

Although the analyte 126b has a greater area than that of one pixel 104, it should be understood that the same concept as recited in the embodiment of FIGS. 9A-9C can also be applied to the embodiment of FIG. 9D after reading the following exemplary embodiments, which will not be repeated, for the sake of brevity. Furthermore, the arrangement is merely an example. One of ordinary skill in the art can place the analytes to meet practical needs.

Figure 9E:
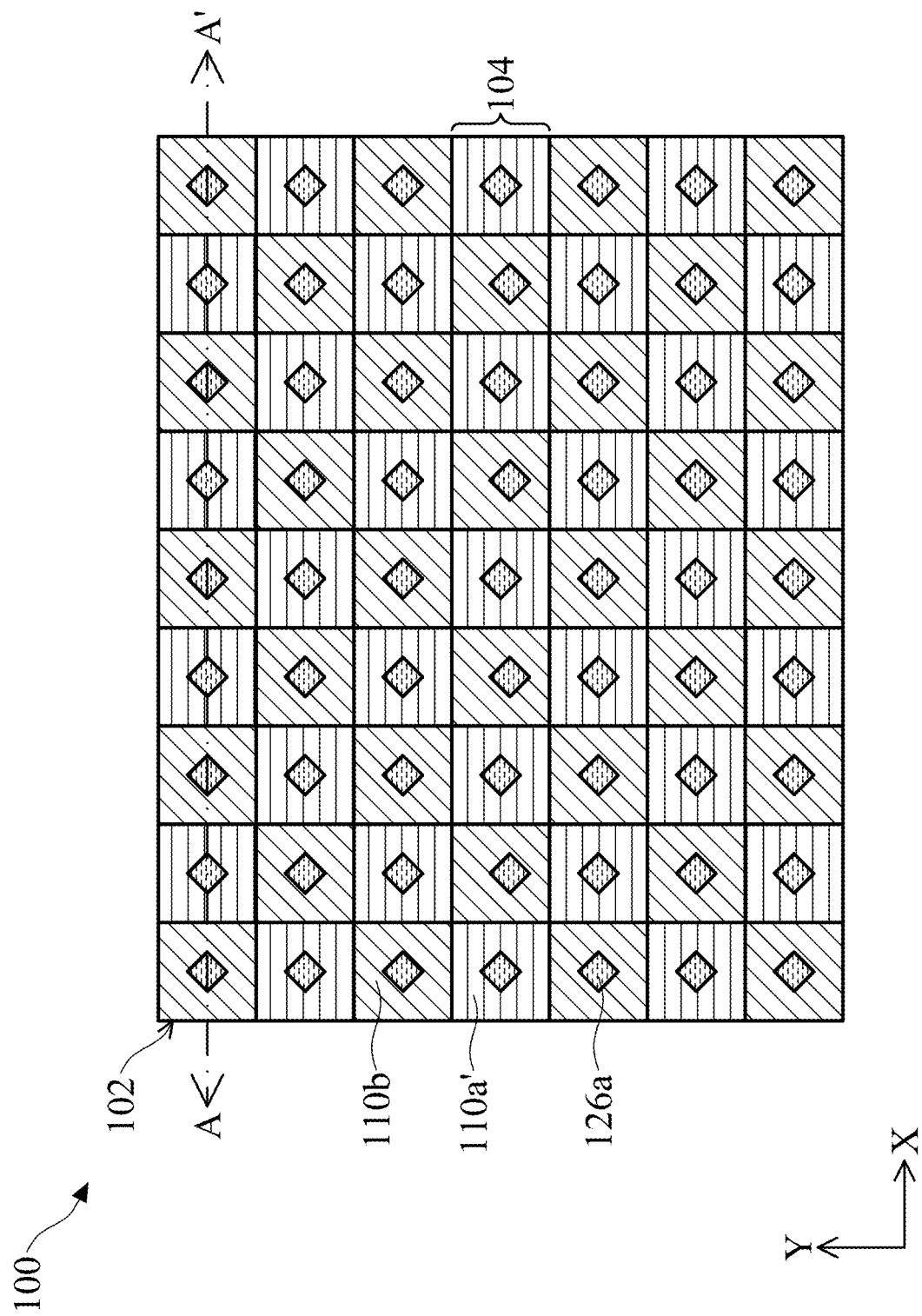
FIG. 9E illustrates a top view of an arrangement of analytes on the biosensor in accordance with some embodiments of the present disclosure.
Figure 9H:
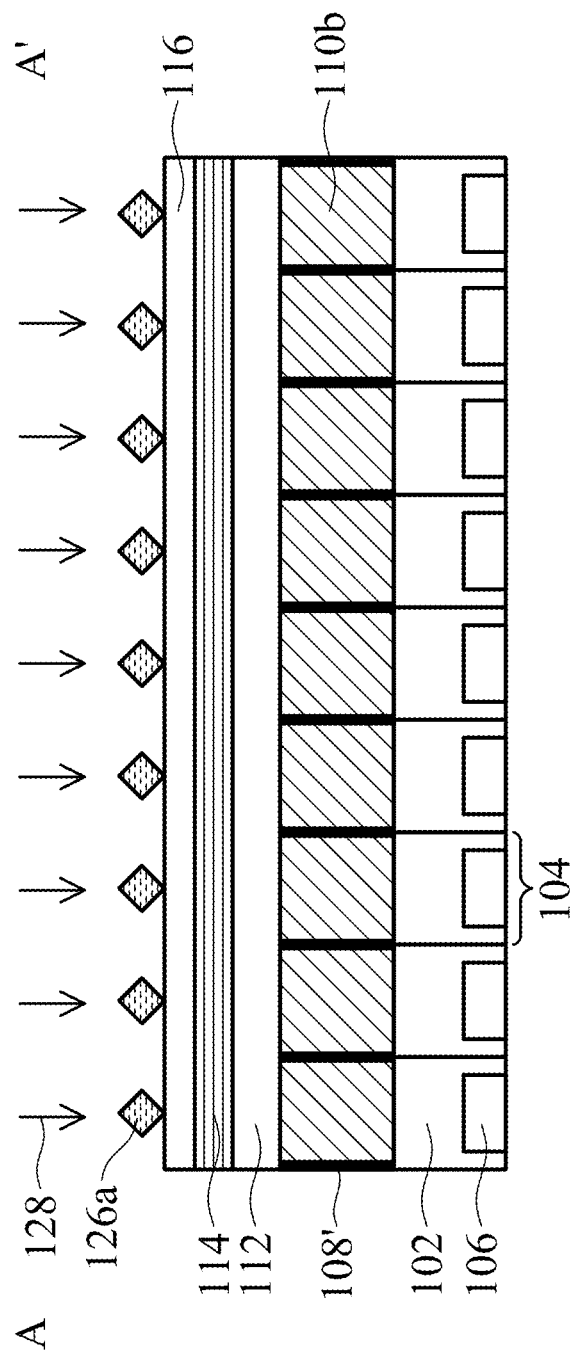
Figure 9I:
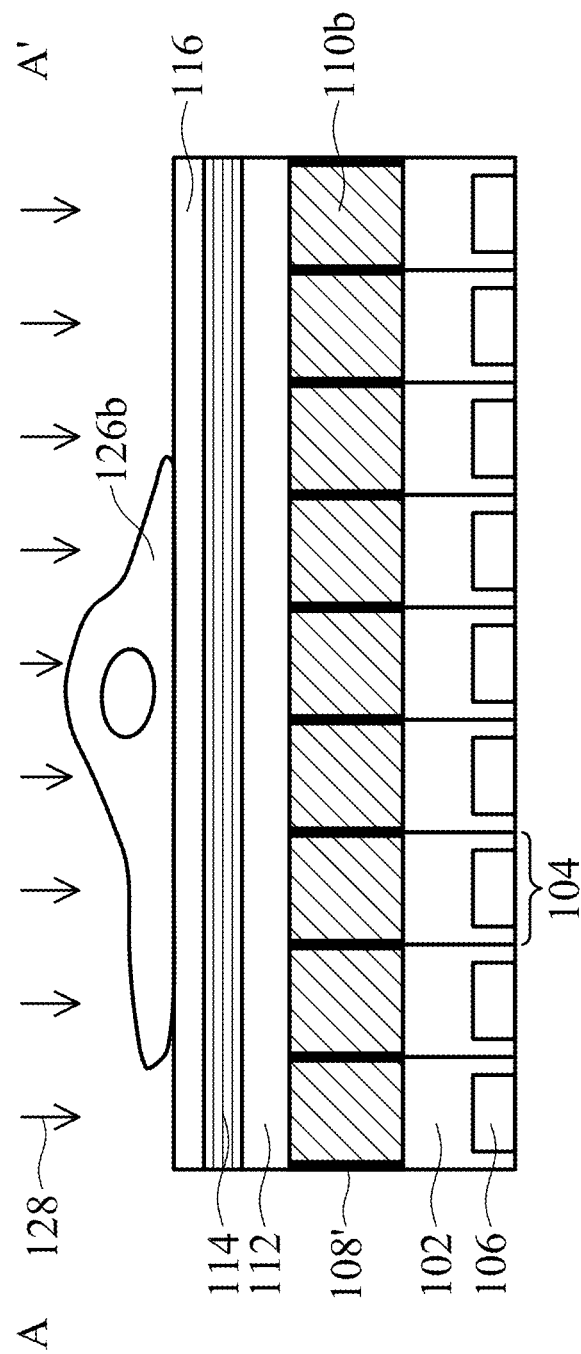

FIG. 9E illustrates a top view of an arrangement of analytes 126a on the biosensor 100 in accordance with some embodiments of the present disclosure. In the embodiments, it is assumed that the light emitted by one analyte can only reach the pixel that is right under the light. FIGS. 9F-9I illustrates cross-sectional views of FIG. 9E along line A-A' in accordance with some embodiments of the present disclosure.

One of the differences between the embodiments of FIGS. 9E-9I and FIGS. 9A-9D is that the analytes 126a or the analyte 126b are irradiated by the excitation light 128 at the same time.

Although the analytes 126a or the analyte 126b are irradiated by the excitation light 128 at the same time, it should be understood that the same concept as recited in the embodiment of FIGS. 9A-9D can also be applied to the embodiment of FIGS. 9E-9I after reading the following exemplary embodiments, which will not be repeated, for the sake of brevity. Furthermore, the arrangement is merely an example. One of ordinary skill in the art can place the analytes to meet practical needs.

Figure 9J:
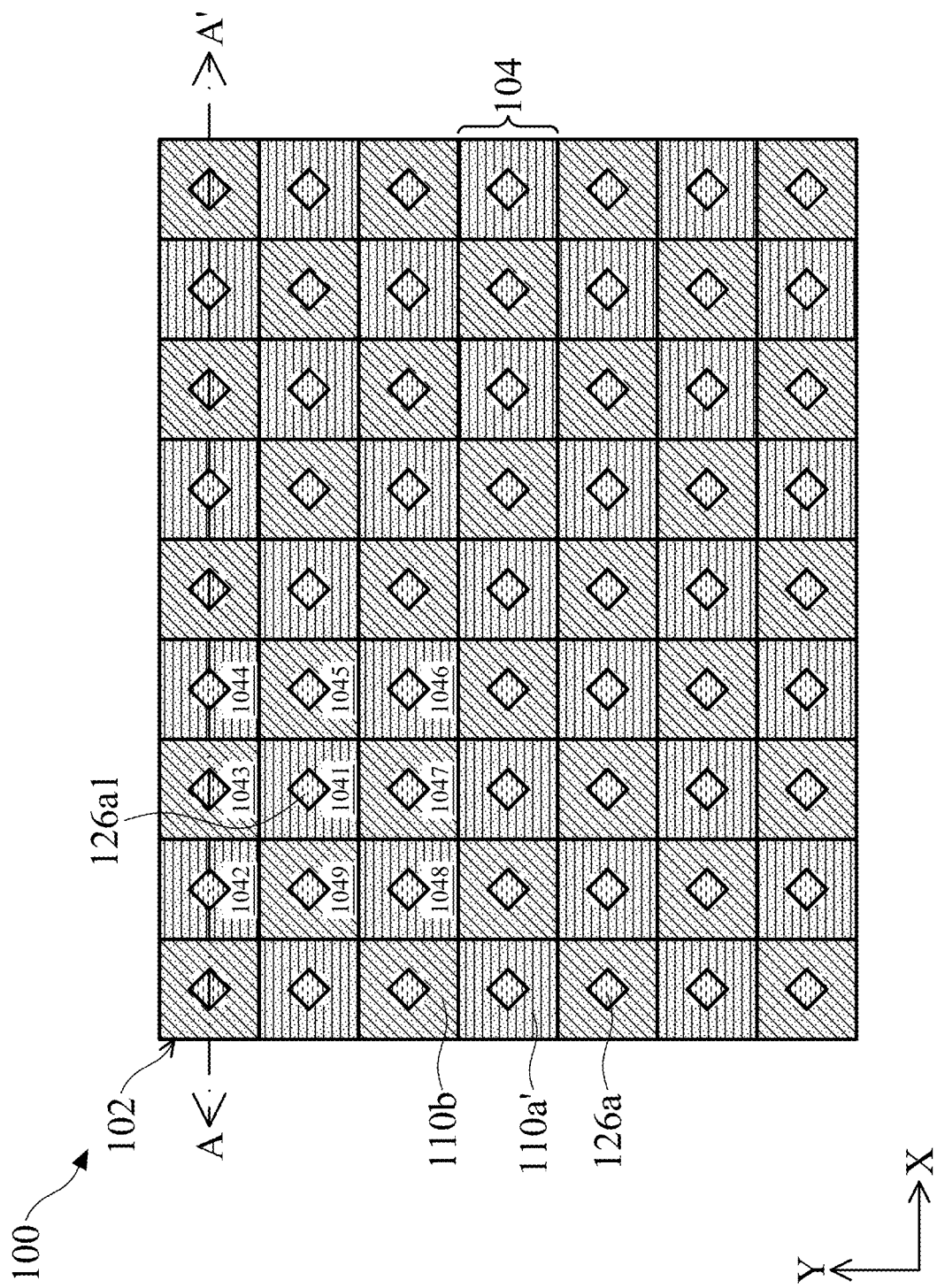
FIG. 9J illustrates a top view of an arrangement of analytes on the biosensor in accordance with some embodiments of the present disclosure.

FIG. 9J illustrates a top view of an arrangement of analytes 126a on the biosensor 100 in accordance with some embodiments of the present disclosure. In some embodiments, the biosensor 100 includes the pixelated dielectric interference filters 110a' and the organic color filter 110b, which filter light with the same wavelength. In the embodiment, it is assumed that the light emitted by one analyte can reach the pixels that are one pixel away from the pixel under the light, as previously described in FIG. 9A. FIGS. 9K-9L illustrates cross-sectional views of FIG. 9J along line A-A' in accordance with some embodiments of the present disclosure.

One of the differences between the embodiments of FIGS. 9J-9L and FIGS. 9A-9I is that the biosensor of FIGS. 9J-9L includes the aperture structure 124'. The analytes 126a or the analyte 126b are irradiated by the excitation light 128 at the same time.

As illustrated in FIG. 9J-9L, the aperture structure 124' includes openings that correspond to one analyte 126a, respectively, so that the light can be further controlled to irradiate only certain areas of the substrate 102. For example, as shown in FIG. 9K, no pixel 104 is irradiated by the lights L emitted by two separate analytes 126a at the same time. As a result, cross-talk is avoided.

Although the biosensors of FIGS. 9J-9L include the aperture structure 124', it should be understood that the same concept as recited in the embodiment of FIGS. 9A-9I can also be applied to the embodiments of FIGS. 9J-9L, which will not be repeated, for the sake of brevity.

It is described below how the biosensors of FIGS. 9A-9L are used.

According to the aforementioned biosensors, a light can be distinguished. For example, if a signal is obtained, the signal is defined as Pass. Then, it can be learned that the analytes 126a or the analyte 126b emit a desired light. If no signal is obtained, the signal is defined as No. Then, it can be learned that the analytes 126a or the analyte 126b do not emit the desired light or do not emit light.

Aspect 2

Figure 10A:
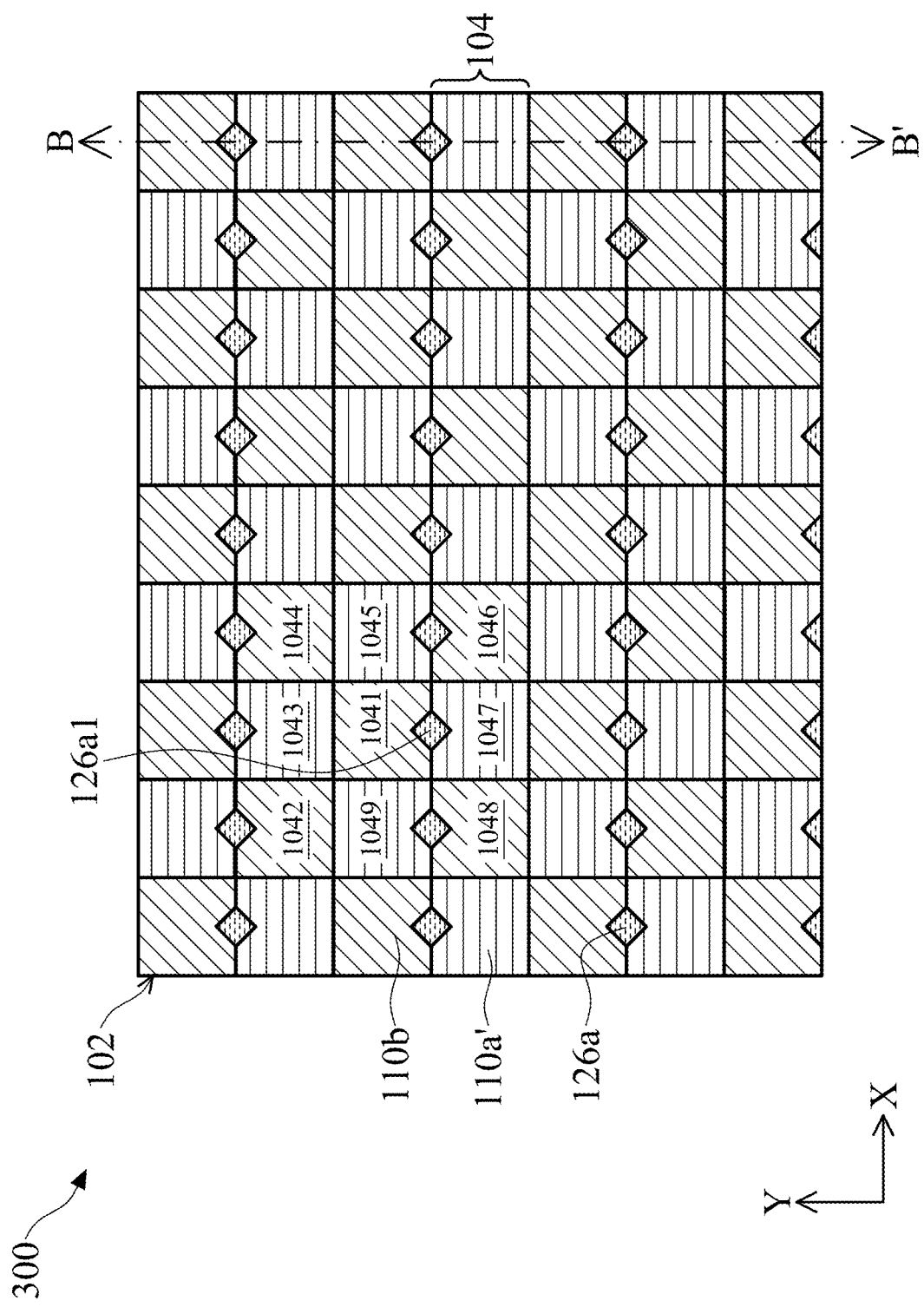
FIG. 10A illustrates an arrangement of analytes on the biosensor in accordance with some embodiments of the present disclosure.
Figure 10B:
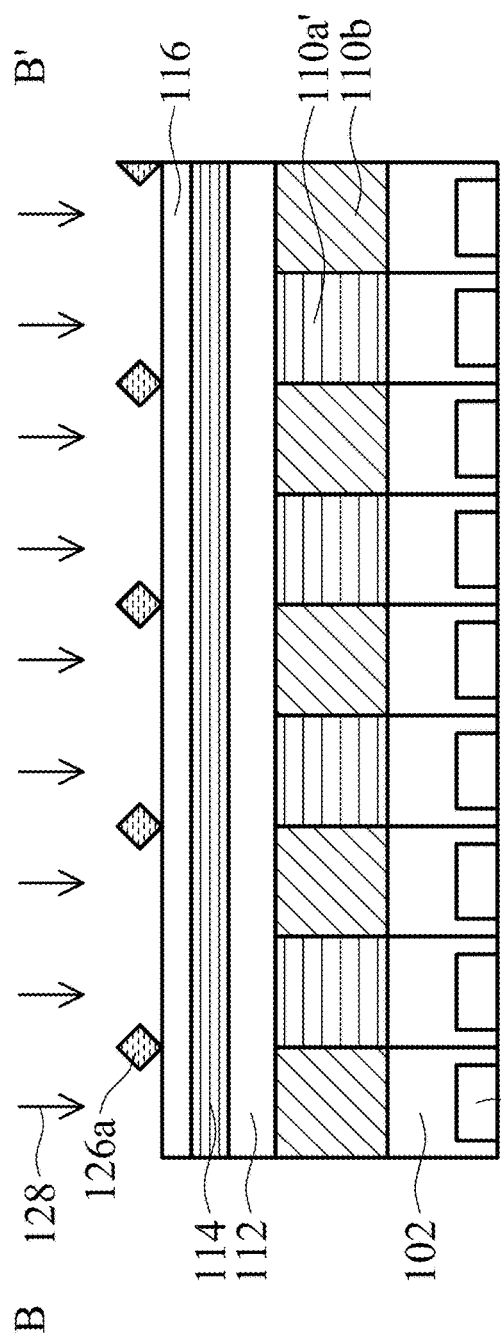
FIG. 10B illustrates a cross-sectional view of FIG. 10A along line B-B' in accordance with some embodiments of the present disclosure.

In the aspect, the biosensor includes two kinds of filters that filter the lights with different wavelengths, respectively. FIG. 10A illustrates an arrangement of analytes 126a on the biosensor 300. FIG. 10B illustrates a cross-sectional view of FIG. 10A along line B-B'. In some embodiments, the biosensor includes the pixelated dielectric interference filters 110*a*' and the organic color filters 110*b*, in which the pixelated dielectric interference filters 110*a*' filter one kind of light and the organic color filters 110*b* filter another kind of light. In the embodiment, it is assumed that the light emitted by one analyte can reach the closest six pixels that surround the light. For example, as illustrated in FIG. 10A, the light emitted by the analyte 126*a*1 can reach the pixels 1041, 1045, 1046, 1047, 1048 and 1049.

The excitation light 128 irradiates the analytes 126*a*. The excitation light 128 moves from one side of the biosensor 300 to the opposite side so that the analytes 126*a* will be excited and emit a light in order, but not simultaneously. For example, the excitation light 128 may move along a direction X. In the embodiment, the direction X is the direction from the left side to the right side of the biosensor 300 from the top view, as shown in FIGS. 10A.

As a result, the analytes 126*a* are placed on the biosensor as illustrated in FIG. 10A to avoid cross-talk.

Figure 10C:
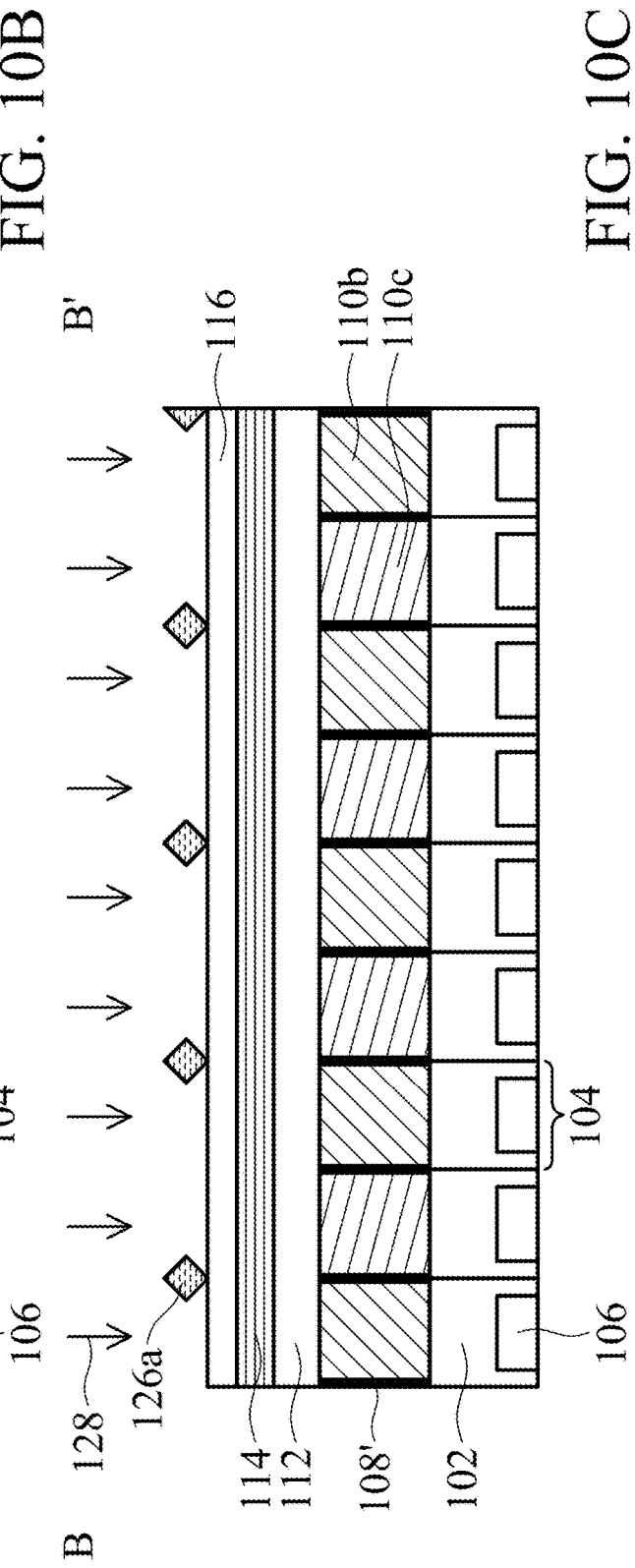
FIG. 10C illustrates a cross-sectional view of FIG. 10A along line B-B' in accordance with some embodiments of the present disclosure.

FIG. 10C illustrates a cross-sectional view of FIG. 10A along line B-B' in accordance with other embodiments of the present disclosure. One of the differences between the embodiments of FIG. 10C and FIG. 10B is that the biosensor of FIG. 10C includes the organic color filters 110*b* and organic color filters 110*c* and each of the organic color filters 110*b* and the organic color filters 110*c* is isolated by the grid wall 108'. The organic color filters 110*b* filter one kind of light and the organic color filters 110*c* filter another kind of light.

Figure 10D:
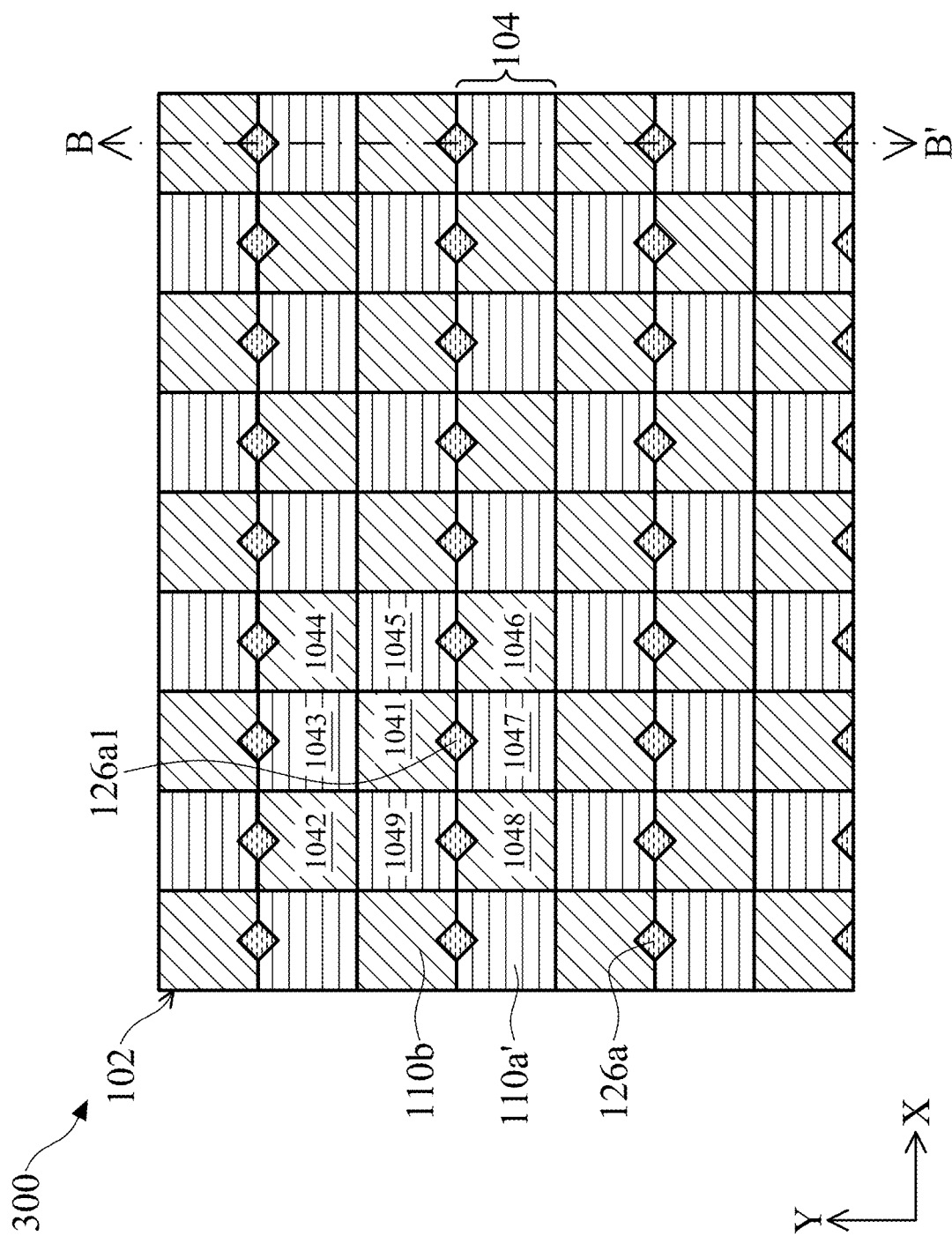
FIG. 10D illustrates a top view of an arrangement of analytes on the biosensor in accordance with some embodiments of the present disclosure.
Figure 10E:
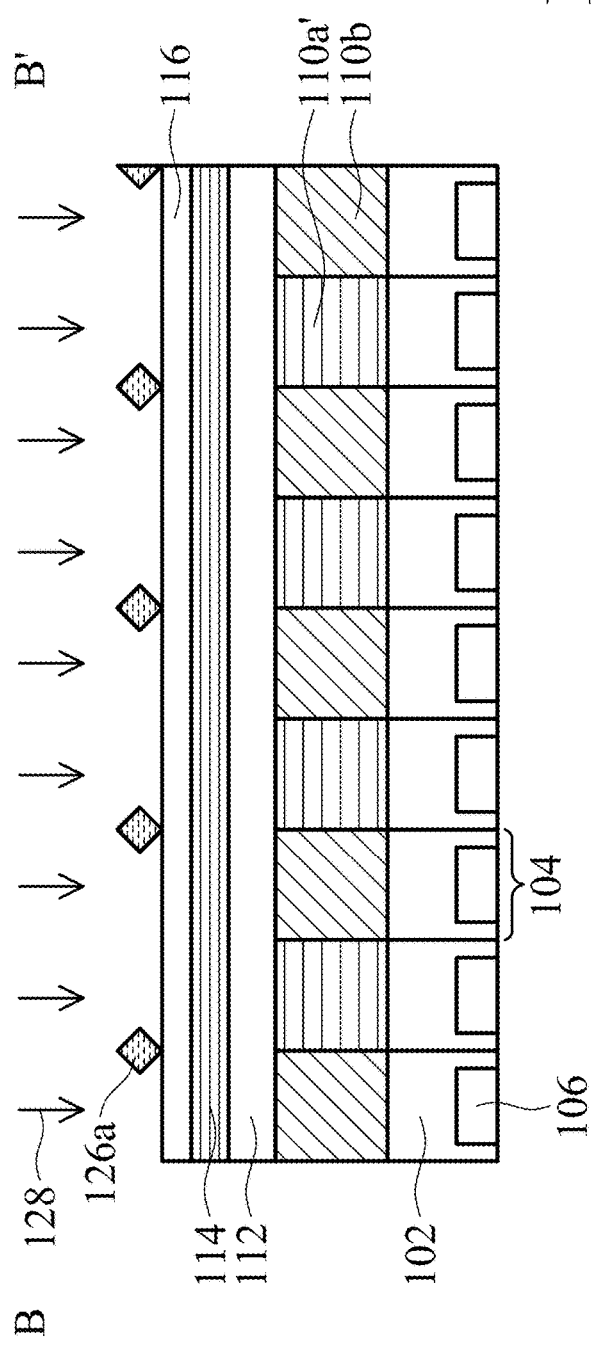
FIGS. 10E-10F illustrate cross-sectional views of FIG. 10D along line B-B' in accordance with some embodiments of the present disclosure.
Figure 10F:
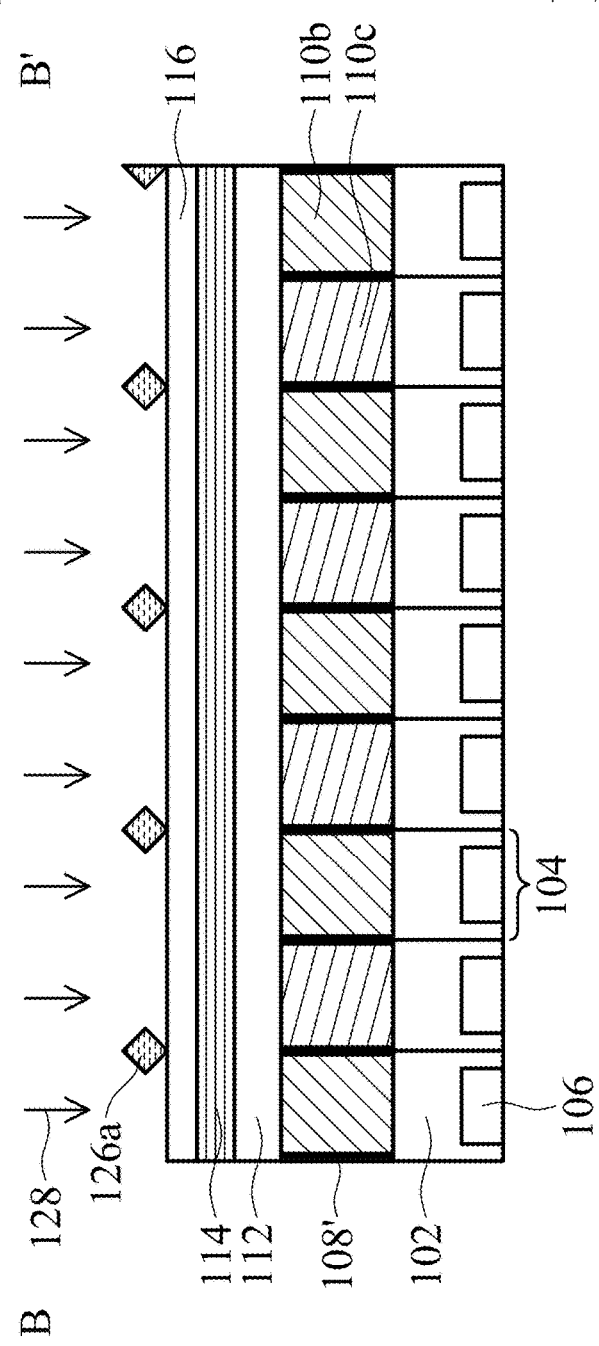

FIG. 10D illustrates a top view of an arrangement of analytes 126*a* on the biosensor in accordance with some embodiments of the present disclosure. In the embodiment, it is assumed that the light emitted by one analyte can reach the closest six pixels that surround the light, as previously described in FIG. 10A. FIGS. 10E and 10F illustrate cross-sectional views of FIG. 10D along line B-B' in accordance with some embodiments of the present disclosure.

One of the differences between the embodiments of FIGS. 10D-10F and FIGS. 10A-10C is that the analytes 126*a* or the analyte 126*b* are irradiated by the excitation light 128 at the same time.

Although the analytes 126*a* or the analyte 126*b* are irradiated by the excitation light 128 at the same time, it should be understood that the same concept as recited in the embodiment of FIGS. 10A-10C can also be applied to the embodiment of FIGS. 10D-10F after reading the following exemplary embodiments, which will not be repeated, for the sake of brevity. Furthermore, the arrangement is merely an example. One of ordinary skill in the art can place the analytes to meet practical needs.

Figure 10G:
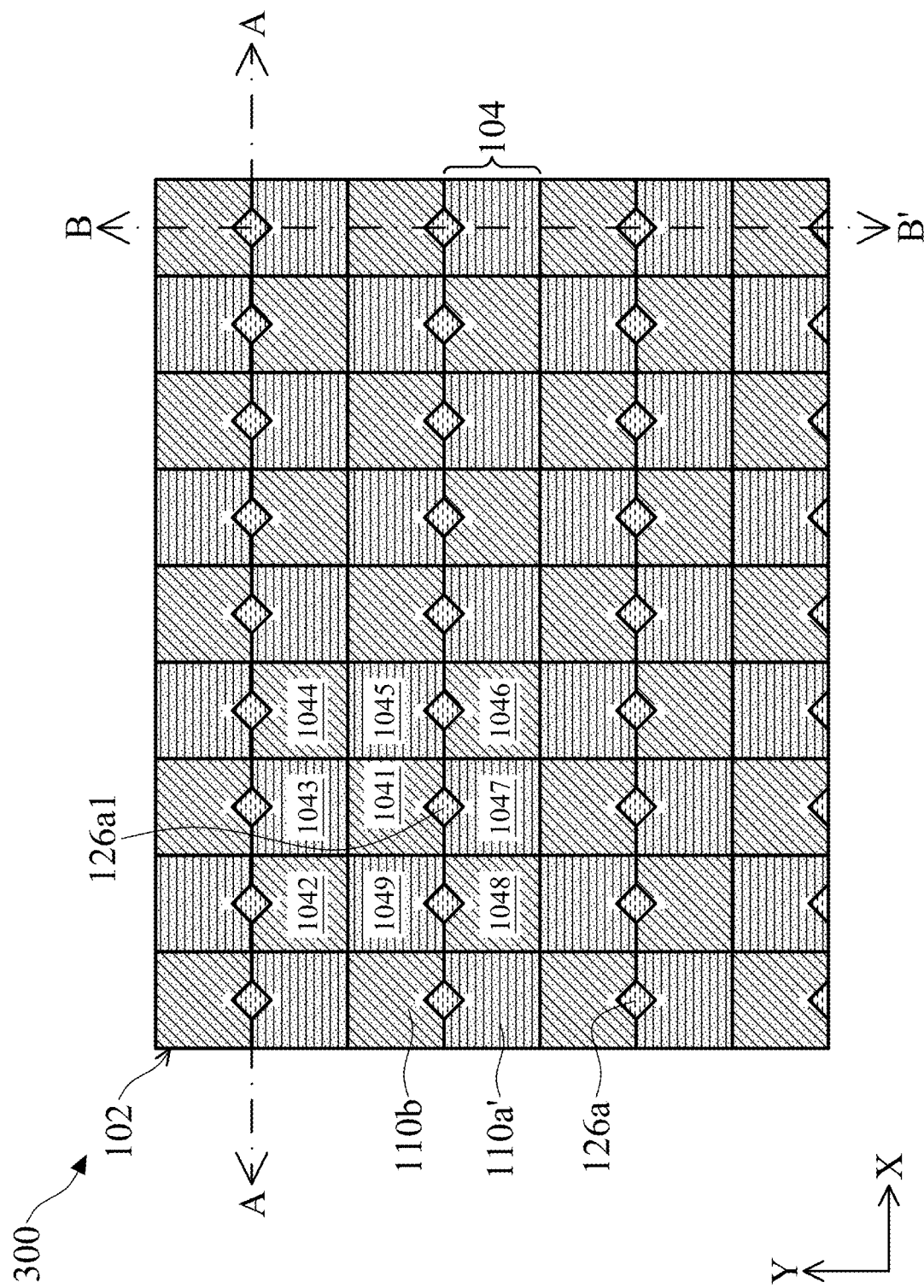
FIG. 10G illustrates a top view of an arrangement of analytes on the biosensor in accordance with some embodiments of the present disclosure.

FIG. 10G illustrates a top view of an arrangement of analytes 126*a* on the biosensor in accordance with some embodiments of the present disclosure. In the embodiment, it is assumed that the light emitted by one analyte can reach the closest six pixels that surround the light, as previously described in FIG. 10A. FIGS. 10H and 10I illustrate cross-sectional views of FIG. 10G along line A-A' and B-B' in accordance with some embodiments of the present disclosure, respectively.

One of the differences between the embodiments of FIGS. 10G-10I and FIGS. 10A-10F is that the biosensor of FIGS. 10G-10I includes the aperture structure 124'. The analytes 126*a* or the analyte 126*b* are irradiated by the excitation light 128 at the same time.

As illustrated in FIGS. 10G-10I, the aperture structure 124' includes openings that correspond to one analyte 126*a*, respectively, so that the light can be further controlled to irradiate only certain areas of the substrate 102. As shown in FIGS. 10H and 10I, no pixel 104 is irradiated by the lights L emitted by two separate analytes 126*a* at the same time. As a result, cross-talk is avoided.

Although the biosensors of FIGS. 10G-10I include the aperture structure 124', it should be understood that the same concept as recited in the embodiment of FIGS. 10A-10F can also be applied to the embodiments of FIGS. 10G-10I, which will not be repeated, for the sake of brevity.

It is described below how the biosensors of FIGS. 10A-10I are used.

According to the aforementioned biosensors, a light can be distinguished. For example, if a signal is obtained, the signal is defined as Pass. Then, it can be learned that the analytes 126*a* or the analyte 126*b* emit a desired light. If no signal is obtained, the signal is defined as No. Then, it can be learned that the analytes 126*a* or the analyte 126*b* do not emit the desired light or do not emit light.

Figure 11:
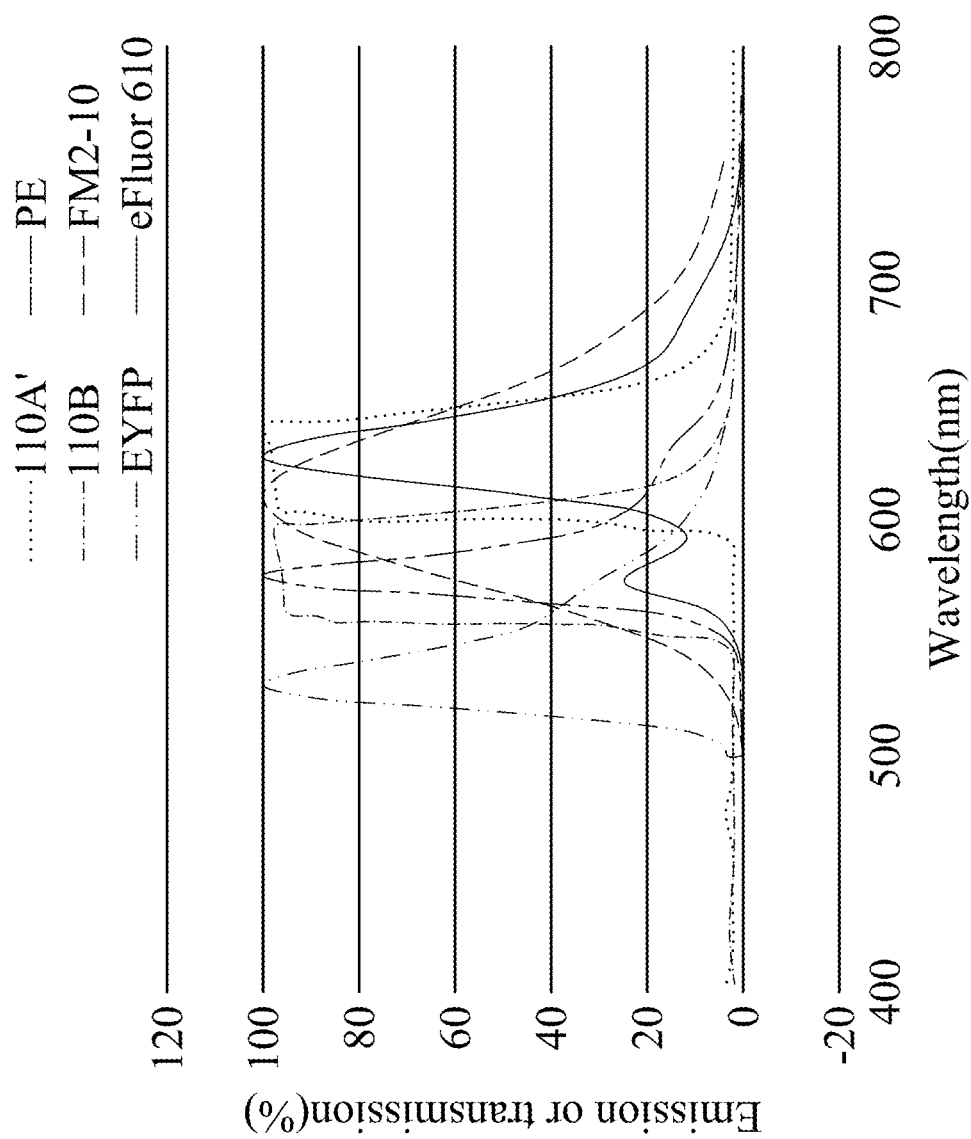
FIG. 11 is an analytical graph of emission or transmission versus wavelength in accordance with some embodiments of the present disclosure.

FIG. 11 is an analytical graph of emission or transmission versus wavelength in accordance with some embodiments of the present disclosure. 110A' represents the wavelength of the light that can pass the pixelated dielectric interference filters 110*a*'. 110B represents the wavelength of the light that can pass the organic color filter 110*b*. EYFP, PE, FM2-10 and eFluor 610 are four dyes that emit four different lights. A first signal intensity of the light L is obtained from the pixel 104 under the pixelated dielectric interference filters 110*a*'. A second signal intensity of the light L is obtained from the pixel 104 under the organic color filter 110*b*. The overlapping area between the area under curve (AUC) of 110A' and the AUC of EYFP represents the first signal intensity of EYFP while the overlapping area between the AUC of 110B and the AUC of EYFP represents the second signal intensity of EYFP. For the same concept, PE, FM2-10 and eFluor 610 have first signal intensities and second signal intensities. A first threshold can be set for the first signal intensities. A second threshold can be set for the second signal intensities. The first signal intensities are defined as Pass or No, depending on whether the first signal intensities are higher or lower than the first threshold, respectively. For example, when the first signal intensity of EYFP is higher than the first threshold, the first signal intensity of EYFP is defined as Pass. When the first signal intensity of EYFP is lower than the first threshold, the first signal intensity of EYFP is defined as No. The second signal intensities are defined as described above.

The first threshold and the second threshold may be set according to actual situations. Table 1 below is made according to the concept described above and in FIG. 11, in which the first signal intensity is denoted by 110*a*' and the second signal intensity is denoted by 110*b*.

TABLE 1

| dye | 110a' | 110b |
| --- | --- | --- |
| EYFP | No | No |
| PE | No | Pass |
| FM2-10 | Pass | Pass |
| eFluor 610 | Pass | No |

According to a combination of the definitions of the first signal intensity and the second signal intensity, the four dyes can be distinguished. For example, the first signal intensity of EYFP is defined as No and the second signal intensity of EYFP is defined as No. As a result, if the combination of the definitions of the first signal intensity and the second signal intensity is No and No, respectively, it can be learned that the light is emitted by EYFP. For the same concept as described above, a dye can be distinguished.

Alternatively, signal intensity ratios of the first signal intensities to the second signal intensities (denoted by 110a'/110b) can also be calculated to distinguish the four different dyes, namely four different lights.

The signal intensity ratio of 110a'/110b is defined as H or L depending on whether the signal intensity ratio is higher or lower than a predetermined ratio. Then, in the groups which are defined as H, the first signal intensities are defined as H or L depending on whether the first signal intensity is higher or lower than a first threshold, or the second signal intensities are defined as H or L depending on whether the second signal intensity is higher or lower than a second threshold. Then, for the same concept described above can also be applied to the groups which are defined as L.

Table 2 below is made according to the concept described above and FIG. 11, in which the first signal intensity is denoted by 110a', the second signal intensity is denoted by 110b, and the signal intensity ratio is denoted by 110a'/110b.

TABLE 2

| dye | 110b | 110a' | 110a'/110b |
|---|---|---|---|
| EYFP | 0.1 (L) | 0.02 | 0.2 (L) |
| PE | 0.4 (H) | 0.1 | 0.25 (L) |
| FM2-10 | 1 (H) | 1 | 1 (H) |
| eFluor 610 | 0.1 (L) | 0.5 | 5 (H) |

According to the definition of the signal intensity ratio of 110a'/110b and the definition of the first signal intensity or the second signal intensity, the four dyes can be distinguished. For example, the signal intensity ratio of 110a'/110b of EYFP and the signal intensity ratio of 110a'/110b of PE are lower than the predetermined ratio, and the signal intensity ratio of 110a'/110b of EYFP and the signal intensity ratio of 110a'/110b of PE are defined as L. The signal intensity ratio of 110a'/110b of FM2-10 and the signal intensity ratio of 110a'/110b of eFluor 610 are higher than the predetermined ratio, and the signal intensity ratio of 110a'/110b of FM2-10 and the signal intensity ratio of 110a'/110b of eFluor 610 are defined as H. There are two first thresholds, one of the first thresholds is set for Group L, and the other first threshold is set for Group H. Then in Group L, the second signal intensity of EYFP is lower than the first threshold and the second signal intensity of EYFP is defined as L. The second signal intensity of PE is higher than the first threshold and the second signal intensity of PE is defined as H. In Group H, the second signal intensity of FM2-10 is higher than the other first threshold and the second signal intensity of FM2-10 is defined as H. The second signal intensity of eFluor 610 is lower than the other first threshold and the second signal intensity of eFluor 610 is defined as L.

As a result, if the definition of the signal intensity ratio of 110a'/110b is L and the definition of the second signal intensity is L, it can be learned that the light is emitted by EYFP. For the same concept as described above, a dye can be distinguished.

Aspect 3

Figure 12A:
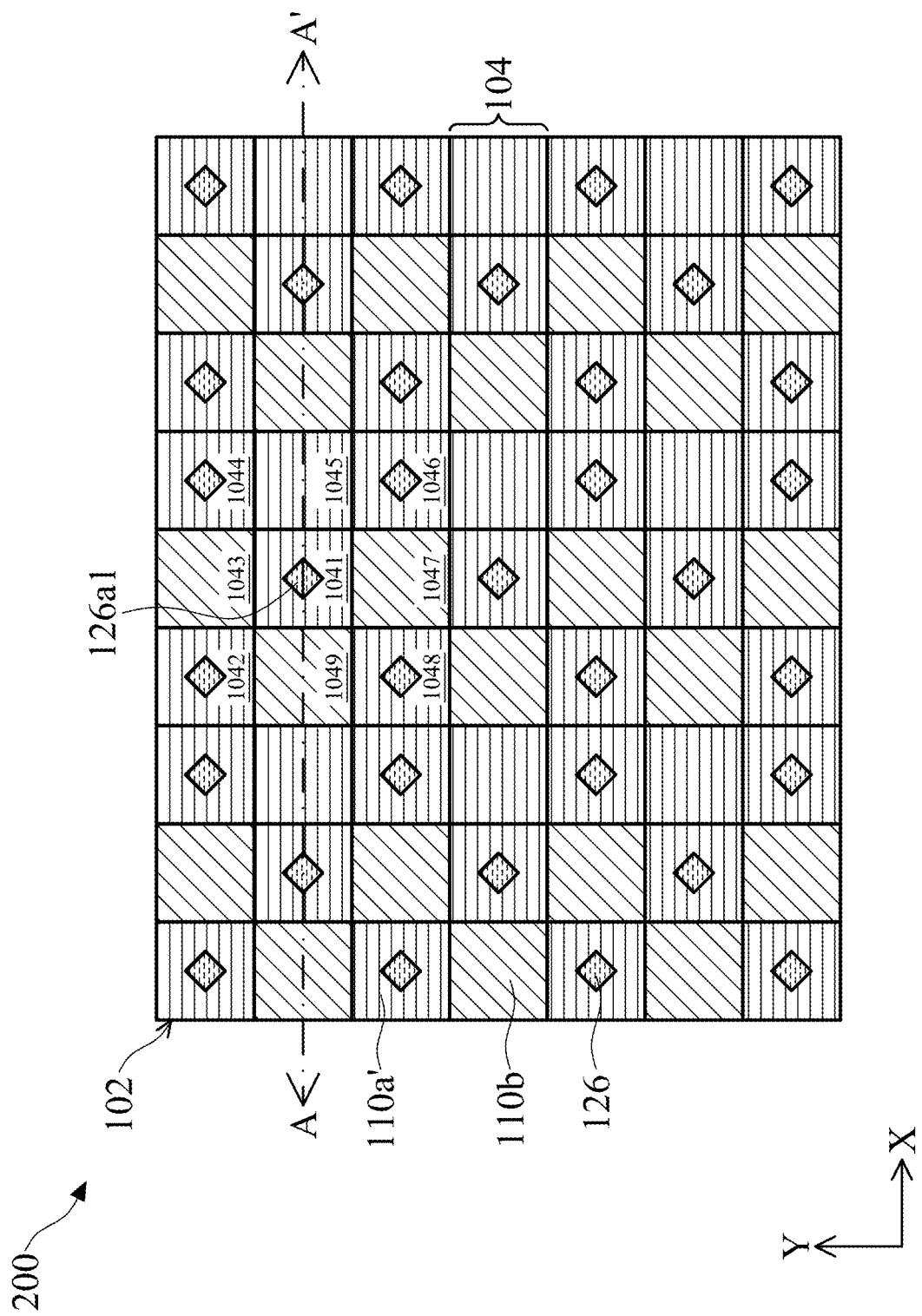
FIG. 12A illustrates an arrangement of analytes on the biosensor in accordance with some embodiments of the present disclosure.
Figure 12B:
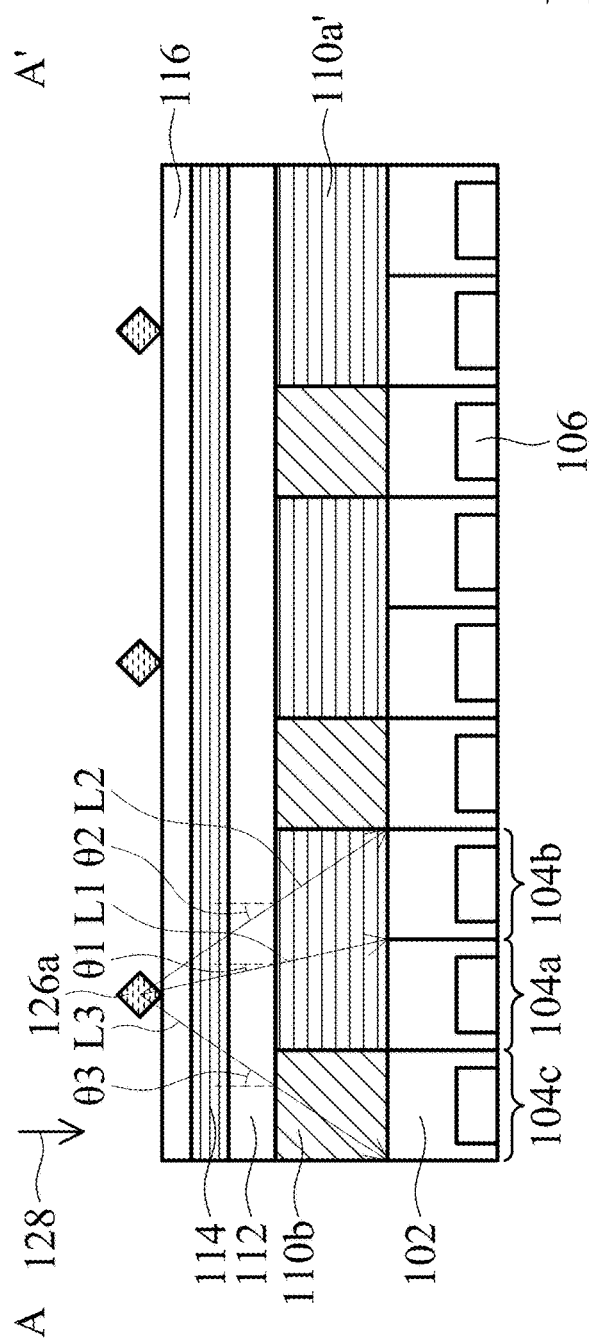
FIG. 12B illustrates a cross-sectional view of FIG. 12A along line A-A' in accordance with some embodiments of the present disclosure.
Figure 12C:
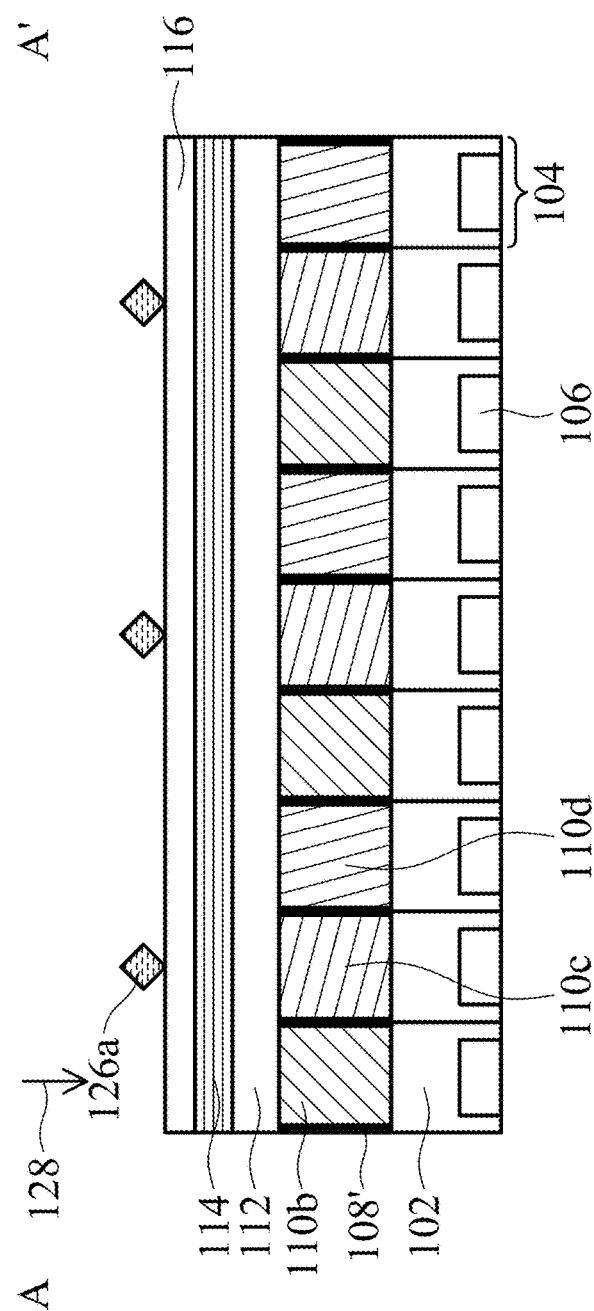
FIG. 12C illustrates a cross-sectional view of FIG. 12A along line A-A' in accordance with other embodiments of the present disclosure.

In the aspect, the biosensor includes three kinds of filters that filter the lights with different wavelengths, respectively. For example, the biosensor includes organic color filters 110b, organic color filter 110c and organic color filter 110d, as shown in FIG. 12C. Alternatively, the biosensor may include the pixelated dielectric interference filters 110a' and the organic color filters 110b, as shown in FIG. 12B. In the aspect, the pixelated dielectric interference filters 110a' are manufactured to filter only one kind of light. However, since dielectric interference filters 110a' are inherently angle-sensitive, when light enters the dielectric interference filters 110a' at a large incident angle, the phenomenon of spectrum-shift occurs. As a result, the pixelated dielectric interference filters 110a' can actually filter more than one kind of light. FIG. 12A illustrates an arrangement of analytes 126a on the biosensor. FIG. 12B illustrates a cross-sectional view of FIG. 12A along line A-A'. In the embodiment, it is assumed that the light emitted by one analyte can reach the pixels that are one pixel away from the pixel under the light. In other words, the closest eight pixels that surround the pixel under the light, as previously described in FIG. 9A.

As shown in FIG. 12A, the organic color filters 110b are separated by two pixels that are covered by the pixelated dielectric interference filters 110a' in a direction X, and the organic color filters 110b are separated by one pixel that is covered by the pixelated dielectric interference filters 110a' in a direction Y perpendicular to the direction X.

The excitation light 128 (see FIG. 12B) irradiates the analytes 126a or 126b (not shown). The excitation light 128 moves from one side of the biosensor 200 to the opposite side so that the analyte 126a will be excited and emit a light L in order, but not simultaneously. For example, the excitation light 128 may move along the direction X. In the embodiment, the direction X is the direction from the left side to the right side of the biosensor from the top view, as shown in FIG. 12A.

Referring to FIG. 12B, the analytes 126a are excited by the excitation light 128 and emit a light L. A first portion L1 of the light L enters the pixelated dielectric interference filters 110a' at a first incident angle θ1. The first incident angle θ1 is an angle between the first portion L1 of the light L and the normal line of the substrate 102. A pixel that receives the first portion L1 of the light L is a first pixel 104a.

A second portion L2 of the light L enters the pixelated dielectric interference filters 110a' at a second incident angle θ2. The second incident angle θ2 is an angle between the second portion L2 of the light L and the normal line of the substrate 102. The first incident angle θ1 is smaller than the second incident angle θ2. A pixel that receives the second portion L2 of the light L is a second pixel 104b.

A third portion L3 of the light L enters the organic color filters 110b at a third incident angle θ3. The third incident angle θ3 is angle between the third portion L3 of the light L and the normal line of the substrate 102. A pixel that receives the third portion L3 of the light L is a third pixel 104c.

In some embodiments, the first incident angle θ1 is from 0 degrees to 40 degrees, the second incident angle θ2 is from 20 degrees to 70 degrees, and the third incident angle θ3 is from 20 degrees to 70 degrees. In some embodiments, the first incident angle θ1 is from 0 to 30 degrees, the second incident angle θ2 is from 20 degrees to 60 degrees, and the third incident angle θ3 is from 20 degrees to 60 degrees. Since the first incident angle θ1 is smaller than the second incident angle θ2, the second portion L2 will be spectrum-shifted more significantly than the first portion L1.

FIG. 12C illustrates a cross-sectional view of FIG. 12A along line A-A' in accordance with other embodiments. One of the differences between the embodiments of FIG. 12B and 12C is that the biosensor of FIG. 12C includes three different organic color filters, namely the organic color filters 110b, the organic color filters 110c and the organic color filters 110d. Also, the organic color filters 110b, the organic color filters 110c and the organic color filters 110d are respectively surrounded by the grid wall 108'.

Figure 12D:
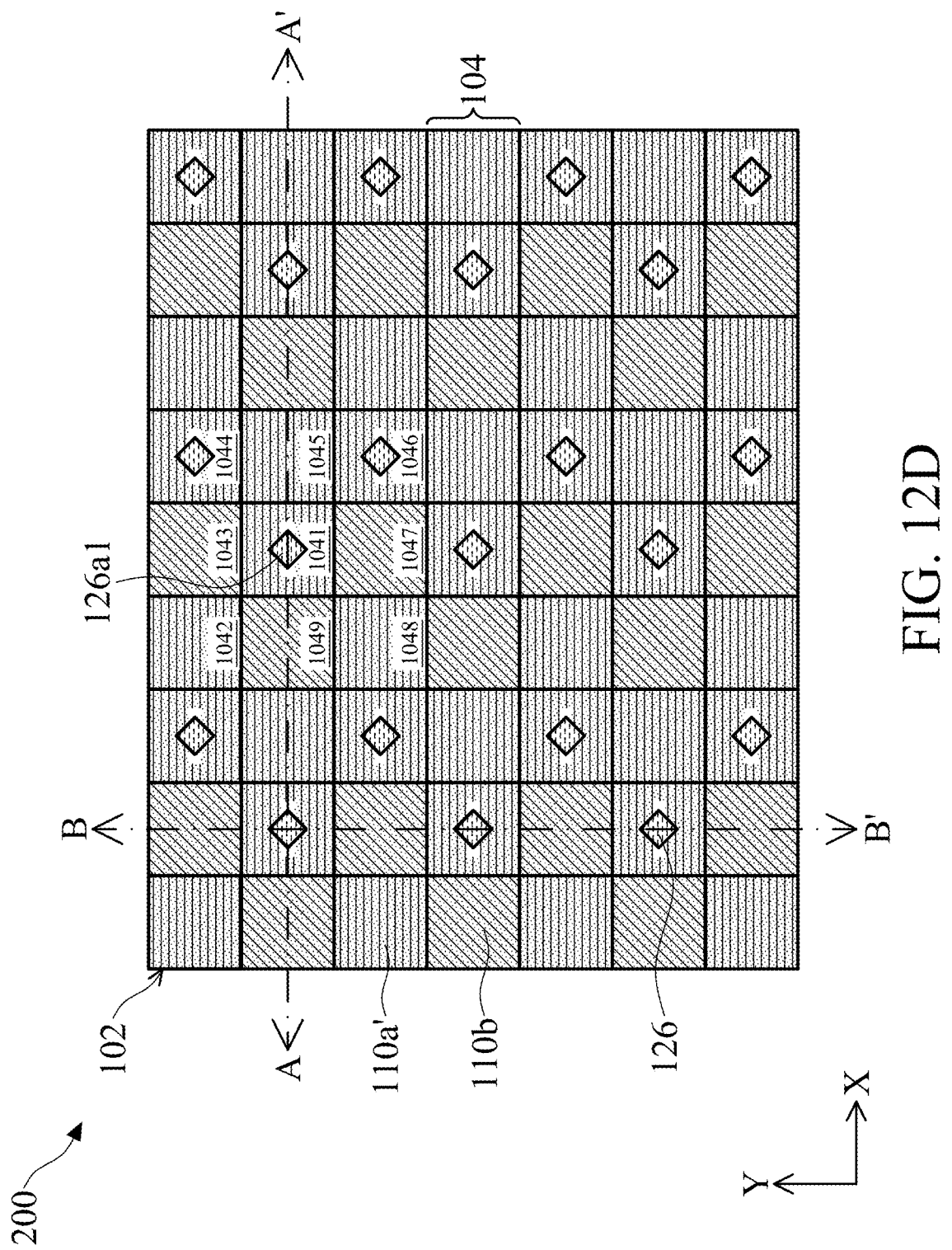
FIG. 12D illustrates a top view of an arrangement of analytes on the biosensor in accordance with some embodiments of the present disclosure.

FIG. 12D illustrates a top view of an arrangement of analytes 126a on the biosensor in accordance with some embodiments of the present disclosure. FIG. 12E illustrates a cross-sectional view of FIG. 12D along line A-A'. FIG. 12F illustrates a cross-sectional view of FIG. 12D along line B-B' in accordance with other embodiments. One of the differences between the embodiments of FIGS. 12D-12F and FIGS. 12A-12C is that the biosensors of FIGS. 12D-12F include the aperture structure 124'.

Although the aforementioned biosensors of FIGS. 12A-12F are not completely the same, it should be understood that the concept of using the biosensor of FIGS. 12A-12C can also be applied to the embodiments of FIGS. 12D-12F, which will not be repeated, for the sake of brevity.

It is described below how the biosensors of FIGS. 12A-12F are used.

Figure 13A:
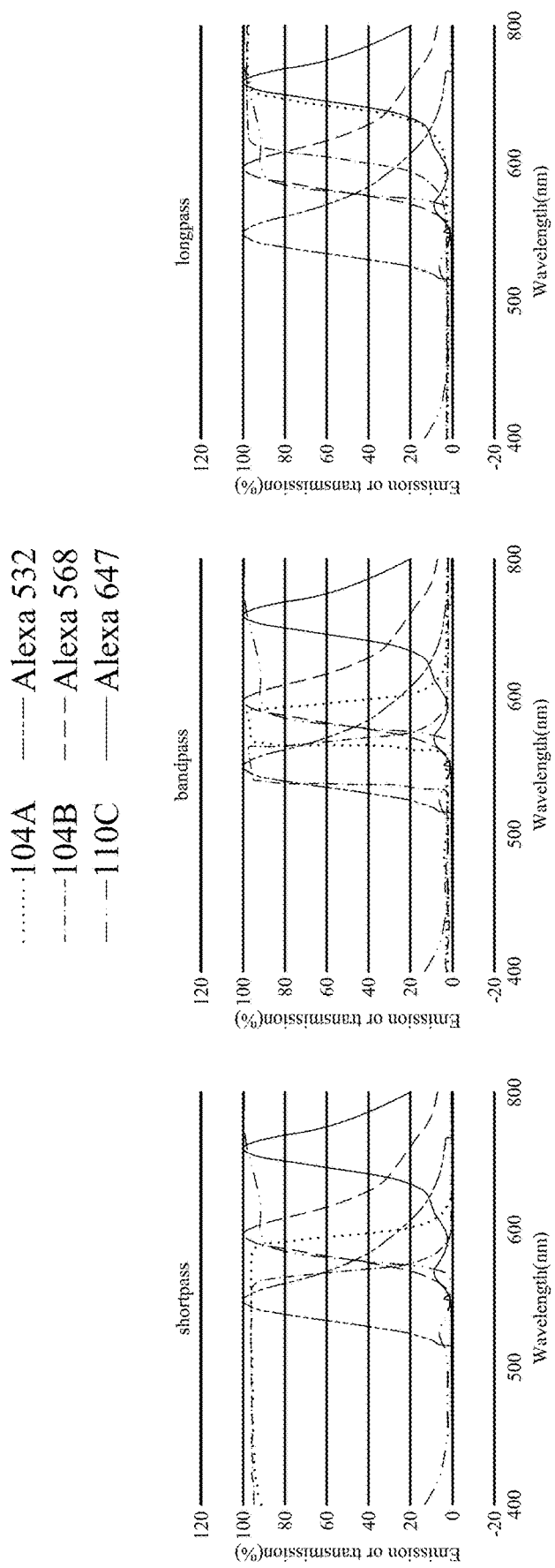
FIG. 13A shows analytical graphs of emission or transmission versus wavelength in accordance with some embodiments of the present disclosure.

FIG. 13A shows analytical graphs of emission or transmission versus wavelength in accordance with some embodiments of the present disclosure. 104A represents the wavelength of the light that enters the pixelated dielectric interference filters 110a' at the first incident angle θ1 and is received by the first pixel 104a. 104B represents the wavelength of the light that enters the pixelated dielectric interference filters 110a' at the second incident angle θ2 and is received by the second pixel 104b. 110C represents the wavelength of the light that enters the organic color filter 110b at the third incident angle θ3 and is received by the third pixel 104c. Alexa 532, Alexa 568 and Alexa 647 are three dyes that emit three different lights.

A first threshold can be set for the first signal intensities. A second threshold can be set for the second signal intensities. A third threshold can be set for the third signal intensities. The signal intensities can be defined as Pass or No as described previously.

The first threshold, the second threshold and the third threshold may be set according to actual situations. Table 3 below is made according to the concept described above and in FIG. 13A, in which the first signal intensity is denoted by 104a, the second signal intensity is denoted by 104b, and the third signal intensity is denoted by 110c.

TABLE 3

| pixelated dielectric interference filter | dye | 104a | 104b | 110c |
|---|---|---|---|---|
| shortpass | Alexa 532 | Pass | Pass | Pass |
| | Alexa 568 | Pass | No | Pass |
| | Alexa 647 | No | No | Pass |
| bandpass | Alexa 532 | Pass | Pass | Pass |
| | Alexa 568 | Pass | No | Pass |
| | Alexa 647 | No | No | Pass |
| longpass | Alexa 532 | No | No | Pass |
| | Alexa 568 | No | Pass | Pass |
| | Alexa 647 | Pass | Pass | Pass |

According to a combination of the definitions of the first signal intensity, the second signal intensity and the third signal intensity, the three dyes can be distinguished. In the embodiment where the pixelated dielectric interference filter is a shortpass filter, for the same concept as described previously, a dye can be distinguished.

In the embodiment where the pixelated dielectric interference filter is a bandpass filter, for the same concept as described previously, a dye can be distinguished.

In the embodiment where the pixelated dielectric interference filter is a longpass filter, for the same concept as described previously, a dye can be distinguished.

Alternatively, first signal intensity ratios of the first signal intensity to the third signal intensity (denoted by 104a/110c), and second signal intensity ratios of the second signal intensity to the third signal intensity (denoted by 104b/110c) can also be calculated to distinguish the three different dyes, namely three different lights. A graph is plotted according to the first signal intensity ratio and the second signal intensity ratio. To be specific, a cluster distribution graph of the first signal intensity ratio vs. the second signal intensity ratio is plotted.

For example, FIG. 13B shows analytical graphs of the first signal intensity ratio vs. the second signal intensity ratio plotted in accordance with some embodiments of the present disclosure. The X-axis represents the first signal intensity ratio. The Y-axis represents the second signal intensity ratio. Alexa 532 is represented by diamond. Alexa 568 is represented by square. Alexa 647 is represented by triangle.

In the embodiment where the pixelated dielectric interference filter is a shortpass filter, the data points of Alexa 532, Alexa 568 and Alexa 647 are clustered at different positions in the graph, respectively. As a result, if a dye is located at or closest to the position where the data points of Alexa 532 are clustered, it can be learned that the light is emitted by Alexa 532. If a dye is located at or closest to the position where the data points of Alexa 568 are clustered, it can be learned that the light is emitted by Alexa 568. If a dye is located at or closest to the position where the data points of Alexa 647 are clustered, it can be learned that the light is emitted by Alexa 647.

In the embodiment where the pixelated dielectric interference filter is a bandpass filter, the data points of Alexa 532, Alexa 568 and Alexa 647 are clustered at different positions at the graph, respectively. As a result, a dye can be distinguished as described above.

In the embodiment where the pixelated dielectric interference filter is a longpass filter, the data points of Alexa 532, Alexa 568 and Alexa 647 are clustered at different positions at the graph, respectively. As a result, a dye can be distinguished as described above.

Although there are only three dyes in the embodiments, it should be understood that more than three dyes can be distinguished.

Aspect 4

Figure 14A:
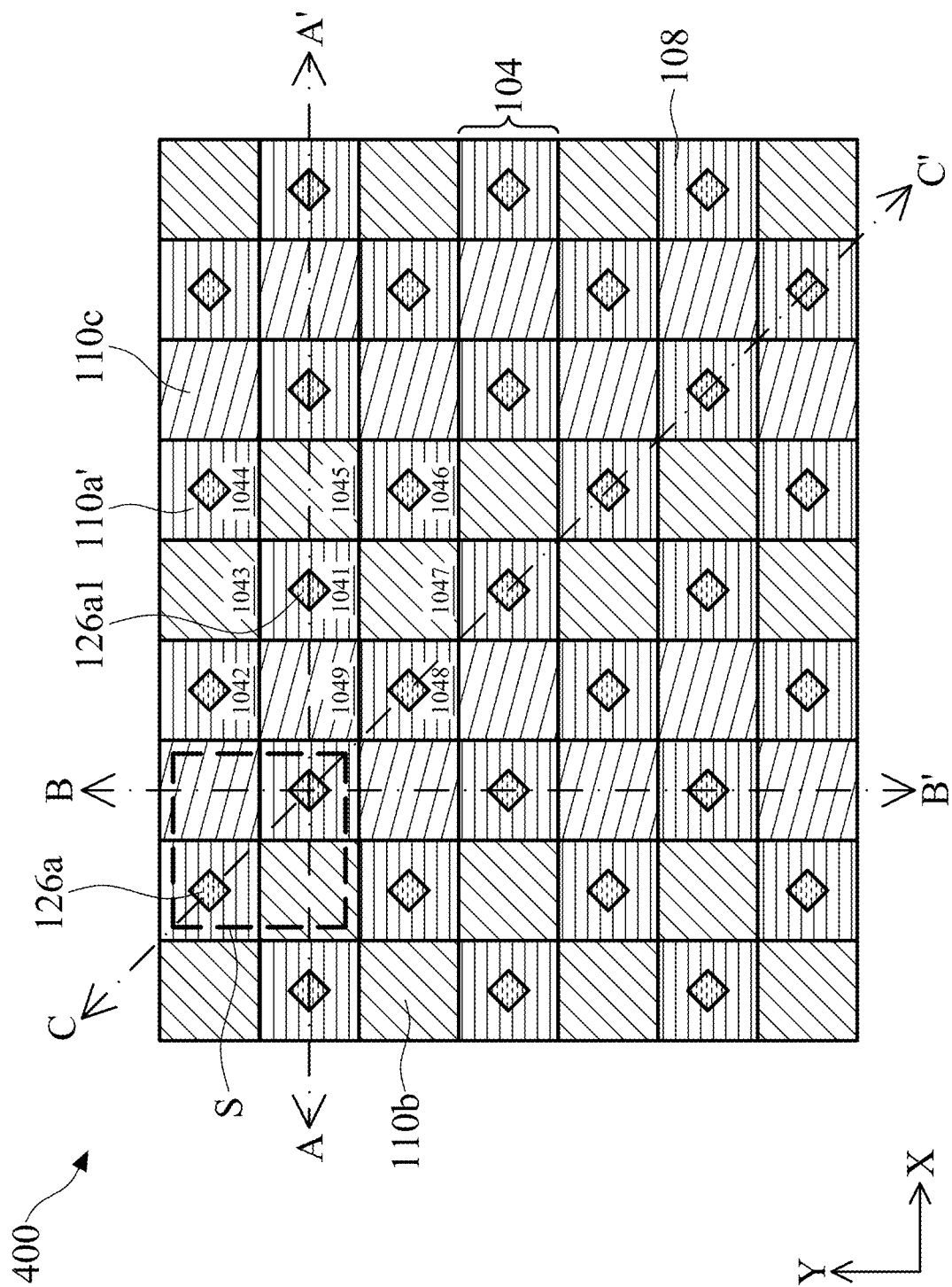
FIG. 14A illustrates an arrangement of analytes on the biosensor in accordance with some embodiments of the present disclosure.
Figure 14D:
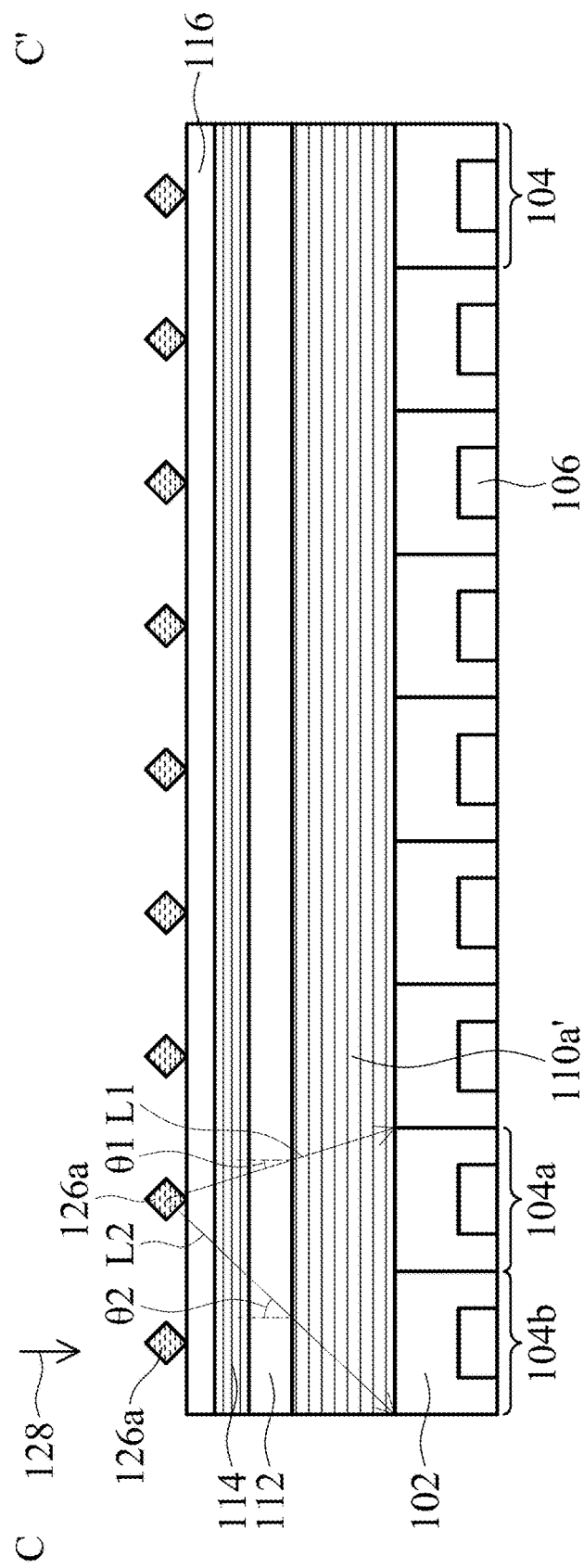
Figure 14G:
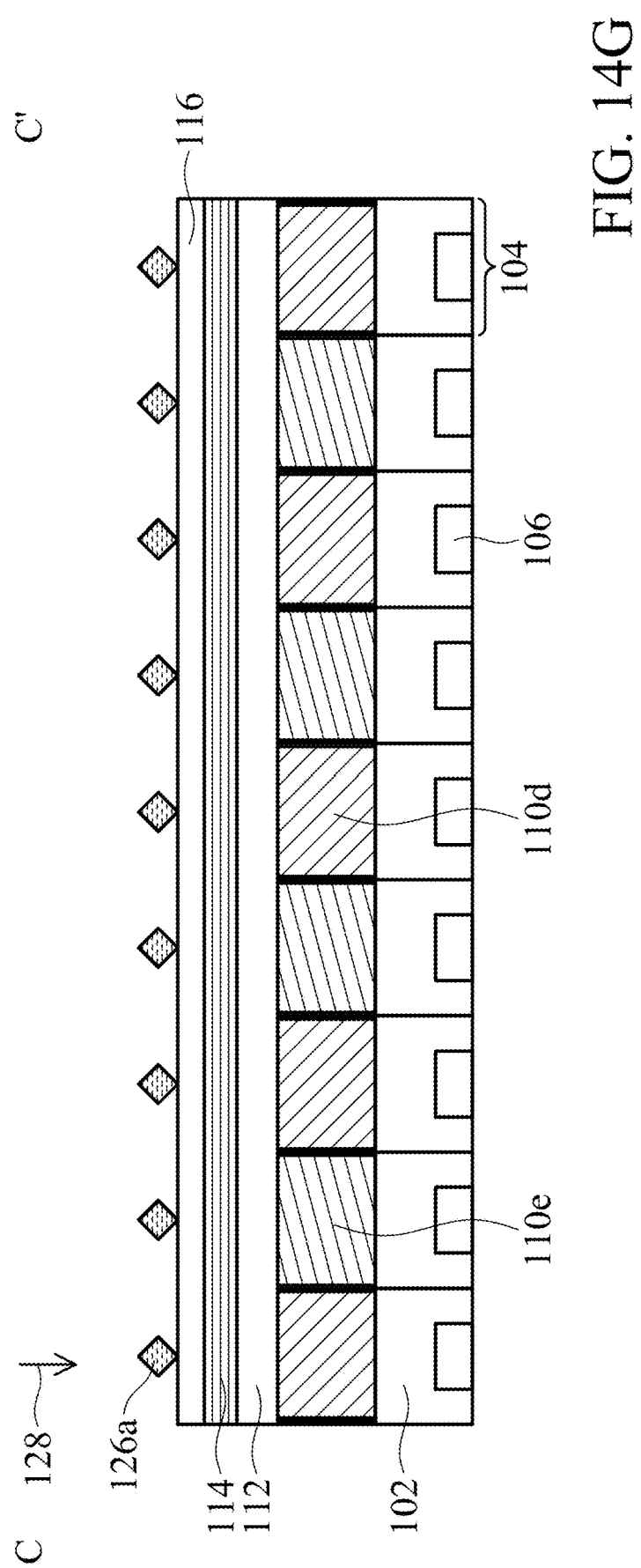

In the aspect, the biosensor includes four kinds of filters that filter the lights with different wavelengths, respectively. For example, the biosensor includes organic color filters 110b, organic color filter 110c, organic color filter 110d and organic color filter 110e, as shown in FIGS. 14E-14G. Alternatively, the biosensor may include the pixelated dielectric interference filters 110a', the organic color filters 110b and the organic color filters 110c, as shown in FIGS. 14B-14D. In the aspect, the pixelated dielectric interference filters 110a' are manufactured to filter only one kind of light. However, since pixelated dielectric interference filters 110a' are inherently angle-sensitive, when light enters the pixelated dielectric interference filters 110a' at a large incident angle, the phenomenon of spectrum-shift occurs. As a result, the pixelated dielectric interference filters 110a' can actually filter more than one kind of light. FIG. 14A illustrates an arrangement of analytes 126a on the biosensor. FIG. 14B, 14C, and 14D illustrate a cross-sectional view of FIG. 14A along line A-A', B-B', and C-C', respectively. In the embodiment, it is assumed that the light emitted by one analyte can reach the pixels that are one pixel away from the pixel under the light, as previously described in FIG. 9A.

As shown in FIG. 14A, the pixelated dielectric interference filters 110a', the organic color filters 110b and the organic color filters 110c are disposed on the substrate 102 in an order of organic color filter 110b/pixelated dielectric interference filter 110a'/organic color filter 110c in a direction X. The organic color filters 110b are separated by one pixel that is covered by the pixelated dielectric interference filter 110a' in a direction Y perpendicular to the direction X. The organic color filters 110c are separated by one pixel that is covered by the pixelated dielectric interference filter 110a' in the direction Y. In other words, the organic color filters 110b are disposed on the substrate 102 in an order of organic color filter 110b/pixelated dielectric interference filter 110a' in the direction Y, or the organic color filters 110c are disposed on the substrate 102 in an order of organic color filter 110c/pixelated dielectric interference filter 110a' in the direction Y. A set of pixels S that includes one pixel that is covered by the organic color filter 110b, one pixel that is covered by the organic color filter 110c, and two pixels that are covered by the pixelated dielectric interference filter 110a'. The two pixels that are covered by the pixelated dielectric interference filter 110a' are not separated by the organic color filter 110b or the organic color filter 110c.

The excitation light 128 (see FIG. 14B) irradiates the analytes 126a or 126b (not shown). The excitation light 128 moves from one side of the biosensor 400 to the opposite side so that the analyte 126a will be excited and emit a light L in order, but not simultaneously. For example, the excitation light 128 may move along the direction X. In the embodiment, the direction X is the direction from the left side to the right side of the biosensor from the top view, as shown in FIG. 14A.

Referring to FIGS. 14B-14D, the analytes 126a are excited by the excitation light 128 and emit a light L. A first portion L1 of the light L enters the pixelated dielectric interference filters 110a' at a first incident angle $\theta 1$. The first incident angle $\theta 1$ is an angle between the first portion L1 of the light L and the normal line of the substrate 102. A pixel that receives the first portion L1 of the light L is a first pixel 104a.

A second portion L2 of the light L enters the pixelated dielectric interference filters 110a' at a second incident angle $\theta 2$. The second incident angle $\theta 2$ is an angle between the second portion L2 of the light L and the normal line of the substrate 102. The first incident angle $\theta 1$ is smaller than the second incident angle $\theta 2$. A pixel that receives the second portion L2 of the light L is a second pixel 104b.

A third portion L3 of the light L enters the organic color filters 110b at a third incident angle $\theta 3$. The third incident angle $\theta 3$ is angle between the third portion L3 of the light L and the normal line of the substrate 102. A pixel that receives the third portion L3 of the light L is a third pixel 104c.

A fourth portion L4 of the light L enters the organic color filters 110c at a fourth incident angle $\theta 4$. The fourth incident angle $\theta 4$ is angle between the fourth portion L4 of the light L and the normal line of the substrate 102. A pixel that receives the fourth portion L4 of the light L is a fourth pixel 104d.

In some embodiments, the first incident angle $\theta 1$ is from 0 degrees to 40 degrees, the second incident angle $\theta 2$ is from 20 degrees to 70 degrees, the third incident angle $\theta 3$ is from 20 degrees to 70 degrees, and the fourth incident angle $\theta 4$ is from 20 degrees to 70 degrees. In some embodiments, the first incident angle $\theta 1$ is from 0 to 30 degrees, the second incident angle $\theta 2$ is from 20 degrees to 60 degrees, the third incident angle $\theta 3$ is from 20 degrees to 60 degrees, and the fourth incident angle $\theta 4$ is from 20 degrees to 60 degrees. Since the first incident angle $\theta 1$ is smaller than the second incident angle $\theta 2$, the second portion L2 will be spectrum-shifted more significantly than the first portion L1.

FIGS. 14E-14G illustrates cross-sectional views of FIG. 14A along lines A-A', B-B' and C-C', respectively, in accordance with other embodiments. One of the differences between the embodiments of FIGS. 14E-14G and FIGS. 14B-14D is that the biosensor of FIGS. 14E-14G includes four different organic color filters, namely the organic color filters 110b, the organic color filters 110c, the organic color filters 110d and the organic color filters 110e. Also, the organic color filters 110b, the organic color filters 110c, the organic color filters 110d and the organic color filters 110e are surrounded by the grid wall 108', respectively.

Figure 14H:
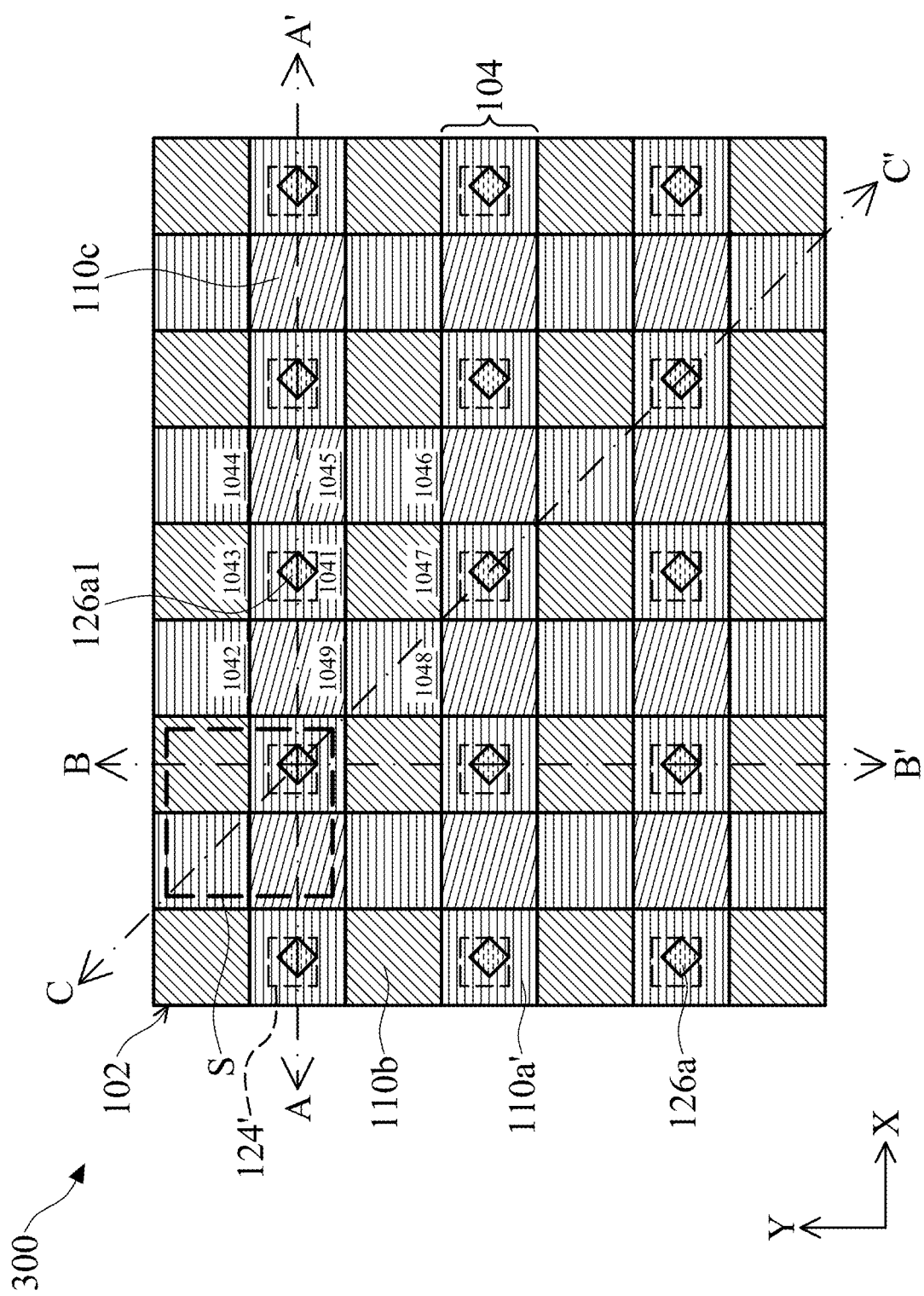
FIG. 14H illustrates a top view of an arrangement of analytes on the biosensor in accordance with some embodiments of the present disclosure.
Figure 14I:
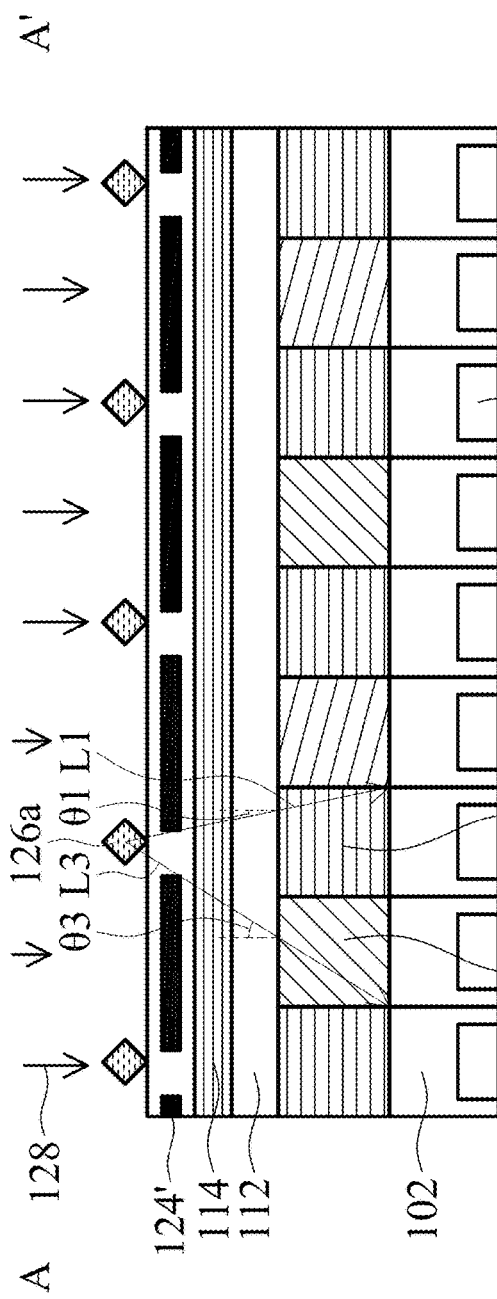
FIGS. 14I-14K illustrate cross-sectional views of FIG. 14H along lines A-A', B-B' and C-C', respectively, in accordance with some embodiments of the present disclosure.
Figure 14J:
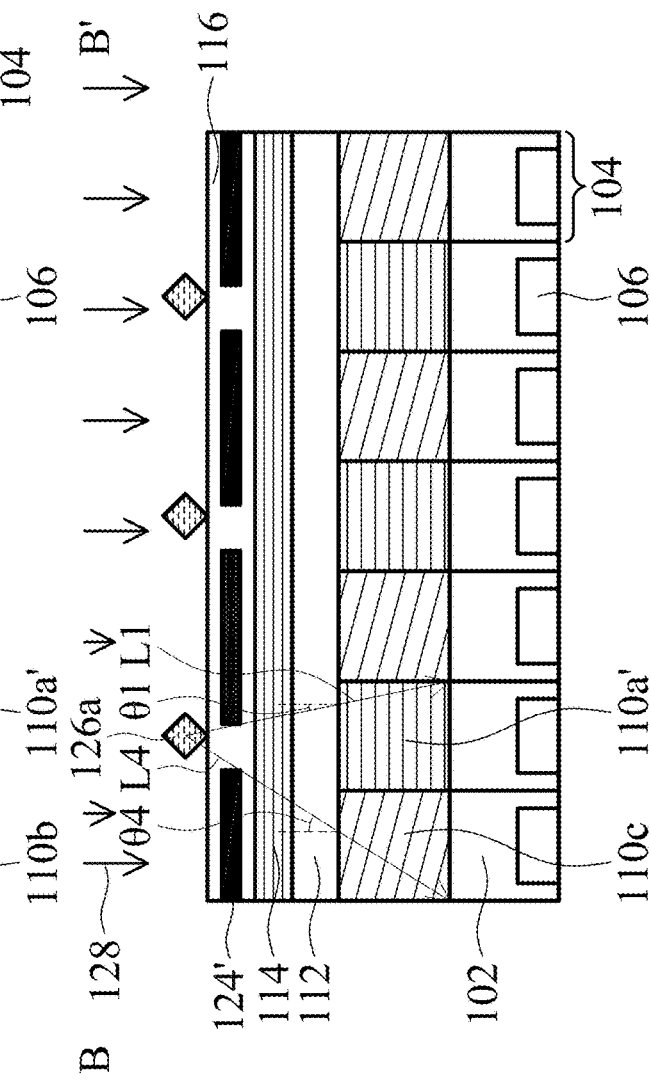
Figure 14K:
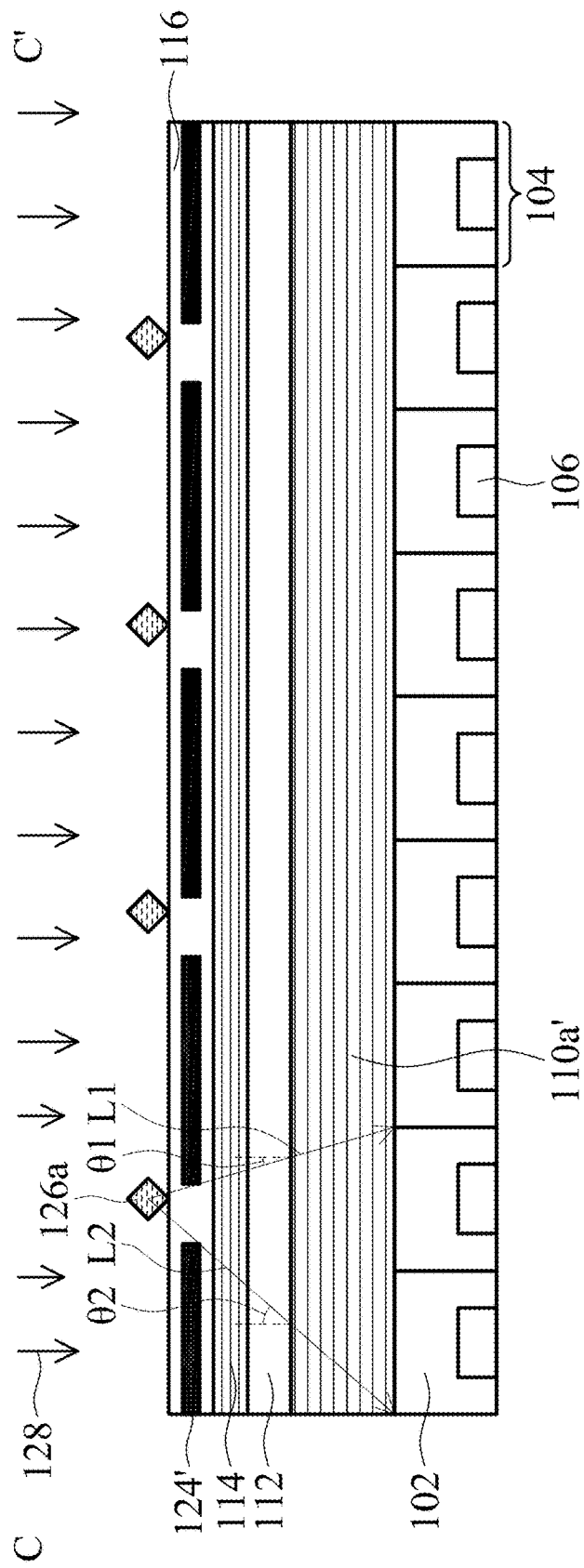

FIG. 14H illustrates a top view of an arrangement of analytes 126a on the biosensor in accordance with some embodiments of the present disclosure. FIG. 14I, 14J, and 14K illustrate a cross-sectional view of FIG. 14H along line A-A', B-B', and C-C', respectively. One of the differences between the embodiments of FIGS. 14H-14K and FIGS. 14A-14D is that the biosensor of FIGS. 14H-14K includes the aperture structure 124'. Therefore, although the analytes 126a or the analyte 126b are irradiated by the excitation light 128 at the same time, cross-talk can still be avoided.

Figure 14N:
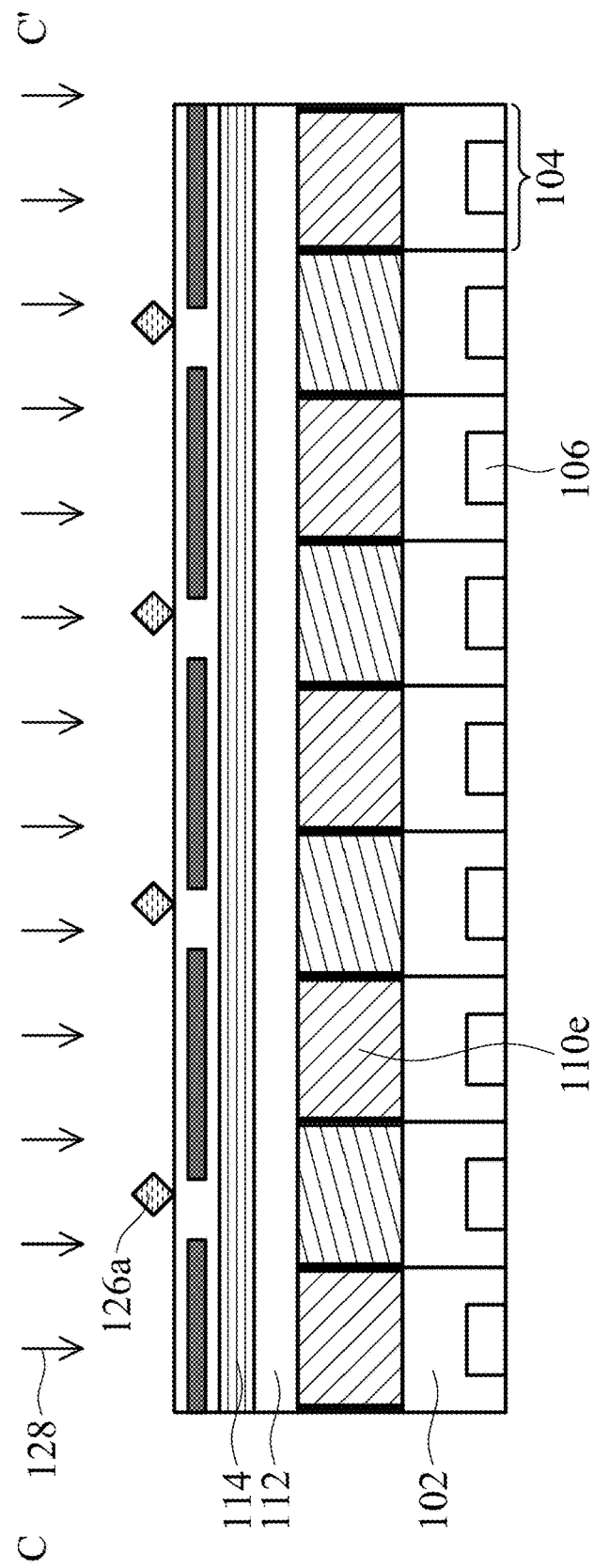

FIGS. 14L-14N illustrates a cross-sectional view of FIG. 14H along lines A-A', B-B' and C-C', respectively, in accordance with other embodiments. One of the differences between the embodiments of FIGS. 14L-14N and FIGS. 14I-14K is that the biosensor of FIGS. 14L-14N includes four different organic color filters, namely the organic color filters 110b, the organic color filters 110c, the organic color filters 110d and the organic color filters 110e. Also, the organic color filters 110b, the organic color filters 110c, the organic color filters 110d and the organic color filters 110e are surrounded by the grid wall 108', respectively.

Although the aforementioned biosensors of FIGS. 14A-14N are not completely the same, it should be understood that the concept of using the biosensor of FIGS. 14A-14D can also be applied to the embodiments of FIGS. 14E-14N, which will not be repeated, for the sake of brevity.

It is described below how the biosensors of FIGS. 14A-14N are used.

Figure 15A:
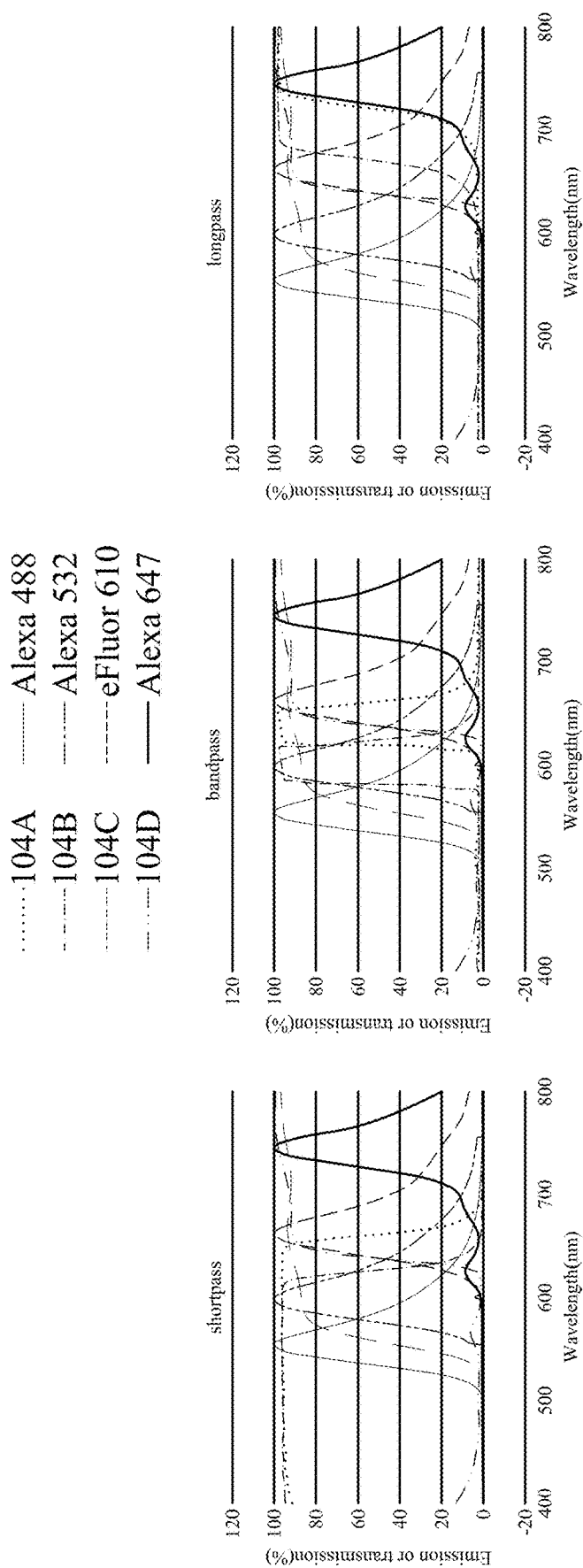
FIG. 15A shows analytical graphs of emission or transmission versus wavelength in accordance with some embodiments of the present disclosure.

FIG. 15A shows analytical graphs of emission or transmission versus wavelength in accordance with some embodiments of the present disclosure. 104A represents the wavelength of the light that enters the pixelated dielectric interference filter 110a' at the first incident angle $\theta 1$ and is received by the first pixel 104a. 104B represents the wavelength of the light that enters the pixelated dielectric interference filter 110a' at the second incident angle $\theta 2$ and is received by the second pixel 104b. 104C represents the wavelength of the light that enters the organic color filter 110b at the third incident angle $\theta 3$ and is received by the third pixel 104c. 104D represents the wavelength of the light that enters the organic color filter 110c at the fourth incident angle $\theta 4$. Alexa 488, Alexa 532, eFluor 610 and Alexa 647 are four dyes that emit four different lights. For the same concept as described previously, Alexa 488, Alexa 532, eFluor 610 and Alexa 647 have first signal intensities, second signal intensities, third signal intensities and fourth signal intensities.

The signal intensities can be defined as Pass or No as described previously.

The first threshold, the second threshold, the third threshold and the fourth threshold may be set according to actual situations. Table 4 below is made according to the concept described above and in FIG. 15A, in which the first signal intensity is denoted by 104a, the second signal intensity is denoted by 104b, the third signal intensity is denoted by 104c, and the fourth signal intensity is denoted by 104d.

TABLE 4

| dielectric interference filter | dye | 104a | 104b | 104c | 104d |
|---|---|---|---|---|---|
| shortpass | Alexa 488 | Pass | Pass | Pass | No |
| | Alexa 532 | Pass | Pass | Pass | Pass |
| | eFluor 610 | Pass | No | Pass | Pass |
| | Alexa 647 | No | No | Pass | Pass |
| bandpass | Alexa 488 | No | Pass | Pass | No |
| | Alexa 532 | Pass | Pass | Pass | Pass |
| | eFluor 610 | Pass | No | Pass | Pass |
| | Alexa 647 | No | No | Pass | Pass |
| longpass | Alexa 488 | No | No | Pass | No |
| | Alexa 532 | No | No | Pass | Pass |
| | eFluor 610 | No | Pass | Pass | Pass |
| | Alexa 647 | Pass | Pass | Pass | Pass |

According to a combination of the definitions of the first signal intensity, the second signal intensity, the third signal intensity and the fourth signal intensity, the four dyes can be distinguished, as previously described.

Although there are only four dyes in the embodiments, since there are 16 combinations of definitions of the first signal intensity, the second signal intensity, the third signal intensity and the fourth signal intensity, it should be understood that at most 16 dyes can be distinguished.

Alternatively, first signal intensity ratios of the first signal intensity to the fourth signal intensity (denoted by 104a/104d), second signal intensity ratios of the second signal intensity to the fourth signal intensity (denoted by 104b/104d) and third signal intensity ratios of the third signal intensity to the fourth signal intensity (denoted by 104c/104d) can also be calculated to distinguish the four different dyes, namely four different lights. A graph is plotted according to the first signal intensity ratio, the second signal intensity ratio and the third signal intensity ratio. To be specific, a distribution cluster graph of the first signal intensity ratio vs. the second signal intensity ratio vs. the third signal intensity ratio is plotted.

Figure 15B:
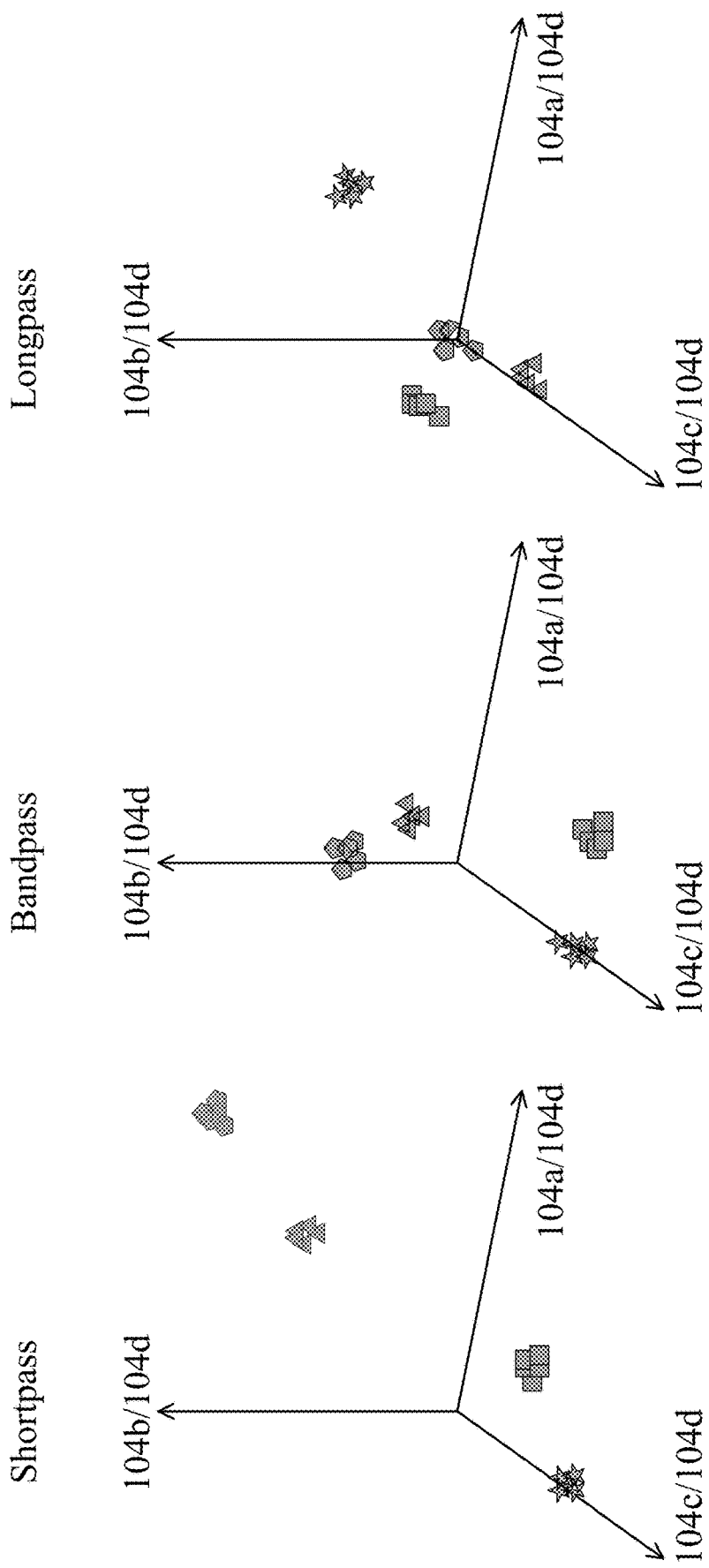
FIG. 15B shows analytical graphs of the first signal intensity ratio vs. the second signal intensity ratio vs. the third signal intensity ratio plotted in accordance with some embodiments of the present disclosure.

For example, FIG. 15B shows analytical graphs of the first signal intensity ratio vs. the second signal intensity ratio vs. the third signal intensity ratio plotted in accordance with some embodiments of the present disclosure. The X-axis represents the first signal intensity ratio. The Y-axis represents the third signal intensity ratio. The Z-axis represents the second signal intensity ratio. Alexa 488 is represented by a pentagon. Alexa 532 is represented by triangle. eFluor 610 is represented by square. Alexa 647 is represented by a star.

In the embodiment where the pixelated dielectric interference filter is a shortpass filter, the data points of Alexa 488, Alexa 532, eFluor 610 and Alexa 647 are clustered at different positions in the graph, respectively. As a result, for the same concept as described previously, a dye can be distinguished.

In the embodiment where the pixelated dielectric interference filter is a bandpass filter, the data points of Alexa 488, Alexa 532, eFluor 610 and Alexa 647 are clustered at different positions in the graph, respectively. As a result, for the same concept as described previously, a dye can be distinguished.

In the embodiment where the pixelated dielectric interference filter is a longpass filter, the data points of Alexa 488, Alexa 532, eFluor 610 and Alexa 647 are clustered at different positions in the graph, respectively. As a result, for the same concept as described previously, a dye can be distinguished.

Although there are only four dyes in the embodiments, it should be understood that more than four dyes can be distinguished.

Although the embodiments of the analyte 126b are not illustrated in the drawings, it can be appreciated that the analyte 126b can also be placed on the biosensor provided by the embodiments of the present application.

To sum up, the advantages of the biosensors provided by the embodiments of the present disclosure at least include:

(1) The filters are pixelated so that the filters can be provided with a stronger adhesion and chemical or mechanical resistance, thus preventing the peeling issue that may be caused by direct contact between organic color filters.

(2) By disposing the waveguide, the aperture structure or the shielding layer, cross-talk can be better avoided.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A biosensor, comprising:
   a substrate having pixels;
   photodiodes disposed in the substrate and corresponding to one of the pixels, respectively;
   pixelated filters disposed on the substrate;
   an excitation light rejection layer disposed on the pixelated filter;
   an immobilization layer disposed on the excitation light rejection layer; and
   an aperture structure embedded in the immobilization layer,
   wherein the pixelated filters are isolated by a grid wall, and a top surface of the grid wall and a top surface of the pixelated filters are coplanar, wherein the aperture structure completely overlaps a first group of the photodiodes and exposes a second group of the photodiodes, with the first and second groups of the photodiodes arranged alternately.

2. The biosensor as claimed in claim 1, wherein some of the pixelated filters are organic color filters and the other pixelated filters are dielectric interference filters.

3. The biosensor as claimed in claim 2, wherein each of the organic color filters corresponds to one of the pixels and each of the dielectric interference filters corresponds to one of the pixels.

4. The biosensor as claimed in claim 2, wherein each of the organic color filters corresponds to one of the pixels and each of the dielectric interference filters corresponds to two of the pixels.

5. The biosensor as claimed in claim 2, wherein the organic color filters are isolated by the dielectric interference filters.

6. The biosensor as claimed in claim 2, wherein the dielectric interference filters are a bandpass filter, a shortpass filter, a longpass filter, or a multiple bandpass filter.

7. The biosensor as claimed in claim 1, wherein the pixelated filters are organic color filters.

8. The biosensor as claimed in claim 1, further comprising a waveguide embedded in the immobilization layer.

9. The biosensor as claimed in claim 1, further comprising:
    an aperture structure embedded in the immobilization layer; and
    a waveguide disposed on the aperture structure.

10. The biosensor as claimed in claim 1, wherein the excitation light rejection layer is a dielectric interference filter embedded with a metal layer.

11. A method of forming a biosensor, comprising:
    providing a substrate having pixels;
    forming photodiodes in the substrate, wherein each of the photodiodes corresponds to one of the pixels, respectively;
    forming pixelated filters on the substrate;
    forming an excitation light rejection layer on the pixelated filters;
    forming an immobilization layer on the excitation light rejection layer; and
    forming an aperture structure embedded in the immobilization layer,
    wherein the pixelated filters are isolated by a grid wall, and a top surface of the grid wall and a top surface of the pixelated filters are coplanar,
    wherein the aperture structure completely overlaps a first group of the photodiodes and exposes a second group of the photodiodes, with the first and second groups of the photodiodes arranged alternately.

12. The method as claimed in claim 11, wherein some of the pixelated filters are organic color filters and the other pixelated filters are dielectric interference filters.

13. The method as claimed in claim 12, wherein each of the organic color filters corresponds to one of the pixels and each of the dielectric interference filters corresponds to one of the pixels.

14. The method as claimed in claim 12, wherein each of the organic color filters corresponds to one of the pixels and each of the dielectric interference filters corresponds to two of the pixels.

15. The method as claimed in claim 12, wherein the organic color filters are isolated by the dielectric interference filters.

16. The method as claimed in claim 12, wherein the dielectric interference filters are a bandpass filter, a shortpass filter, a longpass filter, or a multiple bandpass filter.

17. The method as claimed in claim 11, wherein the pixelated filters are organic color filters.

18. The method as claimed in claim 11, further comprising forming an aperture structure in the immobilization layer.

19. The method as claimed in claim 11, further comprising forming a waveguide in the immobilization layer.

* * * * *